(12) United States Patent
Miyasaka et al.

(10) Patent No.: US 10,614,760 B2
(45) Date of Patent: Apr. 7, 2020

(54) ELECTRO-OPTICAL DEVICE AND ELECTRONIC APPARATUS WITH MEMORY CIRCUIT IN PIXEL CIRCUIT

(71) Applicant: SEIKO EPSON CORPORATION, Tokyo (JP)

(72) Inventors: Mitsutoshi Miyasaka, Suwa (JP); Yoichi Momose, Matsumoto (JP); Kiyoshi Sekijima, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/228,922

(22) Filed: Dec. 21, 2018

(65) Prior Publication Data

US 2019/0197951 A1    Jun. 27, 2019

(30) Foreign Application Priority Data

Dec. 26, 2017 (JP) .................. 2017-248841

(51) Int. Cl.
*G09G 3/30* (2006.01)
*G09G 3/3233* (2016.01)
*G09G 3/20* (2006.01)
*G09G 3/3258* (2016.01)
*G02B 27/01* (2006.01)
*H01L 27/32* (2006.01)

(52) U.S. Cl.
CPC .......... *G09G 3/3233* (2013.01); *G02B 27/01* (2013.01); *G09G 3/2007* (2013.01); *G09G 3/3258* (2013.01); *G09G 2300/0842* (2013.01); *G09G 2320/0233* (2013.01); *H01L 27/3276* (2013.01)

(58) Field of Classification Search
CPC ............... G09G 3/3258; G09G 3/3225; G06F 3/012–015
See application file for complete search history.

(56) References Cited

U.S. PATENT DOCUMENTS

| | | | |
|---|---|---|---|
| 6,765,549 B1 | 7/2004 | Yamazaki et al. | |
| 2002/0018029 A1* | 2/2002 | Koyama | G09G 3/3275 345/39 |
| 2002/0070913 A1 | 6/2002 | Kimura et al. | |
| 2002/0093472 A1 | 7/2002 | Numao | |

(Continued)

FOREIGN PATENT DOCUMENTS

| | | |
|---|---|---|
| JP | 2001-222256 A | 8/2001 |
| JP | 2003-051384 A | 2/2003 |

(Continued)

*Primary Examiner* — Roy P Rabindranath
(74) *Attorney, Agent, or Firm* — Oliff PLC

(57) ABSTRACT

An electro-optical device includes a first scan line, a data line, and a pixel circuit provided at a position corresponding to intersections of the first scan line and the data line. The pixel circuit includes a light emitting element, a memory circuit, a first transistor, and a second transistor. The first transistor is electrically connected in series to the light emitting element, and a gate of the first transistor is electrically connected to the memory circuit. The second transistor is disposed between the data line and an input of a first inverter. The third transistor is disposed between an output terminal of a second inverter and the input of the first inverter. When the second transistor turns from an OFF-state to an ON-state, the third transistor is not in an ON-state.

11 Claims, 20 Drawing Sheets

(56) References Cited

U.S. PATENT DOCUMENTS

| | | |
|---|---|---|
| 2002/0181276 A1 | 12/2002 | Yamazaki |
| 2003/0142054 A1* | 7/2003 | Tada .................... G09G 3/3614 345/87 |
| 2004/0229385 A1 | 11/2004 | Yamazaki |
| 2006/0221033 A1* | 10/2006 | Yasuda ................ G09G 3/3648 345/92 |
| 2006/0274090 A1 | 12/2006 | Koyama et al. |
| 2007/0159417 A1 | 7/2007 | Miyake |
| 2007/0166843 A1 | 7/2007 | Yamazaki |

FOREIGN PATENT DOCUMENTS

| | | |
|---|---|---|
| JP | 2004-062199 A | 2/2004 |
| JP | 2004-163601 A | 6/2004 |
| JP | 2006-309182 A | 11/2006 |
| JP | 2007-206681 A | 8/2007 |
| JP | 2009-151844 A | 7/2009 |
| TW | 536689 B | 6/2003 |

* cited by examiner

ELECTRO-OPTICAL DEVICE AND ELECTRONIC APPARATUS WITH MEMORY CIRCUIT IN PIXEL CIRCUIT

BACKGROUND

1. Technical Field

The present invention relates to an electro-optical device and an electronic apparatus.

2. Related Art

In recent years, head-mounted displays (HMDs) of a type of an electronic apparatus that enables formation and viewing of a virtual image by directing image light from an electro-optical device to the pupil of an observer have been proposed. One example of the electro-optical device used in such an electronic apparatus is an organic electro-luminescence (EL) device that includes an organic EL element as a light emitting element. Organic EL devices used in head-mounted displays are required to provide high resolution, fine pixels, multiple-gray-scale of display, and low power consumption.

In known organic EL devices, when a selecting transistor is brought to an ON-state by a scan signal supplied to a scan line, an electrical potential based on an image signal supplied from a data line is maintained in a capacitive element connected to the gate of a driving transistor. When the driving transistor is brought into the ON-state according to the potential maintained in the capacitive element, namely, the gate potential of the driving transistor, a current in amount according to the gate potential of the driving transistor flows to the organic EL element, and the organic EL element emits light at luminance according to the current amount.

In this way, the gray-scale display is performed by analog driving that controls the current flowing through the organic EL element according to the gate potential of the driving transistor in a typical organic EL device. Thus, variations in voltage-current characteristics and a threshold voltage of the driving transistor cause variations in brightness and shifts in gray-scale between pixels. As a result, display quality may decrease. To address these, it is conceivable to provide an organic EL device including a compensating circuit that compensates for variations in voltage-current characteristics and a threshold voltage of a driving transistor (for example, see JP-A-2004-062199).

However, when a compensating circuit is provided as described in JP-A-2004-062199, a current also flows through the compensating circuit, which may cause an increase in power consumption. Furthermore, in order to achieve multiple-gray-scale display, the use of known analog driving requires a capacitive element with a large capacitance to store image signals. This requirement is a trade-off with high resolution and fine pixels, and may result in an increase in power consumption due to charging and discharging of the capacitive element. In other words, in the typical technology, an electro-optical device capable of displaying a high-resolution, multi-gray-scale, and high-quality image at low power consumption may be difficult to achieve.

SUMMARY

The present invention is made to address at least some of the above-described issues, and can be realized as the following aspects or application examples.

Application Example 1

An electro-optical device according to the present application example includes a first scan line, a data line, and a pixel circuit located at a position corresponding to an intersection of the first scan line and the data line. The pixel circuit includes a light emitting element, a memory circuit, a first transistor, and a second transistor, and a memory circuit. The memory circuit includes a first inverter, a second inverter, and a third transistor. The first transistor is electrically connected in series to the light emitting element, and a gate of the first transistor is electrically connected to the memory circuit. The second transistor is disposed between the data line and an input of the first inverter. An output of the first inverter and an input of the second inverter are electrically connected. The third transistor is disposed between an output of the second inverter and the input of the first inverter. When the second transistor switches from an OFF-state to an ON-state, the third transistor is in the OFF-state or turns from the ON-state to the OFF-state.

According to the configuration of the present application example, the pixel circuit includes the memory circuit disposed between the first potential line and the second potential line. The second transistor having the gate electrically connected to the first scan line is disposed between the memory circuit and the data line. The light emitting element and the first transistor having the gate electrically connected to the memory circuit are disposed in series between the second potential line and the third potential line. Thus, gray-scale display can be performed by writing a digital signal expressed by binary values of ON and OFF to the memory circuit through the second transistor and controlling the ratio of emission to non-emission of the light emitting element through the first transistor. In this way, the effect of variations in the voltage-current characteristics and the threshold voltage of each transistor can be reduced, such that variation in brightness and shifts in gray-scale between pixels can be reduced without a compensating circuit.

When the second transistor switches from the OFF-state to the ON-state, the third transistor is already in the OFF-state or, when the second transistor switches from the OFF-state to the ON-state, the third transistor switches from the ON-state to the OFF-state. That is, even when the second transistor is brought into the ON-state and an image signal is written or rewritten onto the first inverter and the second inverter, the third transistor is not in the ON-state. At this time, the electrical connection between the output of the second inverter and the input of the first inverter is disconnected. The image signal can thus be promptly and securely written or rewritten onto the memory circuit. Further, the image signal is written from the data line onto the first inverter, and then written from the first inverter onto the second inverter. This feature makes complementary data line and complementary transistor unnecessary, compared with a case when, in parallel to writing an image signal from a data line onto a first inverter, a complementary image signal is written from a complementary data line onto a second inverter. Therefore, fine pixels and high resolution can be easily achieved, and no further wires are required, improving a production yield. As a result, an electro-optical device capable of displaying a high-resolution, high-quality image at low power consumption can be achieved at a lower cost.

Application Example 2

In the electro-optical device according to the present application example, a gate width of the third transistor may preferably be shorter than a gate width of the first transistor.

According to the configuration of the present application example, the gate width of the first transistor disposed in series with the light emitting element is greater than the gate width of the third transistor included in the memory circuit. Therefore, when the first transistor switches to the ON-state and the light emitting element emits light, a large current can flow into the light emitting element, improving the emission luminance of the light emitting element. An ON-resistance of the first transistor being in the ON-state reduces at this time, suppressing variations in emission luminance due to variations in threshold voltage of the first transistor when the light emitting element emits light. On the other hand, the third transistor has a role of keeping smaller a potential difference between the output of the second inverter and the input of the first inverter while the light emitting element is emitting light. Therefore, the third transistor fully functions without requiring a large current, even when the gate width of the third transistor is reduced shorter than the gate width of the first transistor. Therefore, according to the configuration of the present application example, the memory circuit stably retains an image signal, allowing a high-resolution, high-quality image to be displayed.

Application Example 3

In the electro-optical device according to the present application example, a gate length of the third transistor may be shorter than a gate length of the first transistor.

According to the configuration of the present application example, the gate length of the first transistor is longer than the gate length of the third transistor. Therefore, a higher voltage than a voltage applied to the memory circuit including the third transistor can be applied to the light emitting element disposed in series with the first transistor. Even when the high voltage is applied to the light emitting element and the first transistor, the long gate length of the first transistor can suppress a likelihood that the first transistor is damaged by the high voltage. On the other hand, the gate length of the third transistor included in the memory circuit is shorter than the gate length of the first transistor, achieving the fine memory circuit by reducing the third transistor in size to be smaller than the first transistor. As a result, the memory circuit can promptly operate, allowing the light emitting element to emit light with the high voltage.

Application Example 4

In the electro-optical device according to the present application example, a first potential line, a second potential line, and a third potential line are further included. The memory circuit may be electrically connected to the first potential line and the second potential line. The light emitting element may preferably be electrically connected to the second potential line.

According to the configuration of the present application example, the low-voltage power-supply can drive the memory circuit, whereas the high-voltage power-supply can drive the light emitting element. Therefore, the fine memory circuit can be achieved for prompt operation, as well as the emission luminance of the light emitting element can be improved.

Application Example 5

In the electro-optical device according to the present application example, the first potential line may supply a first potential, the second potential line may supply a second potential, and the third potential line may supply a third potential. The second transistor has a gate electrically connected to the first scan line. A potential to be supplied to the first scan line may preferably be the second potential or the third potential.

According to the configuration of the present application example, the memory circuit electrically connected with either of a source and a drain of the second transistor is supplied with the first potential and the second potential. Each of the first scan line electrically connected with the gate of the second transistor is supplied with a scanning signal at either of the second potential and the third potential constituting the high-voltage power-supply. Therefore, when switching the second transistor to the ON-state, a gate potential of the second transistor can be set to the third potential of the high-voltage power-supply, increasing a gate-source voltage of the second transistor higher. Specifically, when the second transistor is an N-type, the gate-source voltage can be a large positive value, whereas, when the second transistor is a P-type, the gate-source voltage can be a large negative value. As a result, an ON-resistance of the second transistor being in the ON-state can be reduced. Therefore, an image signal can be promptly rewritten or written onto the memory circuit.

Application Example 6

In the electro-optical device according to the present application example, the second transistor and the third transistor may preferably operate to complement each other.

According to the configuration of the present application example, when the second transistor is in the ON-state, the third transistor is in the OFF-state, whereas, when the second transistor is in the OFF-state, the third transistor is in the ON-state. Therefore, after the second transistor is switched to the ON-state, i.e., the third transistor is switched to the OFF-state, and an image signal is written or rewritten onto the first inverter and the second inverter, by switching the third transistor to the ON-state, i.e., switching the second transistor to the OFF-state, to allow a static signal retaining operation to take place between the first inverter and the second inverter, the image signal can be retained. In this way, an image signal can be promptly and securely written or rewritten onto the memory circuit, as well as the written image signal can be securely retained.

Application Example 7

In the electro-optical device according to the present application example, the second transistor is a first conductive type. The third transistor is a second conductive type different from the first conductive type. The gate of the second transistor and a gate of the third transistor may preferably be electrically connected to the first scan line.

According to the configuration of the present application example, when the second transistor is the N-type, the third transistor is the P-type. When a High signal is supplied from the first scan line, the second transistor switches to the ON-state, whereas the third transistor switches to the OFF-state. When a Low signal is supplied from the first scan line, the second transistor switches to the OFF-state, whereas the third transistor switches to the ON-state. On the other hand, when the second transistor is the P-type, the third transistor is the N-type. When a Low signal is supplied from the first scan line, the second transistor switches to the ON-state, whereas the third transistor switches to the OFF-state. When a High signal is supplied from the first scan line, the second transistor switches to the OFF-state, whereas the third transistor switches to the ON-state. Therefore, by supplying an identical scanning signal from the first scan line, the second transistor and the third transistor can operate to complement each other.

Application Example 8

In the electro-optical device according to the present application example, a second scan line is further included. The gate of the second transistor may preferably be electrically connected to the first scan line, whereas the gate of the third transistor may preferably be electrically connected to the second scan line.

According to the configuration of the present application example, the gate of the second transistor is electrically connected to the first scan line, whereas the gate of the third transistor is electrically connected to the second scan line. Therefore, the second transistor and the third transistor can be operated independently. When the second transistor switches from the OFF-state to the ON-state, allowing the third transistor to be in the OFF-state can be easily achieved or, when the second transistor switches from the OFF-state to the ON-state, allowing the third transistor to switch from the ON-state to the OFF-state can be easily achieved. In this way, an image signal can be promptly and securely written or rewritten onto the memory circuit, as well as the written image signal can be securely retained. To allow the memory circuit to retain an image signal, i.e., to allow the memory circuit to be in a signal-retaining state, the third transistor should be in the ON-state. At this time, a retention signal is applied from the second scan line to the gate of the third transistor. In contrast, when an image signal is written or rewritten onto the memory circuit, i.e., in a non-signal-retaining state, the third transistor is brought into the OFF-state. In the non-signal-retaining state, a non-retention signal is applied from the second scan line to the gate of the third transistor.

When the second transistor and the third transistor are an identical conductive type, by supplying one of the High signal and the Low signal to one of the first and second scan lines, and by supplying the other of the High signal and the Low signal to the other of the first and second scan lines, the second transistor and the third transistor can operate to complement each other. Further, when the second transistor and the third transistor are both N-type, their mobility values greater than those of the P-type transistors allows the second transistor and the third transistor to be small in size. In this way, the fine pixel circuits can be achieved, and an image signal can be further promptly and securely written or rewritten onto the memory circuit, as well as the written image signal can be further securely retained.

Application Example 9

In the electro-optical device according to the present application example, a potential to be supplied to the second scan line may preferably be the second potential or the third potential.

According to the configuration of the present application example, the third transistor is disposed between the output of the second inverter and the input of the first inverter. A source potential of the third transistor is equal to or approximately equal to either of the first potential and the second potential constituting the low-voltage power-supply. The second scan line electrically connected with the gate of the third transistor is supplied with a second scanning signal at either of the second potential and the third potential constituting the high-voltage power-supply. Therefore, when switching the third transistor to the ON-state, a gate potential of the third transistor can be set to the third potential of the high-voltage power-supply. Specifically, when the third transistor is the N-type, a gate-source voltage can be a large positive value, whereas, when the third transistor is the P-type, the gate-source voltage can be a large negative value. As described above, the gate-source voltage of the third transistor can be set high and an ON-resistance of the third transistor being in the ON-state can be reduced. Therefore, the static signal retaining operation can securely take place between the first inverter and the second inverter, allowing the memory circuit to stably retain an image signal.

Application Example 10

In the electro-optical device according to the present application example, the gate of the first transistor may preferably be electrically connected to the input of the second inverter or the output of the second inverter.

According to the configuration of the present application example, with the memory circuit electrically connected to the low-voltage power-supply to be supplied with the first potential and the second potential, an input potential to the second inverter and an output potential from the second inverter can be surely the first potential or the second potential. On the other hand, an input potential to the first inverter might shift from the first potential or the second potential while an image signal is being retained. This is due to that, while an output potential from the first inverter and the output potential from the second inverter are respectively directly formed by the inverters, the input potential to the first inverter being in the signal-retaining state accepts the output potential from the second inverter via the third transistor. For example, when the third transistor is the N-type and the memory circuit retains an emission signal, and when a retention signal of a second scanning signal has the first potential, i.e., approximately High, and an image signal required to be retained between the input of the first inverter and the output of the second inverter also has the first potential, i.e., High, the input potential to the first inverter might lower by a threshold voltage of the third transistor from the first potential while an image signal is retained. This is due to that, even when electric charge corresponding to the input potential to the first inverter leaks to each of the data lines via the second transistor, the third transistor does not switch to the ON-state until the input potential to the first inverter lowers from the first potential by the threshold voltage of the third transistor. Therefore, if the gate of the first transistor is connected to the input of the first inverter, a gate potential of the first transistor lowers from the first potential by the threshold voltage of the third transistor. On the other hand, according to the configuration of the present application example, such an undesirable event described above can be avoided and the gate potential of the first transistor can be surely the first potential or the second potential. Therefore, when an image signal indicates emission, the light emitting element can surely emit light, whereas, when an image signal indicates non-emission, the light emitting element can securely not emit light.

Application Example 11

An electronic apparatus according to the present application example includes the electro-optical device described in the above-described application example.

According to the configuration of the present application example, high quality of an image displayed in the electronic apparatus such as a head-mounted display can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments of the invention will be described with reference to drawings. Note that, in each of the drawings below, to make each layer, member, and the like recognizable in terms of size, each of the layers, each of the members, and the like are not to scale.

Outline of Electronic Apparatus

Figure 1:
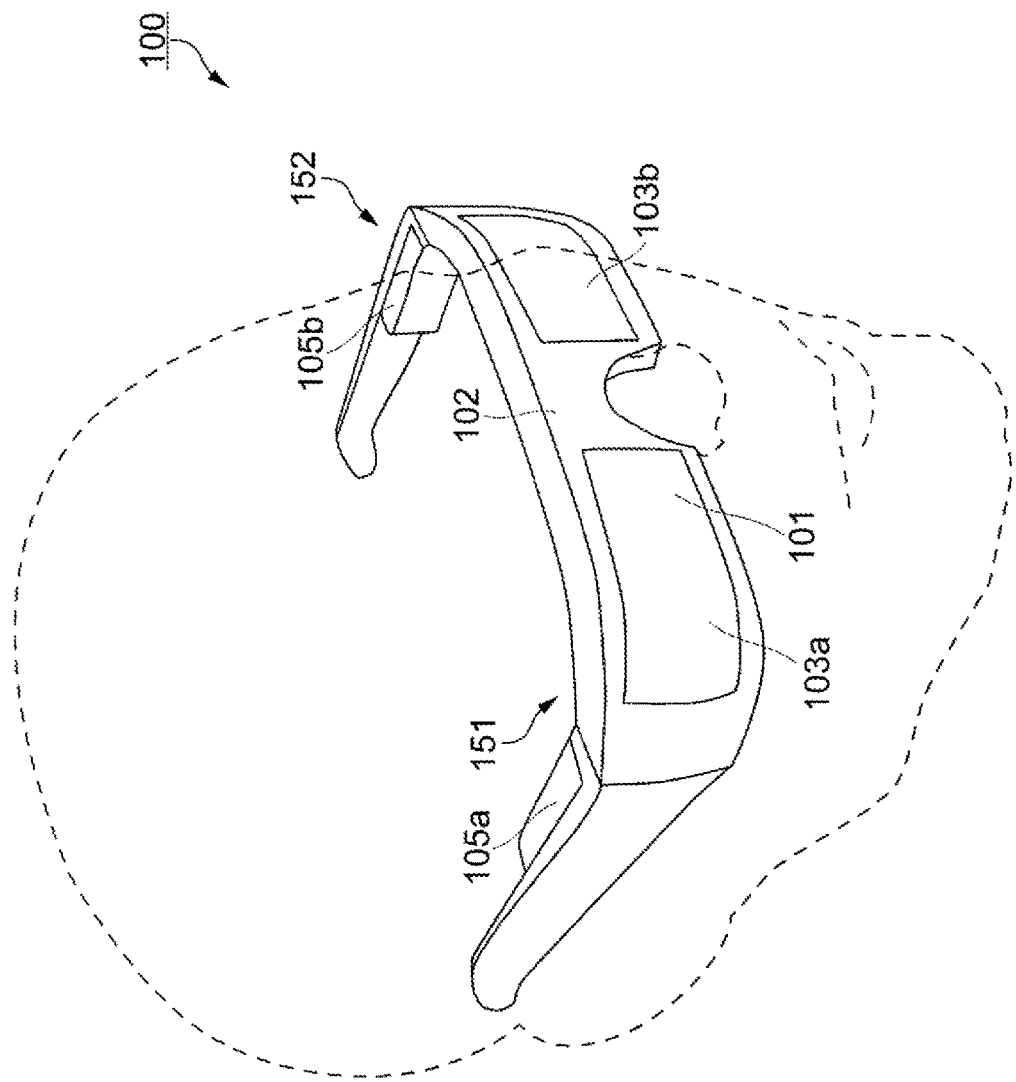
FIG. 1 is a diagram illustrating an outline of an electronic apparatus according to the present exemplary embodiment.

First, an outline of an electronic apparatus will be described with reference to FIG. 1. FIG. 1 is a diagram illustrating an outline of an electronic apparatus according to the present exemplary embodiment.

Figure 3:
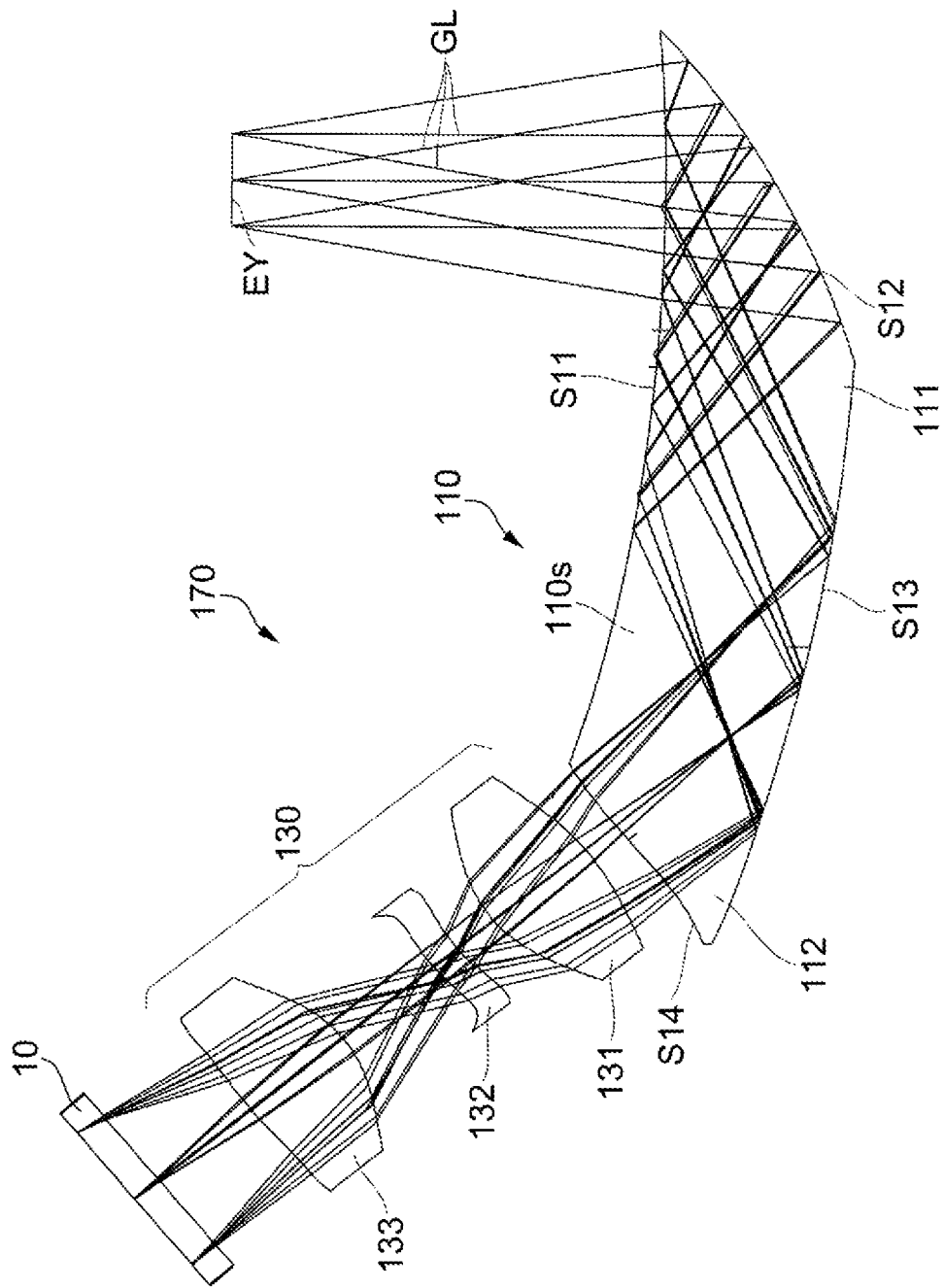
FIG. 3 is a diagram illustrating an optical system of the electronic apparatus according to the present exemplary embodiment.

A head-mounted display 100 is one example of the electronic apparatus according to the present exemplary embodiment, and includes an electro-optical device 10 (see FIG. 3). As illustrated in FIG. 1, the head-mounted display 100 has an external appearance similar to that of a pair of glasses. The head-mounted display 100 allows a user who wears the head-mounted display 100 to view image light GL of an image (refer to FIG. 3) and allows the user to view extraneous light as a see-through image. In other words, the head-mounted display 100 has a see-through function of superimposing the extraneous light over the image light GL to display an image, and has a small size and weight while having a wide angle of view and high performance.

The head-mounted display 100 includes a see-through member 101 that covers the front of user's eyes, a frame 102 that supports the see-through member 101, and a first built-in device unit 105a and a second built-in device unit 105b attached to respective portions of the frame 102 extending from cover portions at both left and right ends of the frame 102 over rear sidepieces (temples).

The see-through member 101 is a thick, curved optical member, is also referred to as a transmission eye cover that covers the front of user's eyes and is separated into a first optical portion 103a and a second optical portion 103b. A first display apparatus 151 illustrated on the left side of FIG. 1 that combines the first optical portion 103a and the first built-in device unit 105a is a portion that displays a see-through virtual image for the right eye and can alone serve as an electronic apparatus having a display function. A second display apparatus 152 illustrated on the right side of FIG. 1 that combines the second optical portion 103b and the second built-in device unit 105b is a portion that forms a see-through virtual image for the left eye and can alone serve as an electronic apparatus having a display function. The electro-optical device 10 (see FIG. 3) is incorporated in each of the first display apparatus 151 and the second display apparatus 152.

Internal Structure of Electronic Apparatus

Figure 2:
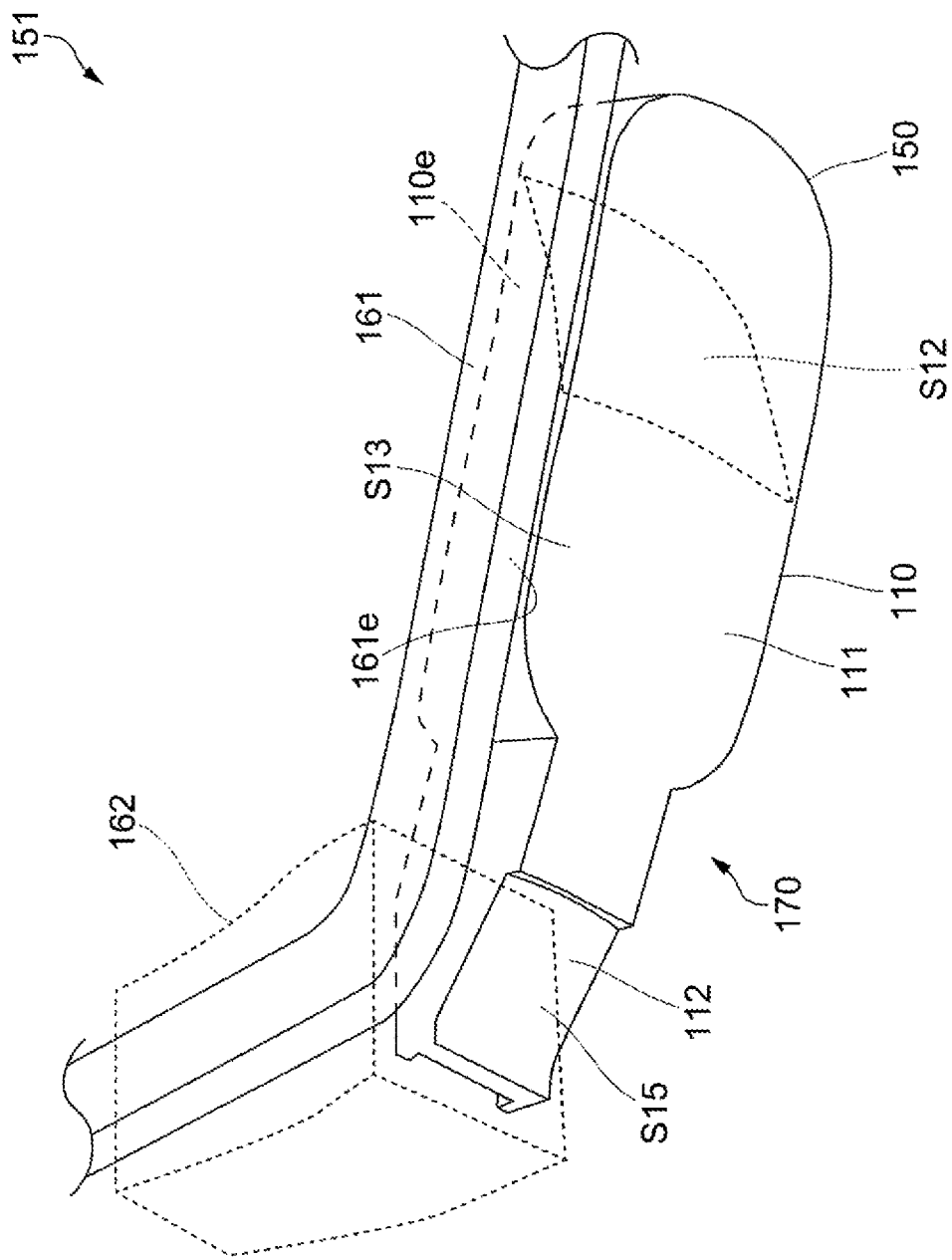
FIG. 2 is a diagram illustrating an internal structure of the electronic apparatus according to the present exemplary embodiment.

FIG. 2 is a diagram illustrating the internal structure of the electronic apparatus according to a present exemplary embodiment. FIG. 3 is a diagram illustrating an optical system of the electronic apparatus according to the present exemplary embodiment. Next, the internal structure and the optical system of the electronic apparatus will be described with reference to FIGS. 2 and 3. While FIG. 2 and FIG. 3 illustrate the first display apparatus 151 as an example of the electronic apparatus, the second display apparatus 152 is symmetrical to the first display apparatus 151 and has substantially the same structure. Accordingly, only the first display apparatus 151 will be described here and detailed description of the second display apparatus 152 will be omitted.

As illustrated in FIG. 2, the first display apparatus 151 includes a see-through projection device 170 and the electro-optical device 10 (see FIG. 3). The see-through projection device 170 includes a prism 110 to serve as a light-guiding member, a light transmission member 150, and a projection lens 130 for image formation (see FIG. 3). The prism 110 and the light transmission member 150 are integrated together by bonding and are securely fixed on a lower side of a frame 161 such that an upper surface 110e of the prism 110 contacts a lower surface 161e of the frame 161, for example.

The projection lens 130 is fixed to an end portion of the prism 110 through a lens tube 162 that houses the projection lens 130. The prism 110 and the light transmission member 150 of the see-through projection device 170 correspond to the first optical portion 103a in FIG. 1. The projection lens 130 of the see-through projection device 170 and the electro-optical device 10 correspond to the first built-in device unit 105a in FIG. 1.

The prism 110 of the see-through projection device 170 is an arc-shaped member curved along the face in a plan view and may be considered to be separated into a first prism portion 111 on a central side close to the nose and a second prism portion 112 on a peripheral side away from the nose. The first prism portion 111 is disposed on a light emission side and includes a first surface S11 (see FIG. 3), a second surface S12, and a third surface S13 as side surfaces having an optical function.

The second prism portion 112 is disposed on a light incident side and includes a fourth surface S14 (see FIG. 3) and a fifth surface S15 as side surfaces having an optical function. Of these surfaces, the first surface S11 is adjacent to the fourth surface S14, the third surface S13 is adjacent to the fifth surface S15, and the second surface S12 is disposed between the first surface S11 and the third surface S13. Further, the prism 110 includes the upper surface 110e adjacent to the first surface S11 and the fourth surface S14.

The prism 110 is made of a resin material having high transmissivity in a visible range and is molded by, for example, pouring a thermoplastic resin in a mold, and solidifying the thermoplastic resin. While a main portion 110s (see FIG. 3) of the prism 110 is illustrated as an integrally formed member, it can be considered to be separated into the first prism portion 111 and the second prism portion 112. The first prism portion 111 can guide and emit the image light GL while also allowing for see-through of the extraneous light. The second prism portion 112 can receive and guide the image light GL.

The light transmission member 150 is fixed integrally together with the prism 110. The light transmission member 150 is a member, and is also referred to as an auxiliary prism that assists a see-through function of the prism 110. The light transmission member 150 has high transmissivity in a visible range and is made of a resin material having substantially the same refractive index as the refractive index of the main portion 110s of the prism 110. The light transmission member 150 is formed by, for example, molding a thermoplastic resin.

As illustrated in FIG. 3, the projection lens 130 includes, for example, three lenses 131, 132, and 133 along an incident side-optical axis. Each of the lenses 131, 132, and 133 is rotationally symmetric about a central axis of a light incident surface of the lens. At least one or more of the lenses 131, 132, and 133 is an aspheric lens.

The projection lens 130 allows the image light GL emitted from the electro-optical device 10 to enter the prism 110 and refocus the image on an eye EY. In other words, the projection lens 130 is a relay optical system for refocusing the image light GL emitted from each pixel of the electro-optical device 10 on the eye EY via the prism 110. The projection lens 130 is held inside the lens tube 162. The electro-optical device 10 is fixed to one end of the lens tube 162. The second prism portion 112 of the prism 110 is connected to the lens tube 162 holding the projection lens 130 and indirectly supports the projection lens 130 and the electro-optical device 10.

An electronic apparatus that is mounted on a user's head and covers the front of eyes, such as the head-mounted display 100, needs to be small and light. Further, the electro-optical device 10 used in an electronic apparatus such as the head-mounted display 100 needs to have a higher resolution, finer pixels, multiple-gray-scales of display, and lower power consumption.

Configuration of Electro-Optical Device

Figure 4:
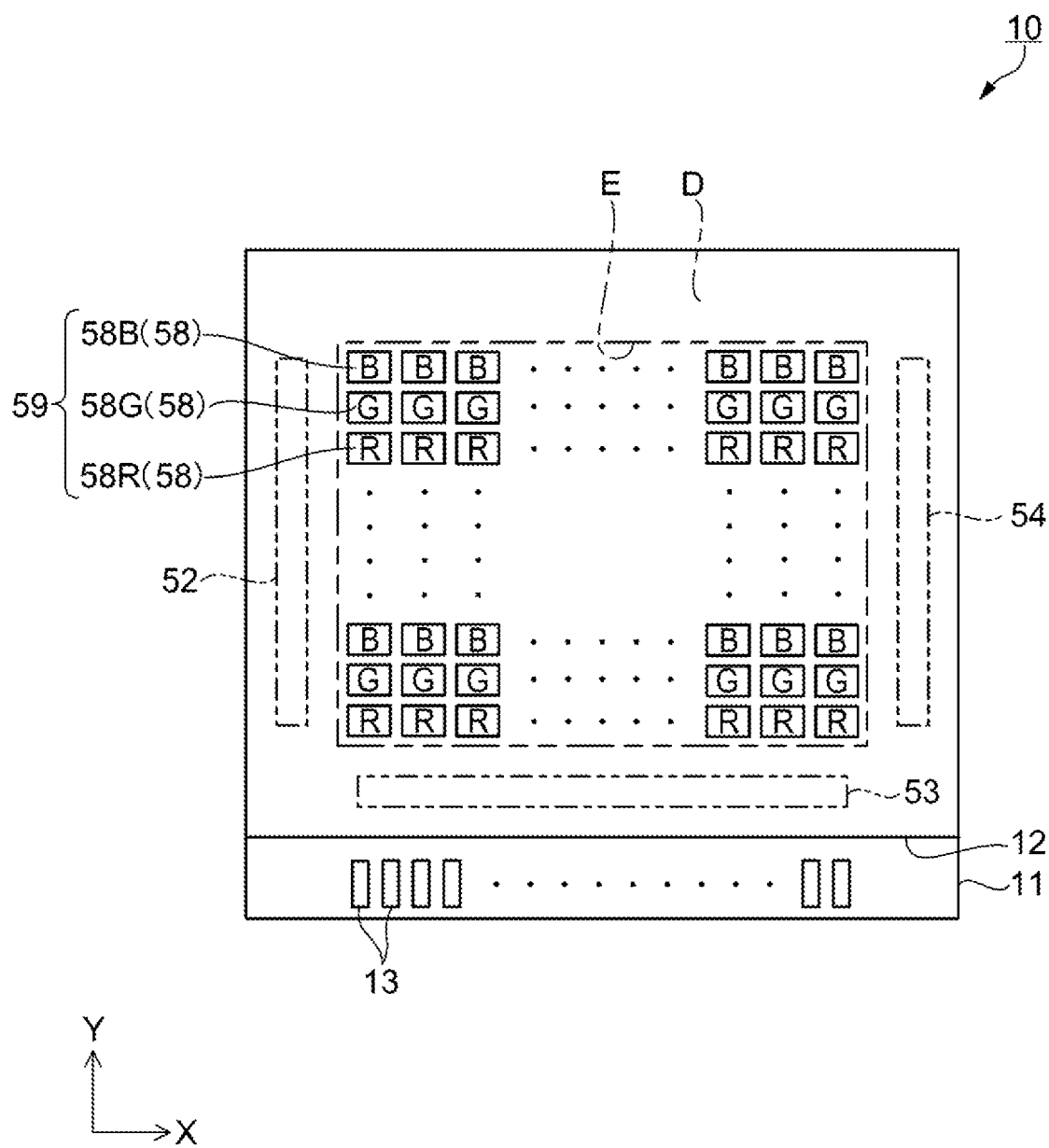
FIG. 4 is a schematic plan view illustrating a configuration of an electro-optical device according to the present exemplary embodiment.

Next, a configuration of an electro-optical device will be described with reference to FIG. 4. FIG. 4 is a schematic plan view illustrating the configuration of the electro-optical device according to the present exemplary embodiment. The present exemplary embodiment will be described by taking, as an example, a case where the electro-optical device 10 is an organic EL device including an organic EL element as a light emitting element. As illustrated in FIG. 4, the electro-optical device 10 according to the present exemplary embodiment includes an element substrate 11 and a protective substrate 12. The element substrate 11 is provided with a color filter, which is not illustrated. The element substrate 11 and the protective substrate 12 are disposed to face each other and bonded together with a filling agent, which is not illustrated.

The element substrate 11 is formed of, for example, a single crystal semiconductor substrate, such as a single-crystal silicon wafer. The element substrate 11 includes a display region E and a non-display region D surrounding the display region E. In the display region E, for example, a sub-pixel 58B that emits blue (B) light, a sub-pixel 58G that emits green (G) light, and a sub-pixel 58R that emits red (R) light are arranged in, for example, a matrix. Each of the sub-pixel 58B, the sub-pixel 58G, and the sub-pixel 58R is provided with a light emitting element 20 (see FIG. 6). In the electro-optical device 10, a pixel 59 including the sub-pixel 58B, the sub-pixel 58G, and the sub-pixel 58R serves as a display unit to provide a full color display.

In this specification, the sub-pixel 58B, the sub-pixel 58G, and the sub-pixel 58R may not be distinguished from one another and may be collectively referred to as a sub-pixel 58. The display region E is a region through which light emitted from the sub-pixel 58 passes and that contributes to display. The non-display region D is a region through which light emitted from the sub-pixel 58 does not pass and that does not contribute to display.

The element substrate 11 is larger than the protective substrate 12 and a plurality of external connection terminals 13 are aligned along a first side of the element substrate 11 extending from the protective substrate 12. A data line drive circuit 53 is provided between the plurality of external connection terminals 13 and the display region E. A scan line drive circuit 52 is provided between another second side orthogonal to the first side and the display region E. An enable line drive circuit 54 is provided between a third side that is orthogonal to the first side and opposite from the second side and the display region E.

The protective substrate 12 is smaller than the element substrate 11 and is disposed so as to expose the external connection terminals 13. The protective substrate 12 is a light transmitting substrate, and, for example, a quartz substrate, a glass substrate, and the like may be used as the protective substrate 12. The protective substrate 12 serves to protect the light emitting element 20 disposed in the sub-pixel 58 in the display region E from damage and is disposed to face at least the display region E.

Note that, a color filter may be provided on the light emitting element 20 in the element substrate 11 or provided on the protective substrate 12. When beams of light corresponding to colors are emitted from the light emitting element 20, a color filter is not essential. The protective substrate 12 is also not essential, and a protective layer that protects the light emitting element 20 may be provided instead of the protective substrate 12 on the element substrate 11.

In this specification, a direction along the first side on which the external connection terminals 13 are arranged is referred to as an X direction or a row direction, and a direction along the other two sides, i.e., the second side and the third side, perpendicular to the first side and opposite to each other is referred to as a Y direction or a column direction. For example, the present exemplary embodiment adopts a so-called lateral stripe arrangement in which the sub-pixels 58 that emit the same color are arranged in the row direction, i.e., the X direction, and the sub-pixels 58 that emit different colors are arranged in the column direction, i.e., the Y direction.

Note that, the arrangement of the sub-pixels 58 in the column direction, i.e., the Y direction, may not be limited to the order of B, G, and R as illustrated in FIG. 4 but may be in other order, for example, R, G, and B. The arrangement of the sub-pixels 58 is not limited to the stripe arrangement but may be a delta arrangement, a Bayer arrangement or an S-stripe arrangement. In addition, the sub-pixels 58B, the sub-pixels 58G and the sub-pixels 58R are not limited to the same shape or size.

Configuration of Circuit of Electro-Optical Device

Figure 5:
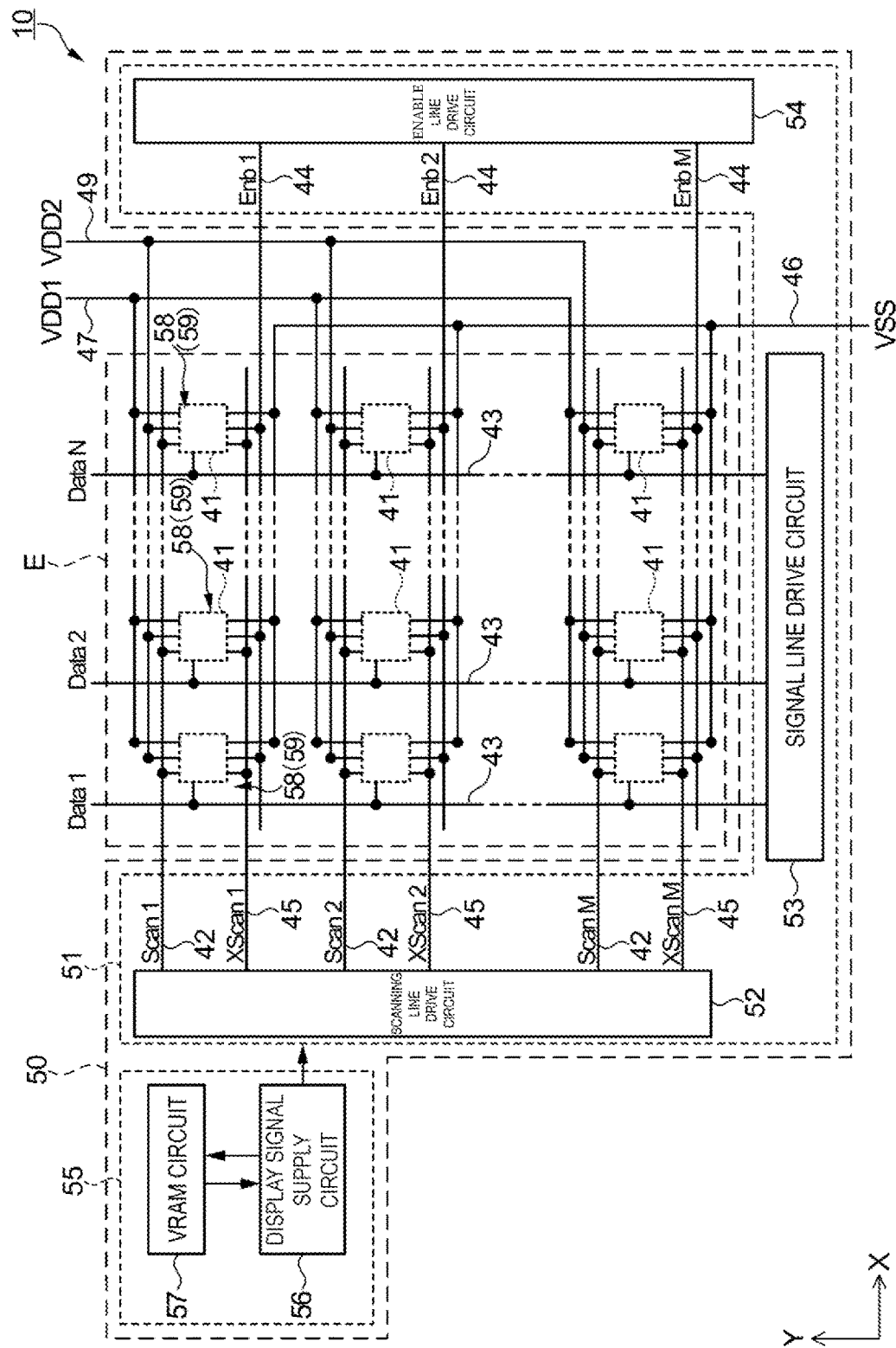
FIG. 5 is a block diagram of a circuit of the electro-optical device according to the present exemplary embodiment.

Next, a configuration of the circuit of the electro-optical device will be described with reference to FIG. 5. FIG. 5 is a block diagram of the circuit of the electro-optical device according to the present exemplary embodiment. As illustrated in FIG. 5, formed in the display region E of the electro-optic device 10 are a plurality of first scan lines 42 and a plurality of data lines 43 that cross each other with the sub-pixels 58 being arranged in a matrix to correspond to the respective intersections of the first scan lines 42 and the data lines 43. Each of the sub-pixels 58 includes a pixel circuit 41 including the light emitting element 20 (see FIG. 8), and the like.

Second scan lines 45 are respectively formed to correspond to the first scan lines 42 in the display region E of the electro-optical device 10. Enable lines 44 are respectively formed to correspond to the first scan lines 42 in the display region E. The first scan lines 42, the second scan lines 45, and the enable lines 44 extend in the row direction. The data lines 43 extend in the column direction.

In the electro-optical device 10, the sub-pixels 58 in M rows×N columns are arranged in matrix in the display region E. Specifically, M first scan lines 42, M second scan lines 45, M enable lines 44, and N data lines 43 are formed in the display region E. Note that, M and N are integers of two or more, and M=720×p and N=1280 as one example in the present exemplary embodiment. p is an integer of one or more and indicates the number of basic display colors. The present exemplary embodiment is described by taking, as an example, a case where p=3, that is, the basic display colors are three colors of R, G, and B.

The electro-optical device 10 includes a drive unit 50 outside the display region E. The driving unit 50 supplies various signals to the respective pixel circuits 41 arranged in the display region E, such that an image in which the pixels 59 with sub-pixels 58 for three colors serve as units of display is displayed in the display region E. The drive unit 50 includes a drive circuit 51 and a control unit 55. The control unit 55 supplies a display signal to the drive circuit 51. The drive circuit 51 supplies a drive signal to each of the pixel circuits 41 through the plurality of first scan lines 42, the plurality of second scan lines 45, the plurality of data lines 43, and the plurality of enable lines 44, based on the display signal.

Further, arranged in the non-display region D and the display region E are high potential lines 47 as first potential lines supplied with a first potential, low potential lines 46 as second potential lines supplied with a second potential, and high potential lines 49 as third potential lines supplied with a third potential. To each of the pixel circuits 41, the high potential line 47 supplies the first potential, the low potential line 46 supplies the second potential, and the high potential line 49 supplies the third potential.

In the present exemplary embodiment, the first potential (V1) represents a first high potential VDD1 (for example, V1=VDD1=3.0 V), the second potential (V2) represents a low potential VSS (for example, V2=VSS=0 V), and the third potential (V3) represents a second high potential VDD2 (for example, V3=VDD2=7.0 V). Therefore, the first potential is higher than the second potential, whereas the third potential is higher than the first potential.

In the present exemplary embodiment, the first potential (first high potential VDD1) and the second potential (low potential VSS) constitute a low-voltage power-supply, whereas the third potential (second high potential VDD2) and the second potential (low potential VSS) constitute a high-voltage power-supply. The second potential serves as a reference potential in the low-voltage power-supply and the high-voltage power-supply.

Note that, in one example of the present exemplary embodiment, while the second potential lines (low potential lines 46), the first potential lines (high potential lines 47), and the third potential lines (high potential lines 49) extend in the row direction within the display region E, these lines may extend in the column direction, or some of the lines may extend in the row direction with the others extending in the column direction, or the lines may be arranged in a grid pattern in both the row and column directions.

The drive circuit 51 includes the scan line drive circuit 52, the data line drive circuit 53, and the enable line drive circuit 54. The drive circuit 51 is provided in the non-display region D (see FIG. 4). In the present exemplary embodiment, the drive circuit 51 and the pixel circuits 41 are formed on the element substrate 11 illustrated in FIG. 4. In the present exemplary embodiment, the element substrate 11 is formed of a single-crystal silicon wafer. Specifically, the drive circuit 51 and the pixel circuit 41 are each formed of an element such as a transistor formed on the single-crystal silicon wafer.

The scan line drive circuit 52 is electrically connected with the first scan lines 42 and the second scan lines 45. The scan line drive circuit 52 outputs a scanning signal (Scan) that allows the pixel circuits 41 to be selected or unselected in the row direction to the respective first scan lines 42. The first scan lines 42 transmit the scanning signals to the pixel circuits 41. In other words, the scanning signal has a selection state that turns the second transistor 32 (see FIG. 8) into the ON-state and a non-selection state that turns the second transistor 32 into the OFF-state, and the scan lines 42 may be appropriately selected in response to the scanning signals received from the scan line drive circuit 52.

Since in the present exemplary embodiment the second transistor 32 is N-type, as will be described later, the scanning signal in the selection state, namely a selection signal, is an high potential (High), whereas, the scanning signal in the non-selection state, namely a non-selection signal, is a low potential (Low). A potential of the selection signal is designated as a fourth potential (V4), whereas a potential of the non-selection signal is designated as a fifth potential (V5). The fourth potential (V4) is set to a high potential equal to or above the first potential (V1), and may preferably be set to the third potential (V3). The fifth potential (V5) is set to a low potential equal to or below the second potential (V2), and may be set to the second potential (V2).

The scan line drive circuit 52 outputs a second scanning signal (X Scan), which allows the pixel circuits 41 in the row direction to retain or not to retain a signal, to the respective second scan lines 45. The second scan lines 45 transmit the second scanning signals to the pixel circuits 41. In other words, the second scanning signal has a retention signal that turns the third transistor 33 (see FIG. 8) into the ON-state, and a non-retention signal that turns the third transistor 33 into the OFF-state. The second scan lines 45 accept the second scanning signals from the scan line drive circuit 52.

Since in the present exemplary embodiment the third transistor 33 is the N-type, as will be described later, the second scanning signal in the signal-retaining state, namely the retention signal, is an high potential (High), whereas, the second scanning signal in the signal-not-retaining state, namely the non-retention signal, is a low potential (Low). A potential of the retention signal is designated as a sixth potential (V6), whereas a potential of the non-retention signal is designated as a seventh potential (V7). The sixth potential (V6) is set to a high potential equal to or above the first potential (V1), and may preferably be set to the third potential (V3). The seventh potential (V7) is set to a low potential equal to or below the second potential (V2), and may preferably be set to the second potential (V2).

Note that, to identify the scanning signal supplied to a first scan line 42 in an i-th row out of the M first scan lines 42, the scanning signal is named as a scanning signal Scan i. Similarly, to identify the second scanning signal supplied to a second scan line 45 in an i-th row out of the M second scan lines 45, the second scanning signal is named as a second scanning signal XScan i. The scan line drive circuit 52 includes a shift register circuit, which is not illustrated, and a signal for shifting the shift register circuit is output as a shift output signal for each stage. The shift output signals are used to generate scanning signals Scan 1 in a first row to Scan M in an M-th row supplied to the respective first scan lines 42 and second scanning signals X Scan 1 in a first row to X Scan M in an M-th row supplied to the respective second scan lines 45.

The data lines 43 are electrically connected to the data line drive circuit 53. The data line drive circuit 53 includes a shift register circuit, a decoder circuit, or a demultiplexer circuit, which is not illustrated. The data line drive circuit 53 supplies an image signal (Data) to each of the N data lines 43 in synchronization with the selection of each of the first scan lines 42. The image signal is a digital signal having one of the first potential, i.e. VDD1, in the present exemplary embodiment and the second potential, i.e. VSS, in the present exemplary embodiment. Note that, to specify an image signal supplied to a data line 43 in a j-th column out of the N data lines 43, the image signal is named as an image signal Data j.

The enable lines 44 are electrically connected to the enable line drive circuit 54. The enable line drive circuit 54 outputs a control signal unique to a row to each of the enable lines 44 divided into each row. The enable line 44 supplies this control signal to the pixel circuit 41 in the corresponding row. The control signal has an active state and an inactive state, and the enable line 44 may be appropriately brought into the active state in response to the control signal received from the enable line drive circuit 54. The control signal has an intermediate potential between the second potential (low potential VSS) and the third potential (second high potential VDD2).

Since in the present exemplary embodiment the fourth transistor 34 is P-type (see FIG. 8) as will be described later, the control signal in the active state (active signal) is Low, i.e. low potential, whereas the control signal in the inactive state (inactive signal) is High, i.e. high potential. When the first potential is expressed as V1, the second potential is expressed as V2, and the third potential is expressed as V3, the active signal is set to V3−(V1−V2) or lower, and is preferably set to the second potential (V2). The inactive signal is set to the third potential (V3) or higher, and is preferably set to the third potential (V3).

Note that, to specify a control signal supplied to an enable line 44 in the i-th row out of the M enable lines 44, the control signal is named as a control signal Enb i. The enable line drive circuit 54 may supply the active signal or the inactive signal as the control signal to each row, or it may supply the active signal or the inactive signal as the control signal simultaneously to a plurality of rows. In the present exemplary embodiment, the enable line drive circuit 54 supplies the active signal or the inactive signal simultaneously to all of the pixel circuits 41 located in the display region E through the enable lines 44.

The control unit 55 includes a display signal supply circuit 56 and a video random access memory (VRAM) circuit 57. The VRAM circuit 57 temporarily stores a frame image and the like. The display signal supply circuit 56 generates a display signal, such as an image signal and a clock signal, from a frame image temporarily stored in the VRAM circuit 57 and supplies the display signal to the drive circuit 51.

In the present exemplary embodiment, the drive circuit 51 and the pixel circuits 41 are formed on the element substrate 11. In the present exemplary embodiment, the element substrate 11 is a single-crystal silicon wafer. Specifically, the drive circuit 51 and the pixel circuits 41 are each formed of a transistor element formed on the single-crystal silicon wafer.

The control unit 55 is formed of a semiconductor integrated circuit formed on a substrate (not illustrated) formed of a single crystal semiconductor substrate different from the element substrate 11. The substrate on which the control unit 55 is formed is connected to the external connection terminals 13 provided on the element substrate 11 with a flexible printed circuit (FPC). A display signal is supplied from the control unit 55 to the drive circuit 51 through this flexible printed circuit.

Configuration of Pixel

Figure 6:
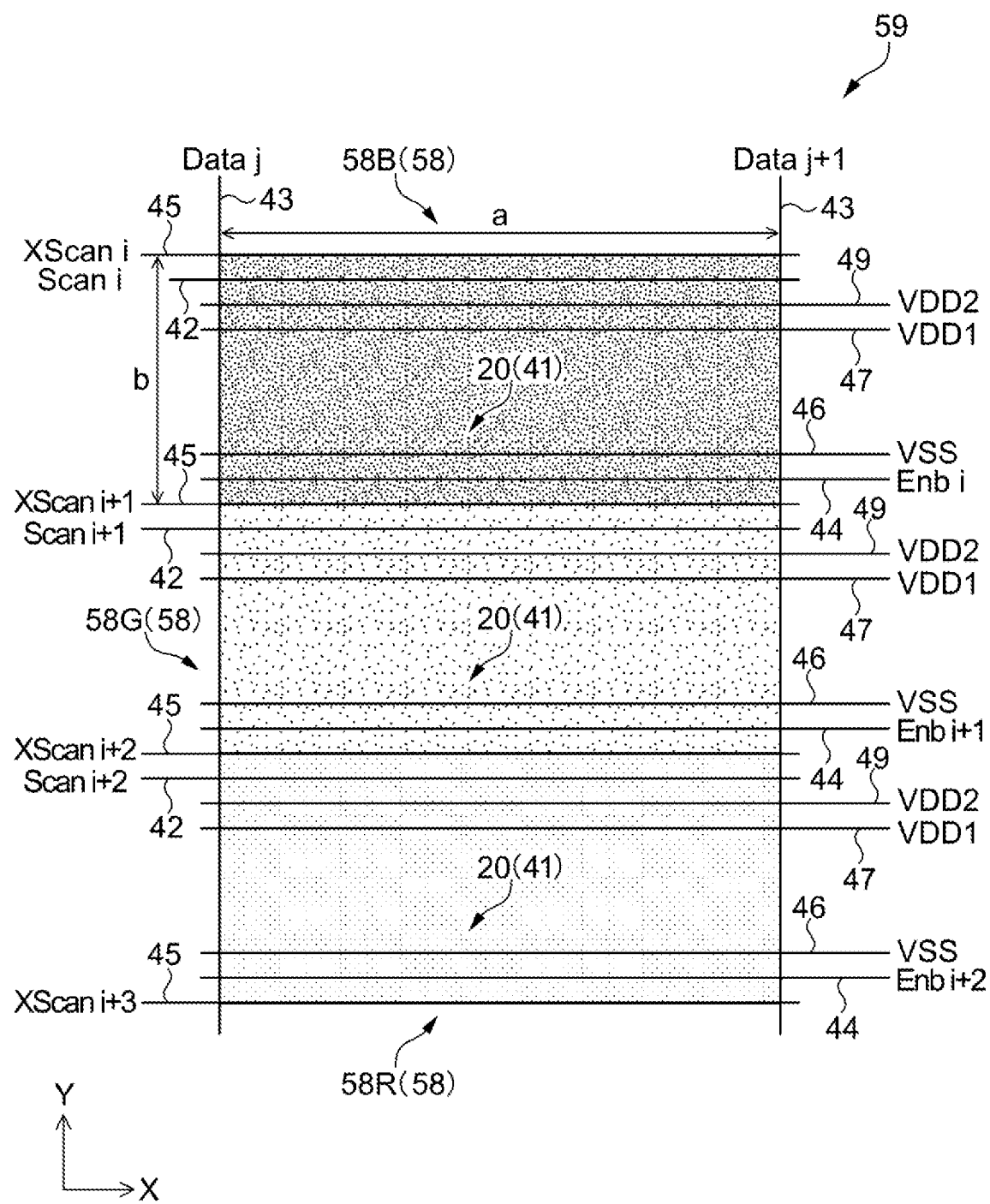
FIG. 6 is a diagram illustrating a configuration of a pixel according to the present exemplary embodiment.

Next, a configuration of a pixel according to the present exemplary embodiment will be described with reference to FIG. 6. FIG. 6 is a diagram illustrating the configuration of the pixel according to the present exemplary embodiment.

As described above, in the electro-optic device 10, the pixel 59 including the sub-pixels 58 forms a unit of display to display an image. In the present exemplary embodiment, a length a of the sub-pixel 58 in the row direction, i.e. the X direction, is 12 micrometers (µm) and a length b of the sub-pixel 58 in the column direction, i.e. the Y direction, is 4 micrometers (m). In other words, the pitch at which the sub-pixels 58 are arranged in the row direction, i.e. the X direction, is 12 micrometers (m) and the pitch at which the sub-pixels 58 are arranged in the column direction, i.e. the Y direction, is 4 micrometers (m).

Each of the sub-pixels 58 includes the pixel circuit 41 including the light emitting element (LED) 20. The light emitting element 20 emits white light. The electro-optical device 10 includes a color filter (not illustrated) through which light emitted from the light emitting element 20 passes. The color filter includes color filters in colors corresponding to basic display colors p. In the present exemplary embodiment, the basic colors p=3, and color filters in respective colors of B, G, and R are disposed in the corresponding sub-pixels 58B, 58G, and 58R.

In the present exemplary embodiment, an organic electro luminescence (EL) element is used as one example of the light emitting element 20. The organic EL element may have an optical resonant structure that amplifies the intensity of light having a specific wavelength. Specifically, the organic EL element may be configured such that a blue light is extracted from the white light emitted from the light emitting element 20 in the sub-pixel 58B; a green light is extracted from the white light emitted from the light emitting element 20 in the sub-pixel 58G; and a red light is extracted from the white light emitted from the light emitting element 20 in the sub-pixel 58R.

In addition to the above-described example, assuming that basic color p=4, the sub-pixel 58 substantially without a color filter may be prepared as a color filter for a color other than B, G, and R, for example, a color filter for white light; or the sub-pixel 58 with a color filter for light in another color such as yellow and cyan may be prepared. Furthermore, a light emitting diode element such as gallium nitride (GaN), a semiconductor laser element, and the like may be used as the light emitting element 20.

Digital Driving of Electro-optical Device

Figure 7:
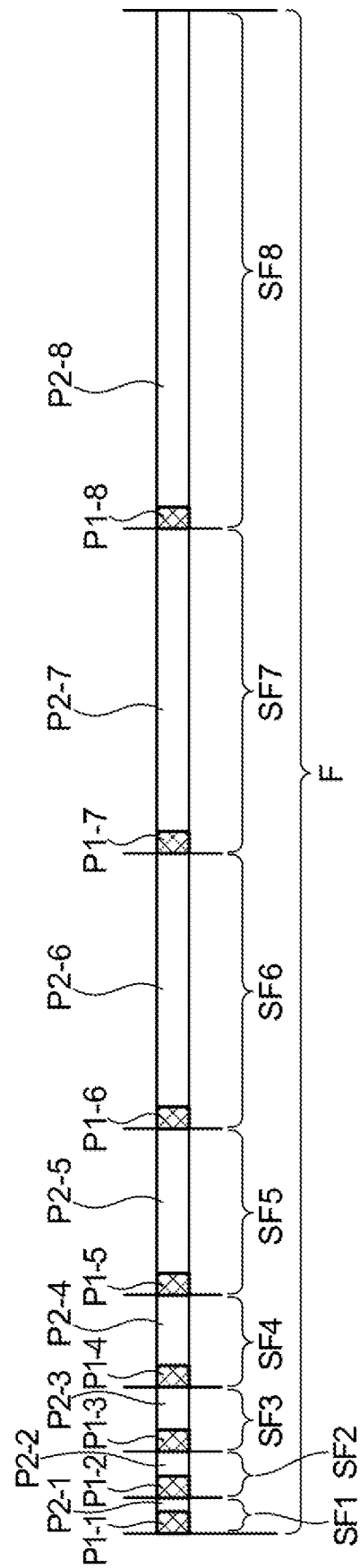
FIG. 7 is a diagram illustrating digital driving of the electro-optical device according to the present exemplary embodiment.

Next, a method for displaying an image by digital driving in the electro-optical device 10 according to the present exemplary embodiment will be described with reference to FIG. 7. FIG. 7 is a diagram illustrating the digital driving of the electro-optical device according to the present exemplary embodiment.

The electro-optical device 10 displays a predetermined image in the display region E (see FIG. 4) by digital driving. In other words, the light emitting element 20 (see FIG. 6) disposed in each of the sub-pixels 58 is placed in either of binary states: emission, i.e. bright state, or non-emission, i.e. dark display. The gray-scale of a displayed image is determined by the ratio of the light emitting period for each of the light emitting elements 20. This is referred to as time division driving.

As illustrated in FIG. 7, in the time division driving, one field (F) displaying one image is divided into a plurality of subfields (SFs) and the gray-scale display is expressed by controlling emission and non-emission of the light emitting element 20 for each of the subfields (SFs). An example in which a display with $2^8$=256 gray-scales is performed by an 8-bit time division gray-scale scheme will be described as one example here. In the 8-bit time division gray-scale scheme, one field F is divided into eight subfields SF1 to SF8.

In FIG. 7, an i-th subfield in the one field F is designated as SFi and the eight subfields from the first subfield SF1 to the eighth subfield SF8 are illustrated. Each of the subfields SF includes a display period P2 as a second period, i.e. P2-1 to P2-8, and optionally a non-display period as a first period, i.e. P1-1 to P1-8. The non-display period can correspond to a signal-writing period.

Note that, the subfields SF1 to SF8 may not be distinguished from one another and may be collectively referred to as the subfield SF, the non-display periods P1-1 to P1-8 may not be distinguished from one another and may be collectively referred to as the non-display period P1, and the display periods P2-1 to P2-8 may not be distinguished from one another and may be collectively referred to as the display period P2 in this specification.

The light emitting element 20 is placed either in the emission or non-emission state during the display period P2 while the light emitting element 20 is placed in the non-emission state during the non-display period P1, which is the signal-writing period. The non-display period P1 is used, for example, to write an image signal to a memory circuit 60 (see FIG. 8) and adjust a display time. If the shortest subfield such as SF1 is relatively long, the non-display period P1 may be omitted.

In the 8-bit time division gray-scale scheme, the display period P2 (P2-1 to P2-8) of each of the subfields SF is set such that (P2-1 of SF1):(P2-2 of SF2):(P2-3 of SF3):(P2-4 of SF4):(P2-5 of SF5):(P2-6 of SF6):(P2-7 of SF7):(P2-8 of SF8)=1:2:4:8:16:32:64:128. For example, if an image is displayed by a progressive scheme having a frame frequency of 60 Hz, then, one frame=one field (F)=16.7 milliseconds (msec).

In the present exemplary embodiment, as will be described later, the non-display period P1 (P1-1 to P1-8) of each of the subfields SF is approximately 10.8 microseconds (µsec). In this case, the settings are as follows: (P2-1 of SF1)=0.065 milliseconds, (P2-2 of SF2)=0.130 milliseconds, (P2-3 of SF3)=0.260 milliseconds, (P2-4 of SF4)=0.520 milliseconds, (P2-5 of SF5)=1.040 milliseconds, (P2-6 of SF6)=2.081 milliseconds, (P2-7 of SF7)=4.161 milliseconds, and (P2-8 of SF8)=8.323 milliseconds.

Here, a time of the non-display period P1 is designated as an x seconds (sec), whereas a shortest time of the display period P2 is designated as a y seconds (sec). In the example described above, a shortest display period P2 is the display period P2-1 in the first subfield SF1. Herein, given that the bit number in gray-scale, i.e., the number of the subfields SF, is g and the field frequency is f (Hz), then the relationship among them is expressed by Expression 1 below:

[Expression 1]

$$gx+(2^g-1)y=1/f \qquad (1)$$

Under the design rule in the present exemplary embodiment, a second inverter 62 is an inverter typically used in the drive circuit 51. In this case, as will be described later in detail with reference to Expression 8, a charging time τ2 at an input terminal 28 of the second inverter 62, i.e., a delay time per inverter, is approximately $\tau 2=1.05 \times 10^{-11}$ seconds (sec). This value corresponds to a delay time per inverter included in the drive circuit 51. Since an inverse value (a shortest time) of a maximum operation frequency of a shift resistor circuit included in the drive circuit 51 is approximately 11 times the delay time per inverter, the shortest time is approximately 1×10$^{-10}$ seconds. Therefore, the maximum operation frequency of the shift resistor circuit is approximately 10 GHz. In general, a circuit stably operates at a frequency that is a half or less of a maximum operation frequency. By taking into account a margin, an operation frequency of the shift resistor circuit included in the drive circuit 51 is preferably equal to or below approximately 2 GHz.

In the present example, as will be described later in detail, a selection time for one of the first scan lines 42 can be reduced shorter than approximately 20 picoseconds (pico sec). However, when the selection time is reduced to a time around the value described above, the data line drive circuit 53 might not operate. For the issue described above, a lateral stripe arrangement is adopted to arrange the sub-pixels 58 in the row direction, i.e., the X direction, and M rows×N columns are respectively set to M=720×3=2160 and N=1280. If the data line drive circuit 53 drives q data lines at a time, the data line drive circuit 53 must output a data-selection signal N/q times within one selection time for one of the first scan lines 42. In the present exemplary embodiment, q=128 and 128 rows are driven in parallel simultaneously. Therefore, a set of 128 data lines 43 is repeatedly selected N/q=10 times within a selection time for one of the first scan lines 42. Therefore, an allocation time per set is 1/10 of a selection time for one of the first scan lines 42.

The inverse value of 2 GHz, which is a stable-operation frequency of the shift resistor circuit described above, is 0.5 nanoseconds (nano sec). This value is allocated to the set described above. That is, the data line drive circuit 53 is operated at a clock of 2 GHz. In this case, a selection time for one of the first scan lines 42 is 5 nanoseconds and a drive frequency for the scan line drive circuit 52 is approximately 200 MHz. A vertical period for selecting all of the first scan lines 42 is 5 nanoseconds×720×3=10.8 microseconds. The vertical period of 10.8 microseconds is the non-display period P1.

In the digital driving of the electro-optical device 10, a gray-scale image is displayed based on the ratio of the emission period to the total display period P2 within one field F. For example, for black display with a gray-scale of "0," the light emitting element 20 is placed into non-emission during all of the display periods P2-1 to P2-8 of the eight subfields SF1 to SF8. On the other hand, for white display with a gray-scale of "255," the light emitting element 20 is placed into emission during all of the display periods P2-1 to P2-8 of the eight subfields SF1 to SF8.

To obtain a display of intermediate luminance with a gray-scale of, for example, "7" out of 256 gray-scales, the light emitting element 20 is caused to emit light during the display periods P2-1, P2-2, and P2-3 of the first, second, and third subfields SF1, SF2, and SF3, respectively, and the light emitting element 20 is placed into non-emission during the display periods P2-4 to P2-8 of the other subfields SF4 to SF8. In this way, a display of intermediate gray-scale can be achieved by appropriately selecting emission or no-emission of the light emitting element 20 during the display period P2 for each of the subfields SF constituting the one field F.

According to a typical analog driven electro-optical device such as organic EL device in prior art, gray-scale display is performed by analog control of a current flowing through an organic EL element according to the gate potential of a driving transistor, such that any variation in voltage-current characteristics and threshold voltage of the driving transistor may cause variations in brightness and shift in gray-scale between pixels, resulting in a decrease in display quality. On the other hand, when a compensating circuit that compensates for variations in voltage-current characteristics and threshold voltage of a driving transistor is provided as described in JP-A-2004-062199, a current also flows through the compensating circuit, causing an increase in power consumption.

Also in a typical organic EL device in prior art, the electric capacitance of a capacitive element for storing an image signal as an analog signal needs to be increased in order to achieve higher gray-scale of display. This requirement is a trade-off with higher resolution and finer pixels and also leads to increased power consumption due to the charging and discharging of a capacitive element with a large capacity. In other words, in a typical organic EL device, an electro-optical device capable of displaying a high-resolution, multi-gray-scale, and high-quality image at low power consumption is difficult to achieve.

In the electro-optical device 10 according to the present exemplary embodiment, the light emitting element 20 is operated based on binary states of ON and OFF, so that the light emitting element 20 is placed into either of binary states of emission or non-emission. Thus, the electro-optical device 10 is less affected by variations in voltage-current characteristics and threshold voltage of a transistor than the electro-optical device 10 operated by analog driving, so that a high-quality displayed image with less variations in brightness and less shift in gray-scale between the pixels 59, i.e., sub-pixels 58, can be obtained. Furthermore, since a capacitive element in digital driving does not need to have a large capacitance as required in analog driving, not only a finer pixel 59, i.e., sub-pixels 58, can be achieved, but the resolution can also be easily improved and the power consumption due to charging and discharging of a large capacitive element can be reduced.

Furthermore, the number of gray-scales can be easily increased by increasing the number g of the subfields SF constituting the one field F in digital driving of the electro-optical device 10. In this case, with the non-display period P1 as described above, the number of gray-scales can be increased by simply shortening the shortest display period P2. For example, when display is performed with 1024 gray-scales assuming that g=10 in the progressive scheme at the frame frequency f=60 Hz, the duration y of the shortest display period, i.e., P2-1 of SF1, may be simply set to 0.016 milliseconds by Expression 1 assuming that duration x of the non-display period P1=10.8 microseconds.

As will be described later in detail, in digital driving of the electro-optical device 10, the non-display period P1 as the first period may be assigned to a signal-writing period during which an image signal is written in the memory circuit 60 or a signal-rewriting period during which an image signal is rewritten. Thus, 8-bit gray-scale display can be easily switched to 10-bit gray-scale display without changing the signal writing period. In other words, 8-bit gray-scale display can be easily switched to 10-bit gray-scale display without changing the clock frequency of the drive circuit 51.

Furthermore, in digital driving of the electro-optical device 10, the image signal in the memory circuit 60 (see FIG. 8) of a sub-pixel 58 for which display is to be changed is rewritten among the subfields SF or among the fields F. On the other hand, the image signal in the memory circuit 60 of a sub-pixel 58 for which display is not to be changed is not rewritten (maintained). In other words, the image signal is retained. As a result, the power consumption can be reduced. Accordingly, this configuration can achieve the electro-optical device 10 that can display a multi-gray-scale and high-resolution image with less variations in brightness and less shift in gray-scale between the pixels 59, i.e., the sub-pixels 58, while reducing energy consumption.

Example 1

Configuration of Pixel Circuit

Figure 8:
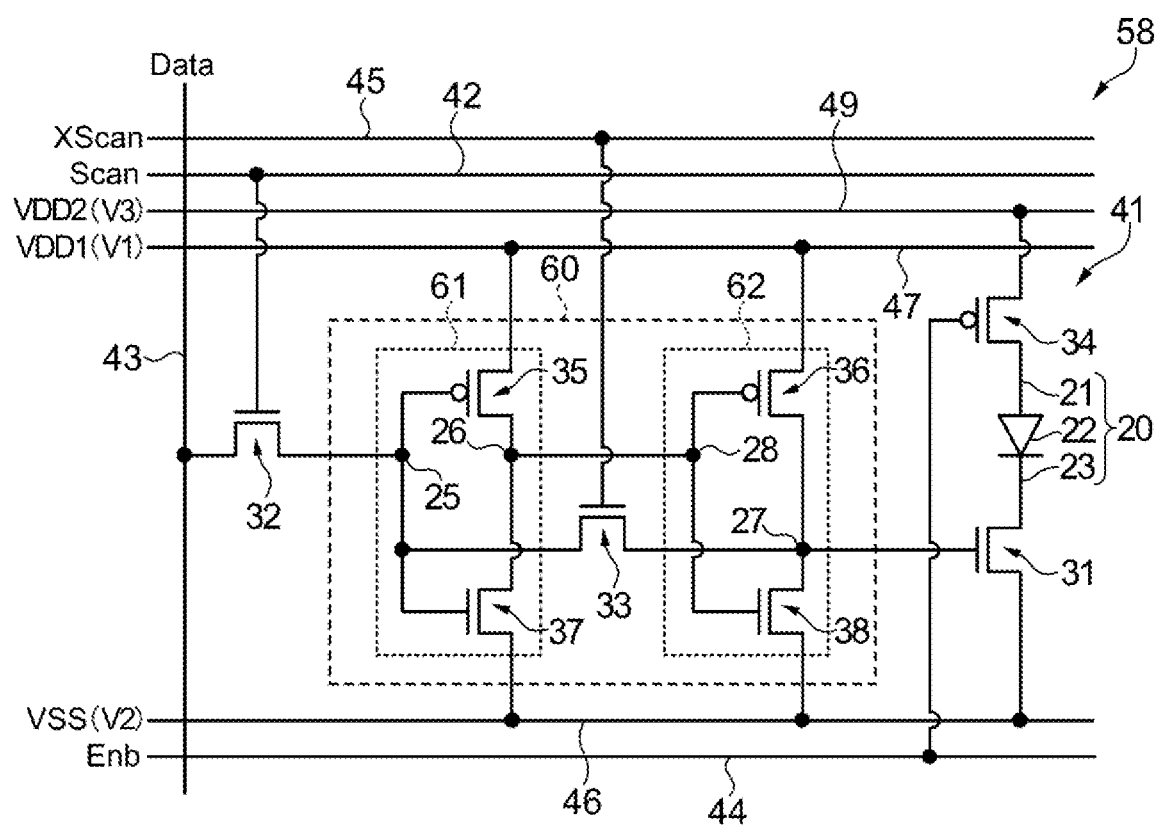
FIG. 8 is a diagram illustrating a configuration of a pixel circuit according to Example 1.

Next, a configuration of a pixel circuit according to Example 1 will be described with reference to FIG. 8. FIG. 8 is a diagram illustrating the configuration of the pixel circuit according to Example 1.

As illustrated in FIG. 8, the pixel circuit 41 is provided for each of the sub-pixel 58 disposed at intersections of the first scan lines 42 and the data lines 43. The second scan lines 45 and the enable lines 44 are disposed along the first scan lines 42. The first scan line 42, the second scan line 45, the data line 43, and the enable line 44 correspond to each of the pixel circuits 41.

In Example 1, for each of the pixel circuits 41, the first potential (VDD1) is supplied from the high potential line 47, the second potential (VSS) is supplied from the low potential line 46, and the third potential (VDD2) is supplied from the high potential line 49.

The pixel circuit 41 according to Example 1 includes the N-type first transistor 31, the light emitting element 20, the P-type fourth transistor 34, the memory circuit 60, and the N-type second transistor 32. The pixel circuit 41 including the memory circuit 60 allows the electro-optical device 10 to be digitally driven. As a result, the variation in the luminance of the light emitting element 20 among the sub-pixels 58 can be suppressed as compared to analog driving and thus, the variation in display among the pixels 59 can be reduced.

The first transistor 31, the light emitting element 20, and the fourth transistor 34 are disposed in series between the third potential line (high potential line 49) and the second potential line (low potential line 46). The memory circuit 60 is disposed between the first potential line (high potential line 47) and the second potential line (low potential line 46). The second transistor 32 is disposed between the memory circuit 60 and the data line 43.

The memory circuit 60 includes the first inverter 61, the second inverter 62, and the N-type third transistor 33. The memory circuit 60 includes the two inverters 61 and 62 that are connected to each other in circle to constitute a so-called static memory that stores a digital signal that is an image signal.

An output terminal 26 of the first inverter 61 and the input terminal 28 of the second inverter 62 are electrically connected to each other. The third transistor 33 is disposed between an output terminal 27 of the second inverter 62 and an input terminal 25 of the first inverter 61. That is, either of a source and a drain of the third transistor 33 is electrically connected to the input terminal 25 of the first inverter 61, whereas the other is electrically connected to the output terminal 27 of the second inverter 62.

In this specification, the state where an output or input terminal A and an output or input terminal B are electrically connected to each other means a state where the logic of the terminal A and the logic of the terminal B can be equal. For example, even when a transistor, a resistive element, a diode, and the like are arranged between the terminal A and the terminal B, the terminals will be regarded as a state of electrically connected if these logics are the same. Further, "dispose" as used in the expression "a transistor and other elements are disposed between A and B" does not mean how these elements are arranged on an actual lay-out, but means how these elements are arranged in a circuit diagram.

A digital signal stored in the memory circuit 60 has a binary value of High or Low. In the present exemplary embodiment, when the potential of the output terminal 26 of the first inverter 61 is Low, i.e., when the potential of the output terminal 27 of the second inverter 62 is High, the light emitting element 20 is brought into a state that allows emission, whereas, when the potential of the output terminal 26 of the first inverter 61 is High, i.e., when the potential of the output terminal 27 of the second inverter 62 is Low, the light emitting element 20 is brought into a state of non-emission.

In Example 1, the two inverters 61 and 62 constituting the memory circuit 60 are disposed between the first potential line (high potential line 47) and the second potential line (low potential line 46), and VDD1 as the first potential and VSS as the second potential are supplied to the two inverters 61 and 62. Therefore, High corresponds to the first potential (VDD1), whereas Low corresponds to the second potential (VSS).

When a digital signal is stored in the memory circuit 60 and the potential of the output terminal 26 of the first inverter 61 becomes Low, Low is input to the input terminal 28 of the second inverter 62 and the potential of the output terminal 27 of the second inverter 62 becomes High. Then, when the third transistor 33 is placed in the ON-state and the potential of the output terminal 27 of the second inverter 62 is High, High is input from the output terminal 27 of the second inverter 62 to the input terminal 25 of the first inverter 61 and the potential of the output terminal 26 of the first inverter 61 becomes Low. As described above, when the third transistor 33 is placed in the ON-state, the digital signal stored in the memory circuit 60 is stably retained until the digital signal is rewritten next.

The first inverter 61 includes a P-type fifth transistor 35 and an N-type seventh transistor 37, and has a CMOS configuration. The fifth transistor 35 and the seventh transistor 37 are disposed in series between the first potential line (high potential line 47) and the second potential line (low potential line 46). A source of the seventh transistor 37 is electrically connected to the second potential line (low potential line 46). A source of the fifth transistor 35 is electrically connected to the first potential line (high potential line 47).

The second inverter 62 includes a P-type sixth transistor 36 and an N-type eighth transistor 38, and has a CMOS configuration. The sixth transistor 36 and the eighth transistor 38 are disposed in series between the first potential line (high potential line 47) and the second potential line (low potential line 46). A source of the sixth transistor 36 is electrically connected to the first potential line (high potential line 47). A source of the eighth transistor 38 is electrically connected to the second potential line (low potential line 46).

Herein, a source potential is compared with a drain potential and the one having a lower potential is a source in the N-type transistor. A source potential is compared with a drain potential and the one having a higher potential is a source in the P-type transistor.

The input terminal 25 of the first inverter 61 is a gate of the fifth transistor 35 and the seventh transistor 37, and is electrically connected to either of the source and the drain of the third transistor 33. The output terminal 26 of the first inverter 61 is a drain of the fifth transistor 35 and the seventh transistor 37, and is electrically connected to the input terminal 28 of the second inverter 62.

The output terminal 27 of the second inverter 62 is a drain of the sixth transistor 36 and the eighth transistor 38, and is electrically connected to either of the source and the drain of the third transistor 33. The input terminal 28 of the second inverter 62 is a gate of the sixth transistor 36 and the eighth transistor 38, and is electrically connected to the output terminal 26 of the first inverter 61.

Note that, it is assumed in Example 1 that both of the first inverter 61 and the second inverter 62 have the CMOS configuration, but these inverters 61 and 62 may be formed of a transistor and a resistance element. For example, one of the fifth transistor 35 and the seventh transistor 37 in the first inverter 61 may be replaced with a resistance element, or one of the sixth transistor 36 and the eighth transistor 38 in the second inverter 62 may be replaced with a resistance element.

The light emitting element 20 is an organic EL element in the present exemplary embodiment, and includes an anode 21 serving as a pixel electrode, a light emitting section 22 formed of a light emission functional layer, and a cathode 23 serving as a counter electrode. The light emitting section 22 is configured to emit light by a part of energy being discharged as fluorescence or phosphorescence when an exciton is formed by a positive hole injected from the anode 21 side and an electron injected from the cathode 23 side and the exciton disappears, i.e., the positive hole recombines with the electron.

In the pixel circuit 41 according to Example 1, the light emitting element 20 is disposed between the first transistor 31 and the fourth transistor 34. The anode 21 of the light emitting element 20 is electrically connected to a drain of the fourth transistor 34 and the cathode 23 of the light emitting element 20 is electrically connected to a drain of the first transistor 31.

The first transistor 31 is a driving transistor for the light emitting element 20. In other words, when the first transistor 31 is brought into the ON-state, the light emitting element 20 may emit light. A gate of the first transistor 31 is electrically connected to the output terminal 27 of the second inverter 62 in the memory circuit 60. A source of the first transistor 31 is electrically connected to the second potential line (low potential line 46). The drain of the first transistor 31 is electrically connected to the light emitting element 20 (cathode 23). In other words, the N-type first transistor 31 is disposed on the low potential side with respect to the light emitting element 20.

The fourth transistor 34 is a control transistor that controls emission of the light emitting element 20. When the fourth transistor 34 is brought into the ON-state, the light emitting element 20 may emit light. As described later, in the present exemplary embodiment, the light emitting element 20 emits light when the active signal is supplied as the control signal to the enable line 44, the fourth transistor 34 is then brought into the ON-state, the output terminal 27 of the second inverter 62 becomes a potential corresponding to emission, and the first transistor 31 is then brought into the ON-state.

A gate of the fourth transistor 34 is electrically connected to the enable line 44. A source of the fourth transistor 34 is electrically connected to the third potential line (high potential line 49). The drain of the fourth transistor 34 is electrically connected to the anode 21 of the light emitting element 20. In other words, the P-type fourth transistor 34 is disposed on the high potential side with respect to the light emitting element 20.

Here, the N-type transistor is disposed on the low potential side with respect to the light emitting element 20, and the P-type transistor is disposed on the high potential side with respect to the light emitting element 20. This arrangement of the N-type first transistor 31 and the P-type fourth transistor 34 with respect to the light emitting element 20 enables both of the transistors 31 and 34 to operate in a substantially linear fashion. Hereinafter, operating transistors in a substantially linear fashion will be simply referred to as operate linearly. Therefore, variations in threshold voltages of the first transistor 31 and the fourth transistor 34 can be prevented from affecting the emission luminance of the light emitting element 20.

The source of the first transistor 31 is electrically connected to the second potential line (low potential line 46), whereas the source of the fourth transistor 34 is electrically connected to the third potential line (high potential line 49). A source potential of the first transistor 31 is thus fixed to the second potential, whereas a source potential of the fourth transistor 34 is fixed to the third potential. In this way, even when the first transistor 31 and the fourth transistor 34 have a small source-drain voltage, electric conductivity of the first transistor 31 and the fourth transistor 34 being in the ON-state can be increased. As a result, most of a potential difference between the third potential (VDD2) and the second potential (VSS) is applied to the light emitting element 20. Thus, the display characteristic is less likely to be affected by variations in the threshold voltages of the first transistor 31 and the fourth transistor 34, and uniformity of the emission luminance of the light emitting element 20 between the pixels 59, i.e., between the sub-pixels 58, can be improved.

The second transistor 32 is disposed between the memory circuit 60 and the data line 43. One of a source and a drain of the N-type second transistor 32 is electrically connected to the data line 43, and the other is electrically connected to the input terminal 25 of the first inverter 61, i.e., the gate of the fifth transistor 35 and the seventh transistor 37. A gate of the second transistor 32 is electrically connected to the first scan line 42.

The second transistor 32 is a selection transistor for the pixel circuit 41. The second transistor 32 switches between the ON-state and the OFF-state in response to whether the scanning signal supplied to the first scan line 42 represents the selection signal or the non-selection signal. When the second transistor 32 switches to the ON-state, the data line 43 and the input terminal 25 of the first inverter 61 of the memory circuit 60 are brought into a conduction state to each other, allowing an image signal supplied from the data line 43 to be written onto the memory circuit 60.

The third transistor 33 is disposed between the input terminal 25 of the first inverter 61 and the output terminal 27 of the second inverter 62. One of the source and the drain of the N-type third transistor 33 is electrically connected to the input terminal 25 of the first inverter 61, whereas the other is electrically connected to the output terminal 27 of the second inverter 62. Here, the input terminal 25 is electrically connected to the gate of the fifth transistor 35 and the seventh transistor 37, whereas the output terminal 27 is electrically connected to the drain of the sixth transistor 36 and the eighth transistor 38. A gate of the third transistor 33 is electrically connected to the second scan line 45.

The third transistor 33 switches between the ON-state and the OFF-state in response to whether the second scanning signal supplied to the second scan line 45 represents the retention signal or the non-retention signal. When the third transistor 33 switches to the ON-state, the output terminal 27 of the second inverter 62 and the input terminal 25 of the first inverter 61 are brought into the conduction state to each other, allowing an image signal written onto the memory circuit 60 to be retained between the first inverter 61 and the second inverter 62.

The second transistor 32 and the third transistor 33 are an identical conductive type, e.g. the N-type. The second transistor 32 and the third transistor 33 operate to almost complement to each other in accordance with the scanning signal supplied to the first scan line 42 and the second scanning signal supplied to the second scan line 45. The term "complement to each other" denotes a situation where, when the second transistor 32 is in the ON-state, the third transistor 33 is in the OFF-state, whereas, when the second transistor 32 is in the OFF-state, the third transistor 33 is in the ON-state. The term "almost complement to each other" denotes a situation where, when the second transistor 32 switches from the OFF-state to the ON-state, the third transistor 33 is already in the OFF-state or, when the second transistor 32 switches from the OFF-state to the ON-state, the third transistor 33 switches from the ON-state to the OFF-state. In other words, when the second transistor 32 switches to the ON-state, the third transistor 33 is not in the ON-state.

A method for controlling, in the pixel circuit 41 according to Example 1, the second transistor 32, the third transistor 33, and the fourth transistor 34, for writing or rewriting an image signal onto the memory circuit 60, and for allowing or disallowing the light emitting element 20 to emit light will be described below.

In Example 1, the first scan line 42, the second scan line 45, and the enable line 44 are independent of each other for each of the pixel circuits 41, and thus the second transistor 32, the third transistor 33, and the fourth transistor 34 operate while being independent of each other. The second transistor 32 and the third transistor 33 operate to almost complement to each other. As a result, it can be achieved that, when the second transistor 32 switches to the ON-state, the third transistor 33 is not in the ON-state. It can also be achieved that, when the second transistor 32 switches to the ON-state, the fourth transistor 34 is always in the OFF-state.

When an image signal is written or rewritten onto the memory circuit 60, the inactive signal causes the fourth transistor 34 to switch to the OFF-state. As the selection signal causes the second transistor 32 to switch to the ON-state, the image signal is supplied to the first inverter 61 and the second inverter 62 constituting the memory circuit 60. The image signal is written from the data line 43 onto the first inverter 61, and then from the first inverter 61 onto the second inverter 62.

With the non-retention signal of the second scanning signal, when the second transistor 32 switches from the OFF-state to the ON-state, the third transistor 33 is already in the OFF-state or, when the second transistor 32 switches from the OFF-state to the ON-state, the third transistor 33 switches from the ON-state to the OFF-state. Therefore, when the second transistor 32 switches to the ON-state, the third transistor 33 is not in the ON-state, and the electrical connection between the output terminal 27 of the second inverter 62 and the input terminal 25 of the first inverter 61 is disconnected.

In order to clarify the advantages of the current invention we consider an imaginary circuit where the third transistor 33 is not present and the output terminal 27 of the second inverter 62 and the input terminal 25 of the first inverter 61 are always electrically connected to each other. When rewriting from Low (VSS) to High (VDD1) takes place at the input terminal 25 of the first inverter 61, before a High signal is supplied, the potential of the input terminal 25 of the first inverter 61 is Low, i.e., the potential of the input terminal 28 of the second inverter 62 is High, and the eighth transistor 38 is in the ON-state in the imaginary circuit. Therefore, when the second transistor 32 switches to the ON-state and a High (VDD1) signal is supplied from the data line 43, a route from the data line 43 (VDD1), via the second transistor 32 and the eighth transistor 38, to the low potential line 46 (VSS) attains a conduction state, leading to such an undesirable event that rewriting of potential from Low to High at the input terminal 25 takes a certain time, or no rewriting takes place in the imaginary circuit.

Since the third transistor 33 is not present in the imaginary circuit, when rewriting from High (VDD1) to Low (VSS) takes place at the input terminal 25 of the first inverter 61, before a Low signal is supplied, the potential of the input terminal 28 of the second inverter 62 is Low, and the sixth transistor 36 is in the ON-state. Therefore, when the second transistor 32 switches to the ON-state and a Low (VSS) signal is supplied from the data line 43, a route from the high potential line 47 (VDD1), via the sixth transistor 36 and the second transistor 32, to the data line 43 (VSS) attains a conduction state, leading to such an undesirable event that rewriting of potential from High to Low at the input terminal 25 takes a certain time, or no rewriting takes place in the imaginary circuit.

By contrast in Example 1, when the second transistor 32 is switched to the ON-state and an image signal is written or rewritten onto the memory circuit 60, the third transistor 33 disposed between the input terminal 25 of the first inverter 61 and the output terminal 27 of the second inverter 62 is in the OFF-state, and the electric path between the input terminal 25 and the output terminal 27 is disconnected, suppressing such an undesirable event described above from occurring.

The fourth transistor 34 is in the OFF-state while the second transistor 32 is in the ON-state. Thus, the light emitting element 20 does not emit light while an image signal is written to the memory circuit 60. That is, a route from the third potential line (high potential line 49), via the light emitting element 20 and the first transistor 31, to the second potential line (low potential line 46) is disconnected by the fourth transistor 34. In this way, when an image signal is written or rewritten onto the memory circuit 60, the light emitting element 20 is stopping light from emitting. Therefore, effects of light emission from the light emitting element 20 within this period can be avoided. Even when the display period P2-1 of SF1 is set to an extremely short period, collect gray-scales can be expressed.

Note that, when an image signal is written or rewritten onto the memory circuit 60, the image signal is written from the data line 43 onto the first inverter 61, and then a complementary signal representing a reverse signal to the image signal is written from the first inverter 61 onto the second inverter 62. Therefore, neither a complementary data line configured to supply a complementary signal nor a complementary transistor to the second transistor 32 are necessary, compared with a case where, in parallel to writing an image signal from the data line 43 onto the first inverter 61, a complementary signal representing a complementary image signal to a signal supplied to the data line 43 is written from the complementary data line onto the second inverter 62. Therefore, compared with a configuration including a complementary data line and a complementary transistor, the fine pixel 59 with high resolution can be easily achieved, and no further wires are required, improving a production yield. Further, as will be described later in detail, in the configuration according to the present exemplary embodiment, no current route from the data line 43 to the power supply line (the first potential line 47 and the second potential line 46) is present when writing an image signal, compared with a case where, in parallel to writing an image signal from the data line 43 onto the first inverter 61, a complementary image signal to a signal supplied to the data line 43 is written from a complementary data line onto the second inverter 62, achieving prompt rewriting of the image signal at low power consumption.

When the non-selection signal causes the second transistor 32 to switch from the ON-state to the OFF-state, writing or rewriting of an image signal onto the memory circuit 60 stops. When the second scanning signal causes the second transistor 32 to switch from the ON-state to the OFF-state, the third transistor 33 is already in the ON-state or, when the second scanning signal causes the second transistor 32 to switch from the ON-state to the OFF-state, the third transistor 33 switches from the OFF-state to the ON-state.

In this way, the output terminal 27 of the second inverter 62 and the input terminal 25 of the first inverter 61 are electrically connected to each other, and an image signal written onto the memory circuit 60 is retained between the first inverter 61 and the second inverter 62. Until the active signal is supplied, the fourth transistor 34 stays in the OFF-state and the light emitting element 20 does not emit light. The second scan line 45 is supplied with the retention signal until the non-retention signal for a next subfield enters, allowing an image signal stored in the memory circuit 60 to be stably retained without being erroneously rewritten.

After that, when the light emitting element 20 is caused to emit light, the active signal is used to turn the fourth transistor 34 into the ON-state while the second transistor 32 is kept in the OFF-state, i.e., while the third transistor 33 is kept in the ON-state. When an image signal stored in the memory circuit 60 causes the first transistor 31 to be in the ON-state at this time, a current flows into a route from the third potential line (high potential line 49), via the fourth transistor 34, the light emitting element 20, and the first transistor 31, to the second potential line (low potential line 46), and the light emitting element 20 emits light.

When the fourth transistor 34 is in the ON-state, the second transistor 32 is in the OFF-state and the third transistor 33 is in the ON-state. Therefore even while the light emitting element 20 is caused to emit light, an image signal stored in the memory circuit 60 is retained without being rewritten. In this way, high-quality image display without false display can be achieved.

Relationship between Each Potential and Threshold Voltage of Transistor

As described above, in the present exemplary embodiment, the first potential (VDD1) and the second potential (VSS) constitute the low-voltage power-supply, and the third potential (VDD2) and the second potential (VSS) constitute the high-voltage power-supply. With such a configuration, the electro-optical device 10 that operates at a high speed and achieves bright state is achieved. This point will be described below.

In the following description, the first potential is expressed as V1, the second potential is expressed as V2, and the third potential is expressed as V3. In the present exemplary embodiment, the potential difference V1–V2 of the first potential V1 with respect to the second potential V2 represents the voltage of the low-voltage power-supply. The potential difference V3–V2 of the third potential V3 with respect to the second potential V2 represents the voltage of the high-voltage power-supply. The potential difference V1–V2 is smaller than the potential difference V3–V2, namely V1–V2<V3–V2. As an example, V1=3.0 V, V2=0 V, V3=7.0 V, resulting in V1–V2=3.0 V and V3–V2=7.0 V.

With each of the potentials being set as described above, the low-voltage power-supply supplied with the first potential and the second potential causes the drive circuit 51 and the memory circuit 60 to operate, such that the drive circuit 51 and the memory circuit 60 can be operated at high speed by making transistors constituting the drive circuit 51 and the memory circuit 60 small. On the other hand, the high-voltage power-supply supplied with the second potential and the third potential causes the light emitting element 20 to emit light, such that the emission luminance of the light emitting element 20 can be increased. In other words, the configuration of the present exemplary embodiment enables each of the circuits to operate at a high speed and can achieve the electro-optical device 10 in which the light emitting element 20 emits light at high luminance to provide bright state.

The light emitting element such as an organic EL element generally requires a relatively high voltage (for example, 5 V or higher) to emit light. However, in a semiconductor device, increasing the supply voltage necessitates increasing the gate length L and the gate width W of transistors in order to prevent operational failures. As a result, the operation of circuits becomes slow. On the other hand, decreasing the supply voltage in order to operate circuits at high speeds leads to a decrease in luminance of the light emitting element. In other words, in a typical configuration in which the supply voltage used for emission of the light emitting element and the supply voltage used to operate circuits are identical, it is difficult to achieve both high luminance emission of the light emitting element and high-speed operation of the circuits.

In contrast, the present exemplary embodiment uses a low-voltage power-supply and a high-voltage power-supply as the power supplies for the electro-optical device 10 and a low-voltage power-supply as the power supply for the operation of the drive circuit 51 and the memory circuit 60. In this way, the size of each of the transistors constituting the drive circuit 51 and the memory circuit 60 can be decreased to as small as L=approximately 0.5 micrometer (m), which is smaller than L=approximately 0.75 micrometer (m) of the first transistor 31 and the fourth transistor 34, and these circuits are driven at a low voltage of V1–V2=3.0 V. This allows high speed operation of the drive circuit 51 and the memory circuit 60.

Also, the high-voltage power-supply causes the light emitting element 20 to emit light at a high voltage of V3–V2=7.0 V, allowing the light emitting element 20 to emit light at high luminance. Furthermore, as will be described later, the first transistor 31 and the fourth transistor 34 disposed in series with the light emitting element 20 are linearly operated, such that most of a high voltage of V3–V2=7.0 V can be applied to the light emitting element 20. This further increases the luminance of light emitted by the light emitting element 20.

In the present exemplary embodiment, a threshold voltage ($V_{th1}$) of the N-type first transistor 31 serving as a driving transistor is positive ($0<V_{th1}$). When an image signal stored in the memory circuit 60 corresponds to non-emission, the potential of the output terminal 27 in the memory circuit 60 is Low, i.e., the second potential (V2). The source of the first transistor 31 is connected to the second potential line (low potential line 46). Therefore, the source potential and a gate potential of the first transistor 31 are both the second potential (V2). As a result, a gate-source voltage $V_{gs1}$ of the first transistor 31 is 0 V.

Therefore, with the threshold voltage $V_{th1}$ (as one example, $V_{th1}$=0.36 V) of the first transistor 31 being positive ($0<V_{th1}$), the gate-source voltage $V_{gs1}$ of the N-type first transistor 31 becomes smaller than the threshold voltage $V_{th1}$ and the first transistor 31 switches to the OFF-state. In this way, the first transistor 31 can be reliably placed in the OFF-state when the image signal represents non-emission.

In the present exemplary embodiment, the potential difference between the first potential (V1) and the second potential (V2) is greater than the threshold voltage $V_{th1}$ of the first transistor 31 ($V_{th1}<V1-V2$). When an image signal stored in the memory circuit 60 corresponds to emission, the potential of the output terminal 27 in the memory circuit 60 is High. With High being the first potential (V1), the gate-source voltage $V_{gs1}$ of the first transistor 31 is equal to the potential difference between the first potential (V1) and the second potential (V2) ($V_{gs1}=V1-V2=3.0$ V$-0$ V$=3.0$ V).

If the potential difference between the first potential (V1) and the second potential (V2) (V1$-$V2=3.0 V) is greater than the threshold voltage $V_{th1}$ ($V_{th1}=0.36$ V) of the first transistor 31 ($V_{th1}<V1-V2$), the gate-source voltage $V_{gs1}$ of the N-type first transistor 31 becomes greater than the threshold voltage $V_{th1}$ when the potential of the output terminal 27 in the memory circuit 60 is High. As a result, the first transistor 31 is brought into the ON-state. Thus, the first transistor 31 can be reliably placed in the ON-state when the image signal represents emission.

Whether, with respect to the first potential (VDD1) and the second potential (VSS) constituting the low-voltage power-supply, the third potential (in the present example, VDD2) constituting the high-voltage power-supply is set to a higher potential than the first potential (VDD1) (the present example) or set to a lower potential than the second potential (VSS) (for example, a lower potential than VSS, i.e., VSS2) is determined in accordance with the polarity of the first transistor 31. Specifically, when the first transistor 31 is the N-type, the third potential is set to a higher potential than VDD1, i.e., VDD2, as described in the present example. In contrast, as described in Example 5 (see FIG. 20), when a first transistor 31A is the P-type, the third potential is set to a lower potential than VSS1, i.e., VSS2. The source of the first transistor 31 (the present example, FIG. 8) and a source of the first transistor 31A (Example 5, FIG. 20) are electrically connected to the second potential. The second potential is shared with the low-voltage power-supply. The third potential serves as a drain-side power supply. With the configuration described above, the source potential being the low-voltage power-supply allows the first transistor 31 (the present example, FIG. 8) and the first transistor 31A (Example 5, FIG. 20) to perform on-off switching operation between the first potential and the second potential, similar to single-conductive-type transistors constituting the memory circuit 60, such as the seventh transistor 37 and the eighth transistor 38 in the present example and the fifth transistor 35 and the sixth transistor 36 in Example 5. On the other hand, when the drain of the first transistor 31 and a drain of the first transistor 31A share the low-voltage power-supply, and the source potential differs from a source potential of a single-conductive-type transistor constituting the memory circuit 60, the first transistor 31 and the first transistor 31A are always in the ON-state, leading to such an undesirable event that no switching operation takes place. To avoid such an undesirable event described above, and to allow the first transistor 31 and the first transistor 31A to perform normal switching operation, when the first transistor 31 is the N-type, the third potential is set to a higher potential than VDD1, i.e., VDD2, whereas, when the first transistor 31A is the P-type, the third potential is set to a lower potential than VSS1, i.e., VSS2.

The fourth transistor 34 serving as a control transistor is brought into the OFF-state when supplied with the inactive signal as the control signal from the enable line 44 electrically connected to the gate, and into the ON-state when supplied with the active signal. In the present exemplary embodiment (Example 1), the fourth transistor 34 is the P-type. As described above, the inactive signal is set to a high potential equal to or above the third potential (V3), and may preferably be set to the third potential (V3). The active signal is set to a low potential equal to or below V3$-$(V1$-$V2), and may preferably be set to the second potential (V2).

When the inactive signal at the third potential (V3) is supplied from the enable line 44 to the gate of the fourth transistor 34, both of the source potential and the gate potential of the fourth transistor 34 become the third potential (V3) and a gate-source voltage $V_{gs4}$ of the fourth transistor 34 becomes 0 V. With a threshold voltage $V_{th4}$ of the P-type fourth transistor 34 (as one example, $V_{th4}=-0.36$ V), the gate-source voltage $V_{gs4}$ of the fourth transistor 34 becomes greater than the threshold voltage $V_{th4}$ and the fourth transistor 34 switches to the OFF-state. Thus, the fourth transistor 34 can be reliably placed in the OFF-state when the control signal is the inactive signal.

When the active signal at a potential of V3$-$(V1$-$V2) or lower, i.e., 7.0 V$-$(3.0 V$-0$ V)$=4.0$ V or lower, is supplied from the enable line 44, the gate-source voltage $V_{gs4}$ of the fourth transistor 34 becomes 4.0$-$7.0 V$=-3.0$ V or lower. Therefore, the gate-source voltage $V_{gs4}$ of the fourth transistor 34 is sufficiently lower than the threshold voltage $V_{th4}$ and the fourth transistor 34 can be reliably placed in the ON-state when the control signal is the active signal.

As the potential of the active signal lowers, the gate-source voltage $V_{gs4}$ of the fourth transistor 34 increases. When the potential of the active signal is set to the second potential (V2), the gate-source voltage $V_{gs4}$ of the fourth transistor 34 becomes 0 V$-7.0$ V$=-7.0$ V, and an ON-resistance of the fourth transistor 34 being in the ON-state lowers. As a result, when the light emitting element 20 is allowed to emit light, negative effects of variations in threshold voltage of the fourth transistor 34 would be less likely to exhibited.

Among the existing three potentials, i.e., the first potential, the second potential, and the third potential, by setting the highest potential, i.e., the third potential (V3), as the potential of the inactive signal, whereas by setting the lowest potential, i.e., the second potential (V2), as the potential of the active signal, the potentials of the inactive signal and the active signal can be set without providing a potential line configured to supply a new potential. With the active signal, an absolute value of the gate-source voltage of the fourth transistor 34 can be fully increased. By fully lowering the ON-resistance of the fourth transistor 34 being in the ON-state, negative effects to the emission luminance of the light emitting element due to variations in threshold voltage of the fourth transistor 34 can be almost negligible.

In other words, the configuration of the present exemplary embodiment can ensure that the first transistor 31 and the fourth transistor 34 are placed into the OFF-state when the light emitting element 20 is to be in the non-emission state to ensure the non-emission state, and the first transistor 31 and the fourth transistor 34 are placed into the ON-state when the light emitting element 20 is to be in the emission state to ensure the emission state, even with two different electrical systems of the low-voltage power-supply and the high-voltage power-supply.

The second transistor 32 serving as a selection transistor is brought into the OFF-state when supplied with the non-selection signal as the scanning signal from the first scan line 42 electrically connected to the gate, and into the ON-state when supplied with the selection signal. In the present exemplary embodiment, the second transistor 32 is the N-type. As described above, the potential of the non-selection signal, i.e., the fifth potential (V5), is set to a low potential equal to or below the second potential (V2), and may preferably be set to the second potential (V2). The potential of the selection signal, i.e., the fourth potential (V4), is set to a high potential equal to or above the first potential (V1), and may preferably be set to the third potential (V3).

The first transistor 31 and the second transistor 32 may preferably be an identical polarity. In Example 1, the first transistor 31 and the second transistor 32 are both the N-type. Therefore, the first transistor 31 is brought into the ON-state when the potential of an image signal supplied to the gate is High, whereas the second transistor 32 is brought into the ON-state when the scanning signal supplied to the gate is the selection signal, i.e., High. The first transistor 31 is the N-type. Therefore, as described above, in the present example, the third potential (V3) becomes a higher potential than the first potential (VDD1), i.e., VDD2. The reason is that, although High of the image signal is the first potential (V1), High serving as the selection signal is set to the first potential (V1) or higher, and may be set to the third potential (V3=VDD2).

A case where the potential of the selection signal is set to the third potential (V3), and an image signal of the memory circuit 60 is rewritten from Low to High will be described. The input terminal 25 of the first inverter 61 is electrically connected with either of the source and the drain of the second transistor 32. Before an image signal is rewritten, the potential of the input terminal 25 is Low, i.e., the second potential (V2). When the selection signal at the third potential (V3) is supplied from the first scan line 42 to the gate of the second transistor 32, a gate-source voltage $V_{gs2}$ of the second transistor 32 becomes V3–V2=7.0 V–0 V=7.0 V, which is higher than a threshold voltage $V_{th2}$ of the second transistor 32 (as one example, $V_{th2}$=0.36 V), turning the second transistor 32 into the ON-state.

As an image signal at High (V1) is written from the data line 43 onto the memory circuit 60, the potential of the input terminal 25 of the first inverter 61 gradually increases from Low (V2) to High (V1). Along with this, the gate-source voltage $V_{gs2}$ of the second transistor 32 gradually decreases to V3–V1=7.0 V–3.0 V=4.0 V. Even when the gate-source voltage $V_{gs2}$ of the second transistor 32 reaches a minimum value of 4.0 V, the gate-source voltage $V_{gs2}$ is still sufficiently higher than the threshold voltage $V_{th2}$ of the second transistor 32. Therefore, until the image signal is written onto the memory circuit 60, an ON-resistance of the second transistor 32 is retained to low, allowing the image signal to be reliably written onto the memory circuit 60.

Here, a case where the second transistor 32 is opposite in characteristic to the first transistor 31, i.e., a case when a P-type second transistor 32A is used, is assumed. In this case, the second transistor 32A is brought into the ON-state when the selection signal is Low. When the potential of the selection signal is set to the second potential (V2) and an image signal in the memory circuit 60 is rewritten from High to Low, and when the selection signal at the second potential (V2) is supplied from the first scan line 42, the gate-source voltage $V_{gs2}$ of the second transistor 32A becomes V2–V1=0 V–3.0 V=–3.0 V, which is lower than the threshold voltage $V_{th2}$ of the second transistor 32A (as one example, $V_{th2}$=–0.36 V), turning the second transistor 32A into the ON-state.

When an image signal at Low (V2) is written from the data line 43 onto the memory circuit 60, the potential of the input terminal 25 of the first inverter 61 gradually decreases from High (V1). Along with this, the gate-source voltage $V_{gs2}$ of the second transistor 32A gradually increases from –3.0 V, and, before the potential of the input terminal 25 reaches the second potential (V2), the potential reaches the threshold voltage $V_{th2}$ of the P-type second transistor 32A, turning the second transistor 32A into the OFF-state.

Before the second transistor 32A is brought into the OFF-state, as the gate-source voltage $V_{gs2}$ increases and approaches the threshold voltage $V_{th2}$, an ON-resistance of the second transistor 32A increases, leading to such an undesirable event that rewriting of an image signal onto the memory circuit 60 takes a certain time or fails. To avoid this, the potential of the selection signal should be set to a lower potential. In this case, however, a potential line configured to supply a potential different from the existing potentials is further required.

As described in Example 1, when the first transistor 31 and the second transistor 32 are both an identical polarity, such as the N-type, the potential of the selection signal can be set, without providing a new potential line, to the third potential that is highest between the first potential and the third potential. When the second transistor 32 is brought into the ON-state and an image signal is written onto the memory circuit 60, the gate-source voltage $V_{gs2}$ of the second transistor 32 can be increased, allowing the ON-resistance of the second transistor 32 to be kept low even when the source potential increases as the image signal is written. In this way, an image signal can be promptly and securely written and rewritten onto the memory circuit 60.

Similarly, the third transistor 33 may preferably be identical in conductive type, i.e., N-type, to the first transistor 31 and the second transistor 32. The third transistor 33 is brought into the OFF-state when supplied with the non-retention signal from the second scan line 45 electrically connected to the gate, and into the ON-state when supplied with the retention signal. As the third transistor 33 is also the N-type, as described above, the seventh potential (V7) representing the potential of the non-retention signal is set to a low potential equal to or below the second potential (V2), and may preferably be set to the second potential (V2). The sixth potential (V4) representing the potential of the retention signal is set to a high potential equal to or above the first potential (V1) or higher, and may preferably be set to the third potential (V3).

When the retention signal at the third potential (V3) is supplied from the second scan line 45 to the gate of the third transistor 33, a gate-source voltage $V_{gs3}$ of the third transistor 33 becomes V3–V2=7.0 V–0 V=7.0 V, which is higher than a threshold voltage $V_{th3}$ of the third transistor 33 (as one example, $V_{th3}$=0.36 V), turning the third transistor 33 into the ON-state. The gate-source voltage $V_{gs3}$ is sufficiently higher than the threshold voltage $V_{th3}$ of the third transistor 33. An ON-resistance of the third transistor 33 is retained to low. The image signal written onto the memory circuit 60 can be securely retained between the first inverter 61 and the second inverter 62.

That is, when the first transistor 31 serving as a driving transistor is the N-type, the third potential (V3) to be newly added to constitute the high-voltage power-supply may preferably be higher than the first potential (V1=VDD1), i.e., V3=VDD2. The second transistor 32 and the third transistor 33 may preferably be identical in conductive type, i.e., the N-type, to the first transistor 31. In this way, by using the third potential (V3=VDD2) for the gate potential of the second transistor 32 and the gate potential of the third transistor 33 to fully increase the gate-source voltages $V_{gs2}$ and $V_{gs3}$ of the transistors 32 and 33 to be respectively higher than the threshold voltages $V_{th2}$ and $V_{th3}$, the ON-resistances of the transistors 32 and 33 being in the ON-state can be lowered.

From the above-described results, preferred relationships between each of the potentials (V1, V2, and V3) and the threshold voltage ($V_{th1}$) of the first transistor 31 in the present exemplary embodiment can be derived and expressed by Expression 2 and Expression 3 below:

[Expression 2]

$$0 < Vth1 \quad (2)$$

[Expression 3]

$$V2 + Vth1 < V1 < V3 \quad (3)$$

Characteristic of Transistor

Next, characteristics of a transistor provided in the electro-optical device 10 according to the present exemplary embodiment will be described. In the electro-optical device 10 according to the present exemplary embodiment, the first transistor 31 and the fourth transistor 34 are disposed in series with the light emitting element 20, between the third potential line (high potential line 49) and the second potential line (low potential line 46) constituting the high-voltage power-supply. An ON-resistance of the first transistor 31 may be sufficiently lower than an ON-resistance of the light emitting element 20. The ON-resistance of the fourth transistor 34 may also preferably be sufficiently lower than the ON-resistance of the light emitting element 20.

The expression "sufficiently low" refers to a drive condition in which the first transistor 31 and the fourth transistor 34 operate in a linear fashion and, specifically, to a state in which the ON-resistances of the first transistor 31 and the fourth transistor 34 are respectively less than or equal to 1/100, preferably less than or equal to 1/1000 of the ON-resistance of the light emitting element 20. In this way, the first transistor 31 and the fourth transistor 34 can be linearly operated when the light emitting element 20 emits light.

As a result, most of the potential drop occurring in the first transistor 31, the fourth transistor 34, and the light emitting element 20 arranged in series applies to the light emitting element 20, such that the light emitting element 20 becomes less susceptible to variation in the threshold voltages of both of the transistors 31 and 34 during emission. In other words, most of the potential difference between the third potential and the second potential representing the voltage of the high-voltage power-supply applies to the light emitting element 20. Thus, the light emitting element 20 becomes less susceptible to variation in the threshold voltages of both of the transistors 31 and 34 during emission. In other words, such a configuration can reduce the effect of variation in the threshold voltages of the first transistor 31 and the fourth transistor 34 and can thus minimize the variations in brightness and shift in gray-scale between the pixels 59, i.e., the sub-pixels 58. As a result, an image display with excellent uniformity can be achieved.

This is because the potential drop across the both of the transistors 31 and 34 can be made 1% or less of the power supply voltage with 99% of the power supply voltage being received by the light emitting element 20 by making each of the ON-resistances of the first transistor 31 and the fourth transistor 34 1/100 or less of that of the light emitting element 20. Since the potential drop across both of the transistors 31 and 34 can be as small as 1% or less, the effect of variation in the threshold voltages of both of the transistors 31 and 34 on the emission characteristic of the light emitting element 20 can be reduced.

In the present exemplary embodiment (Example 1), the series resistance of the first transistor 31 and the fourth transistor 34 is approximately 1/1000 of the ON-resistance of the light emitting element 20. In this case, since the light emitting element 20 receives approximately 99.9% of a power supply voltage and the potential drop across both of the transistors 31 and 34 is approximately 0.1%, the effect of variation in the threshold voltages of both of the transistors 31 and 34 on the emission characteristic of the light emitting element 20 is almost negligible.

The ON-resistance of a transistor depends on the polarity, gate length, gate width, threshold voltage, gate-insulating-film thickness, and the like of the transistor. In the present exemplary embodiment, the polarity, gate length, gate width, threshold voltage, gate-insulating-film thickness, and other characteristics of both of the transistors 31 and 34 may preferably be determined in such a way that the ON-resistances of the first transistor 31 and the fourth transistor 34 are respectively sufficiently lower than the ON-resistance of the light emitting element 20. This point will be described below.

In the present exemplary embodiment, the organic EL element is used in the light emitting element 20, and the transistors such as the first transistor 31 and the fourth transistor 34 are formed on the element substrate 11 formed of a single-crystal silicon wafer. A voltage-current characteristic of the light emitting element 20 is roughly expressed by Expression 4 below:

[Expression 4]

$$I_{EL} = L_{EL} W_{EL} J_0 \left\{ \exp\left(\frac{V_{EL} - V_0}{V_{tm}}\right) - 1 \right\} \quad (4)$$

In Expression 4, $I_{EL}$ is a current flowing through the light emitting element 20, $V_{EL}$ is a voltage applied to the light emitting element 20, $L_{EL}$ is the length of the light emitting element 20 in a plan view, $W_{EL}$ is the width of the light emitting element 20 in the plan view, $J_0$ is a current density coefficient of the light emitting element 20, $V_{tm}$ is a coefficient voltage having a temperature dependence of the light emitting element 20, and $V_0$ is a threshold voltage of emission of the light emitting element 20. Here, the coefficient voltage $V_{tm}$ having a temperature dependence of the light emitting element 20 is a voltage under a constant temperature.

Note that, provided that the voltage of the high-voltage power supply is expressed as $V_P$ and the potential drop occurring across the first transistor 31 and the fourth transistor 34 is expressed as $V_{ds}$, then $V_{EL} + V_{ds} = V$. In the present exemplary embodiment, $L_{EL}=11$ micrometers (μm), $W_{EL}=3$ micrometers (μm), $J_0=1.449$ milliamperes per square centimeters (mA/cm$^2$), $V_0=3.0$ volts (V), and $V_{tm}=0.541$ volt (V).

On the other hand, when the first transistor 31 and the fourth transistor 34 are expressed as an i-th transistor (i is 1 or 4), a drain current $I_{dsi}$ of the i-th transistor is expressed by Expression 5 below:

[Expression 5]

$$I_{dsi} = \frac{W_i}{L_i} \cdot \frac{\varepsilon_0 \varepsilon_{ox}}{t_{oxi}} \cdot \mu_i (V_{gsi} - V_{thi}) V_{dsi} \equiv Z_i (V_{gsi} - V_{thi}) V_{dsi} \quad (5)$$

In Expression 5, $W_i$ is the gate width of the i-th transistor, $L_i$ is the gate length of the i-th transistor, $\varepsilon_0$ is the permittivity of vacuum, $\varepsilon_{ox}$ is the permittivity of a gate insulating film, $t_{oxi}$ is the thickness of the gate insulating film, $\mu_i$ is the mobility of the i-th transistor, $V_{gsi}$ is the gate voltage, $V_{dsi}$ is the drain voltage at a potential drop by the i-th transistor, and $V_{thi}$ is the threshold voltage of the i-th transistor.

In Example 1, $W_1$=1.0 micrometers (μm), $W_4$=1.25 micrometers (μm), $L_1$=$L_4$=0.75 micrometers (μm), $t_{ox}$=20 nanometers (nm), $\mu_1$=240 square centimeters per volt per second (cm²/V·s), $\mu_4$=150 square centimeters per volt per second (cm²/V·s), $V_{th1}$=0.36 V, $V_{th4}$=−0.36 V, $V_{gs1}$=V1−V2=3.0 V, and $V_{gs4}$=V2−V3=−7.0 V.

Note that, when the first transistor 31 and the fourth transistor 34 are linearly operated, the voltage-current characteristic of the light emitting element 20 approximates Expression 6 below around $V_{ds}$=0 V by using a potential drop $V_{ds}$ of both of the transistors 31 and 34:

[Expression 6]

$$I_{EL} = -kV_{ds} + I_0 \quad (6)$$

In Example 1, the coefficient k defined by Expression 6 is k=1.39×10⁻⁶ (Ω⁻¹). $I_0$ is the amount of current when all the voltage $V_P$ of the high-voltage power-supply applies to the light emitting element 20, and $I_0$=7.82×10⁻⁷ (A).

Given this, the voltage at which the light emitting element 20 emits light is a voltage that satisfies $I_{EL}$=$I_{ds}$ using Expressions 4 and 6. In the present exemplary embodiment, $V_P$=V3−V2=7.0 V, $V_{ds1}$=0.0053 V, $V_{ds4}$=0.0027 V, $V_{EL}$=6.9920 V, and $I_{EL}$=$I_{ds1}$=$I_{ds4}$=7.672×10⁻⁷ A. Upon this, the ON-resistance of the first transistor 31 was 6.859×10³Ω, the ON-resistance of the fourth transistor 34 was 3.491×10³Ω, and the ON-resistance of the light emitting element 20 was 9.113×10⁶Ω.

Therefore, the ON-resistance of the first transistor 31 was approximately 1/1300 of the ON-resistance of the light emitting element 20, which is lower than 1/1000, and the ON-resistance of the fourth transistor 34 was approximately 1/2600 of the ON-resistance of the light emitting element 20, which is lower than 1/1000. In this manner, most of the voltage of the high-voltage power-supply applies to the light emitting element 20.

Under this condition, even when the threshold voltage of the transistor varies 30% or more, $V_{EL}$=6.99 V and $I_{EL}$=$I_{ds1}$=$I_{ds4}$=7.67×10⁻⁷ A are invariable. Specifically, in Example 1, even when $V_{th1}$ and $V_{th4}$ vary between 0.29 V and 0.53 V, $V_{EL}$=6.99 V and $I_{EL}$=$I_{ds1}$=$I_{ds4}$=7.67×10⁻⁷ A are invariable. Typically, the threshold voltage of the transistor does not greatly vary in such a manner. Therefore, decreasing the ON-resistance of the fourth transistor 34 to approximately 1/1000 or below of the ON-resistance of the light emitting element 20 substantially eliminates the effect of variation in the threshold voltages of the first transistor 31 and the fourth transistor 34 on the emission luminance of the light emitting element 20.

By simultaneously solving Expression 5 and Expression 6 with $I_{EL}$=$I_{dsi}$, the effect of variation in the threshold voltage of the i-th transistor on the current $I_{EL}$=$I_{dsi}$ can be approximated by Expression 7 below:

[Expression 7]

$$\left(1 + \frac{k}{Z_i(V_{gsi} - V_{thi})}\right) I_{EL} = I_0 \quad (7)$$

Since $I_0$ is the amount of current when all the voltage $V_P$ of the high-voltage power-supply applies to the light emitting element 20, the gate voltage $V_{gsi}$ and $Z_i$ may be increased to cause the light emitting element 20 to emit light at a voltage around the power supply voltage $V_P$ as seen from Expression 7. In other words, the emission luminance of the light emitting element 20 becomes less susceptible to variation in the threshold voltage of a transistor as $Z_i$ increases.

Since $k/Z_1$=2.52×10⁻² V and $k/Z_4$=3.22×10⁻² V have small values in Example 1, the second term on the left side of Expression 7 is $k/(Z_1(V_{gs1}-V_{th1}))$=0.01 for the first transistor 31 and $k/(Z_4(V_{gs4}-V_{th4}))$=0.005 for the fourth transistor 34, and is thus less than approximately 0.01 (1%). As a result, the current that flows when the light emitting element 20 emits light (emission luminance) is hardly affected by the threshold voltages of both of the transistors 31 and 34. In other words, the effect of variation in the threshold voltages ($V_{th1}$ and $V_{th4}$) of both of the transistors 31 and 34 on the emission luminance of the light emitting element 20 can be substantially eliminated by setting the value of $k/(Z_i(V_{gsi}-V_{thi}))$ to be less than approximately 0.01 (1%).

In Expression 7, k and $Z_i$ are defined by Expressions 5 and 6. Note that, since a mobility $\mu_i$ in a P-type transistor is smaller than a mobility $\mu_i$ in an N-type transistor, W of the P-type transistor is set to be greater than W of the N-type transistor. In the present exemplary embodiment, $W_3$ of the P-type transistor is set to be greater than $W_1$ of the N-type transistor and $Z_4$ of the P-type fourth transistor 34 is set to be substantially identical to $Z_1$ of the N-type first transistor 31.

The gate voltage $V_{gsi}$ may preferably be as high as possible in order to cause the light emitting element 20 to emit light at a voltage around the power supply voltage $V_P$. In the present exemplary embodiment (Example 1), the gate-source voltage $V_{gs4}$ of the fourth transistor 34 is increased by setting the potential of the active signal representing the control signal in the active state to the second potential (V2) from. the third potential (V3) serving as the source potential of the fourth transistor 34.

In the present example, the gate width $W_1$ of the first transistor 31 disposed in series with the light emitting element 20 is greater than the gate width $W_3$ of the third transistor 33 included in the memory circuit 60. As one example, $W_1$=1.0 micrometers (μm) and $W_3$=0.5 micrometers (μm). Therefore, when the first transistor 31 switches to the ON-state and the light emitting element 20 emits light, a large current can flow into the light emitting element 20, improving the emission luminance of the light emitting element 20. The ON-resistance of the first transistor 31 being in the ON-state reduces at this time, suppressing variations in emission luminance due to variations in the threshold voltage of the first transistor 31 when the light emitting element 20 emits light. On the other hand, the third transistor 33 has a role of keeping smaller a potential difference between the output terminal 27 of the second inverter 62 and the input terminal 25 of the first inverter 61 while the light emitting element 20 is emitting light. Therefore, the third transistor 33 fully functions without requiring a large current, even when the gate width $W_3$ of the third transistor 33 is reduced shorter than the gate width $W_1$ of the first transistor. As described above, the memory circuit 60 stably retains an image signal, allowing a high-resolution, high-quality image to be displayed.

In the present example, the gate length $L_1$ of the first transistor 31 is longer than the gate length $L_3$ of the third transistor. As one example, $L_1$=0.75 micrometers (μm) and $L_3$=0.5 micrometers (μm). Therefore, a higher voltage than a voltage applied to the memory circuit 60 including the third transistor 33 can be applied to the light emitting element 20 disposed in series with the first transistor 31. Even when the high voltage is applied to the light emitting element 20 and the first transistor 31, the long gate length $L_1$ of the first transistor 31 can suppress a likelihood that the first transistor 31 is damaged by the high voltage. On the other hand, the gate length $L_3$ of the third transistor 33 included in the memory circuit 60 is shorter than the gate length $L_1$ of the first transistor 31, achieving the fine memory circuit 60 by reducing the third transistor 33 in size to be smaller than the first transistor 31. As a result, the memory circuit 60 can promptly operate, allowing the light emitting element 20 to emit light with the high voltage.

In the electro-optical device 10 according to the present exemplary embodiment, the fifth transistor 35 and the seventh transistor 37 constituting the first inverter 61 and the sixth transistor 36 and the eighth transistor 38 constituting the second inverter 62 included in the memory circuit 60 are disposed between the first potential line (high potential line 47) and the second potential line (low potential line 46) constituting the low-voltage power-supply.

The transistors 35, 36, 37, and 38 operating with the low-voltage power-supply are applied with a lower voltage than a voltage applied to the first transistor 31 and the fourth transistor 34 operating with the high-voltage power-supply. As a result, the gate lengths can be shortened and the gate widths can be reduced, reducing areas of channel forming regions. That is, the fine memory circuit 60 can be achieved. When the channel forming regions of the transistors 35, 36, 37, and 38 respectively have small areas, transistor capacities can be reduced, achieving prompt charging and discharging. That is, an image signal can be promptly written and rewritten onto the memory circuit 60.

In the present exemplary embodiment, the gate lengths, when viewed in a plan view, of the fifth transistor 35, the sixth transistor 36, the seventh transistor 37, and the eighth transistor 38 included in the memory circuit 60 are shorter than the gate lengths, when viewed in a plan view, of the first transistor 31 and the fourth transistor 34 disposed in series with the light emitting element 20.

The gate lengths, when viewed in a plan view, of the fifth transistor 35, the sixth transistor 36, the seventh transistor 37, and the eighth transistor 38 are: $L_5=L_6=L_7=L_8$=0.5 micrometers (μm). As described above, the gate lengths, when viewed in a plan view, of the first transistor 31 and the fourth transistor 34 are $L_1=L_4$=0.75 micrometers (μm). The gate lengths of the fifth transistor 35, the sixth transistor 36, the seventh transistor 37, and the eighth transistor 38 are shorter than the gate lengths of the first transistor 31 and the fourth transistor 34.

In the present exemplary embodiment, the areas of the channel forming regions, when viewed in a plan view, of the fifth transistor 35, the sixth transistor 36, the seventh transistor 37, and the eighth transistor 38 are smaller than the areas of the channel forming regions, when viewed in a plan view, of the first transistor 31 and the fourth transistor 34. An area of a channel forming region of a transistor is approximately identical to an area, i.e., a product of a gate length and a gate width, when viewed in a plan view, of a gate electrode disposed in a counter arrangement.

The gate widths of the N-type seventh transistor 37 and the N-type eighth transistor 38 are $W_7=W_8$=0.5 micrometers (μm), whereas the gate widths of the P-type fifth transistor 35 and the P-type sixth transistor 36 are $W_5=W_6$=0.75 micrometers (μm). Therefore, the areas of the channel forming regions of the seventh transistor 37 and the eighth transistor 38 are 0.5×0.5=0.25 square micrometers (μm$^2$), whereas the areas of the channel forming regions of the fifth transistor 35 and the sixth transistor 36 are 0.5×0.75=0.375 square micrometers (μm$^2$).

As described above, the gate width of the first transistor 31 is $W_1$=1.0 micrometers (μm), and thus the area of the channel forming region of the first transistor 31 is 0.75×1.0=0.75 square micrometers (μm$^2$). The gate width of the fourth transistor 34 is $W_4$=1.25 micrometers (μm), and thus the area of the channel forming region of the fourth transistor 34 is 0.75×1.25=0.9375 square micrometers (μm$^2$). Therefore, the areas of the channel forming regions of the fifth transistor 35, the sixth transistor 36, the seventh transistor 37, and the eighth transistor 38 are smaller than the areas of the channel forming regions of the first transistor 31 and the fourth transistor 34.

As described above, in the present exemplary embodiment, by reducing the areas of the channel forming regions of the transistors 35, 36, 37, and 38 included in the memory circuit 60 to be smaller than the areas of the channel forming regions of the transistors 31 and 34 disposed in series with the light emitting element 20, the fine memory circuit 60 can be achieved for prompt operation to allow the light emitting element 20 to emit light at high luminance.

Method for Driving Pixel Circuit

Figure 9:
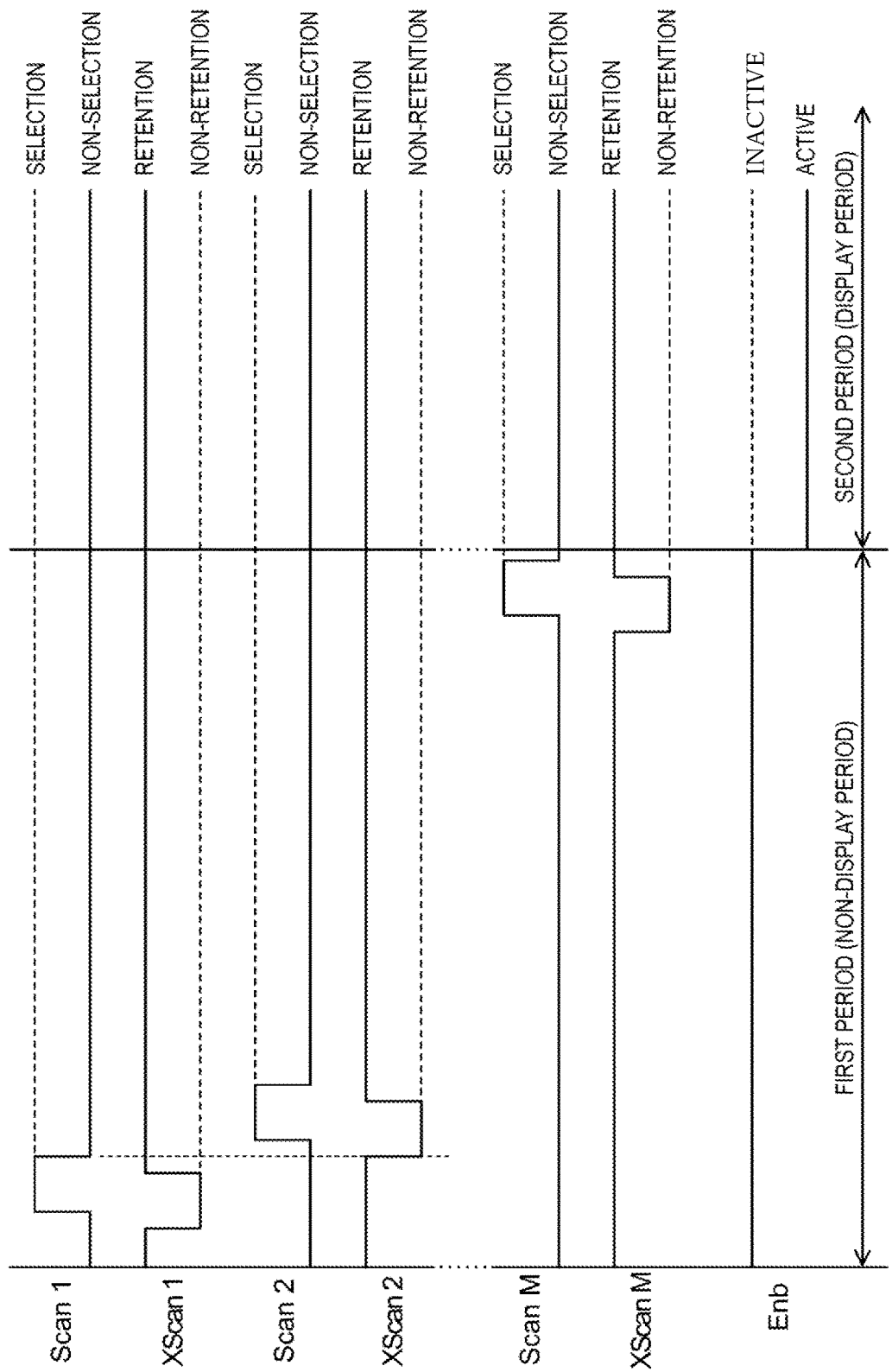
FIG. 9 is a diagram illustrating an example of a method for driving the pixel circuit according to the present exemplary embodiment.

Next, a method for driving a pixel circuit in the electro-optical device 10 according to the present exemplary embodiment will be described with reference to FIG. 9. FIG. 9 is a diagram illustrating an example of a method for driving the pixel circuit according to the present exemplary embodiment. In FIG. 9, the horizontal axis is a time axis and includes a first period representing a non-display period and a second period representing a display period. The first period is illustrated as P1-1 to P1-8 in FIG. 7, and corresponds to P1. The second period is illustrated as P2-1 to P2-8 in FIG. 7, and corresponds to P2.

In the vertical axis in FIG. 9, Scan 1 to Scan M represent the scanning signals supplied to the respective first scan lines 42 from the first row to the M-th row of the M first scan lines 42 (see FIG. 5). The scanning signal includes the selection signal representing the scanning signal in the selection state and the non-selection signal representing the scanning signal in the non-selection state. X Scan 1 to X Scan M represent the second scanning signals supplied to the respective second scan lines 45 from the first row to the M-th row of the M second scan lines 45 (see FIG. 5). The second scanning signal includes the retention signal representing the second scanning signal in the selection state and the non-retention signal representing the second scanning signal in the non-selection state. Enb represents a control signal supplied to the enable line 44 (see FIG. 5). The control signal includes the active signal representing the control signal in the active state and the inactive signal representing the control signal in the inactive state.

As described with reference to FIG. 7, one field (F) during which a single image is displayed is divided into a plurality of subfields (SFs), and each of the subfields (SFs) includes the first period representing the non-display period and the second period representing the display period starting after the first period ends. The first period is the signal-writing period during which an image signal is written to the memory circuit 60 (see FIG. 8) in each of the pixel circuits 41 (see FIG. 5) located in the display region E. The second period is a period during which the light emitting element 20 (see FIG. 8) can emit light in each of the pixel circuits 41 located in the display region E.

As illustrated in FIG. 9, in the electro-optical device 10 according to the present exemplary embodiment, the inactive signal is supplied as the control signal to all of the enable lines 44 during the first period. When the inactive signal is supplied to the enable lines 44, the fourth transistors 34 (see FIG. 8) are brought into the OFF-state, such that the light emitting elements 20 in all of the pixel circuits 41 located in the display region E are brought into a state of non-emission.

During the first period, the selection signal (High) is supplied as the scanning signal to any of the first scan lines 42 in each of the subfields (SFs). When the selection signal is supplied to the first scan line 42, the second transistor 32 (see FIG. 8) is brought from the OFF-state into the ON-state in the selected pixel circuit 41. In this way, an image signal is written from the data line 43 (see FIG. 8) onto the first inverter 61, and then from the first inverter 61 onto the second inverter 62 in the selected pixel circuit 41. In this way, the image signal is written to and stored in the memory circuit 60 in each pixel circuit 41 during the first period.

In Example 1, during the first period, the retention signal (High) is supplied as the second scanning signal to the second scan line 45 in each of the subfields (SFs) and the non-retention signal (Low) is supplied as the second scanning signal to the pixel circuit 41 selected when the selection signal is supplied to the first scan line 42. A pulse width of the selection signal and a pulse width of the non-retention signal are identical to each other. However, a timing of supplying the selection signal and a timing of supplying the non-retention signal differ from each other. That is, in the pixel circuit 41 to be selected, before the selection signal is supplied to the scan line 42, the non-retention signal is supplied to the second scan line 45.

Therefore, in the pixel circuit 41 to be selected based on the selection signal, before the second transistor 32 switches from the OFF-state to the ON-state, the non-retention signal causes the third transistor 33 (see FIG. 8) to switch from the ON-state to the OFF-state. In this way, the electrical connection between the output terminal 27 of the second inverter 62 and the input terminal 25 of the first inverter 61 is disconnected, allowing an image signal to be securely and promptly written or rewritten onto the memory circuit 60 in the pixel circuit 41 selected based on the selection signal.

Note that, before the non-retention signal is supplied to the second scan line 45, no selection signal will be supplied to the first scan line 42. If the second transistor 32 switches to the ON-state while the third transistor 33 is in the ON-state, the output terminal 27 of the second inverter 62 and the input terminal 25 of the first inverter 61 are electrically connected with each other, a state of which is similar to a state where the third transistor 33 is not present. Therefore, such an undesirable event would occur that rewriting an image signal onto the memory circuit 60 takes a certain time or no rewriting is carried out.

After an image signal is written or rewritten onto the memory circuit 60, the non-selection signal (Low) is supplied to the first scan line 42 in the selected pixel circuit 41. In Example 1, in the selected pixel circuit 41, before the non-selection signal is supplied to the first scan line 42, the retention signal (High) is supplied to the second scan line 45. Therefore, in the pixel circuit 41 selected based on the selection signal, before the second transistor 32 switches from the ON-state to the OFF-state, the third transistor 33 switches from the OFF-state to the ON-state. In this way, in the selected pixel circuit 41, the output terminal 27 of the second inverter 62 and the input terminal 25 of the first inverter 61 attain a conduction state, and the image signal written onto the memory circuit 60 is retained between the first inverter 61 and the second inverter 62.

During the second period, the active signal is supplied as the control signal to all of the enable lines 44. When the active signal is supplied to each of the enable lines 44, the fourth transistor 34 is brought into the ON-state, allowing each of the light emitting elements 20 in all of the pixel circuits 41 located in the display region E to emit light. During the second period, the non-selection signal for turning the second transistors 32 into the OFF-state is supplied as the scanning signal to all of the first scan lines 42. In this way, an image signal written in the subfield (SF) is maintained in the memory circuit 60 of each of the pixel circuits 41.

As described above, the first period representing the non-display period and the second period representing the display period can be controlled independently in the present exemplary embodiment, such that gray-scale display by digital time division driving can be achieved. As a result, the second period can be set to be shorter than the first period, such that display with higher gray-scale can be achieved.

Furthermore, the control signal supplied to the enable lines 44 can be shared among the plurality of pixel circuits 41, such that driving of the electro-optical device 10 can be facilitated. Specifically, in a case of digital driving without the first period, highly complicated driving is required to make the emission period shorter than one vertical period within which selection of each of the plurality of first scan lines 42 is completed. In contrast, the control signal supplied to the enable line 44 is shared among the plurality of pixel circuits 41 in the present exemplary embodiment, such that the electro-optical device 10 can be easily driven by simply setting the second period to be short even when some subfields (SFs) have an emission period shorter than one vertical period in which selection of all the first scan lines 42 is completed.

Figure 10:
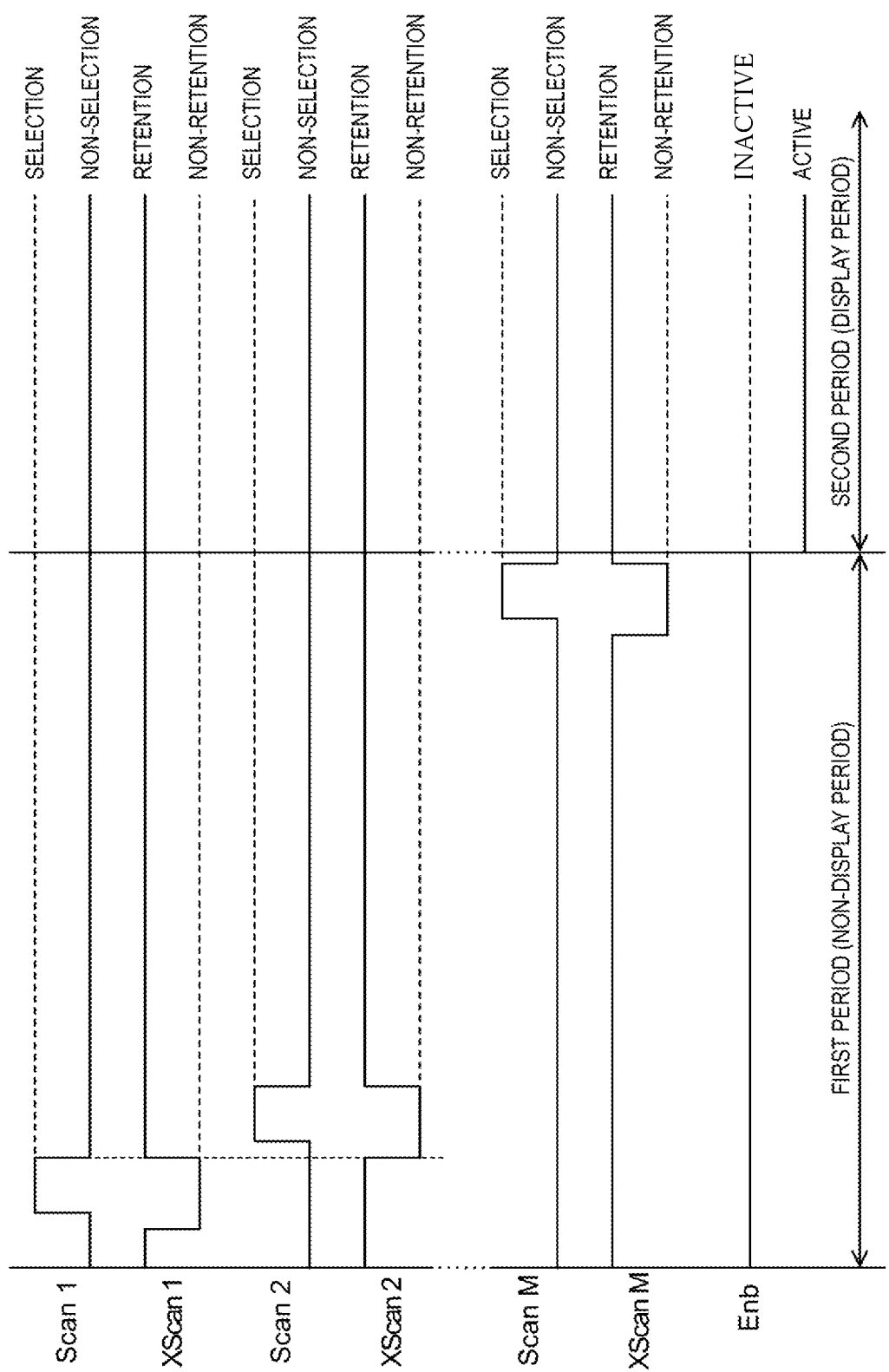
FIG. 10 is a diagram illustrating another example of the method for driving the pixel circuit according to the present exemplary embodiment.
Figure 11:
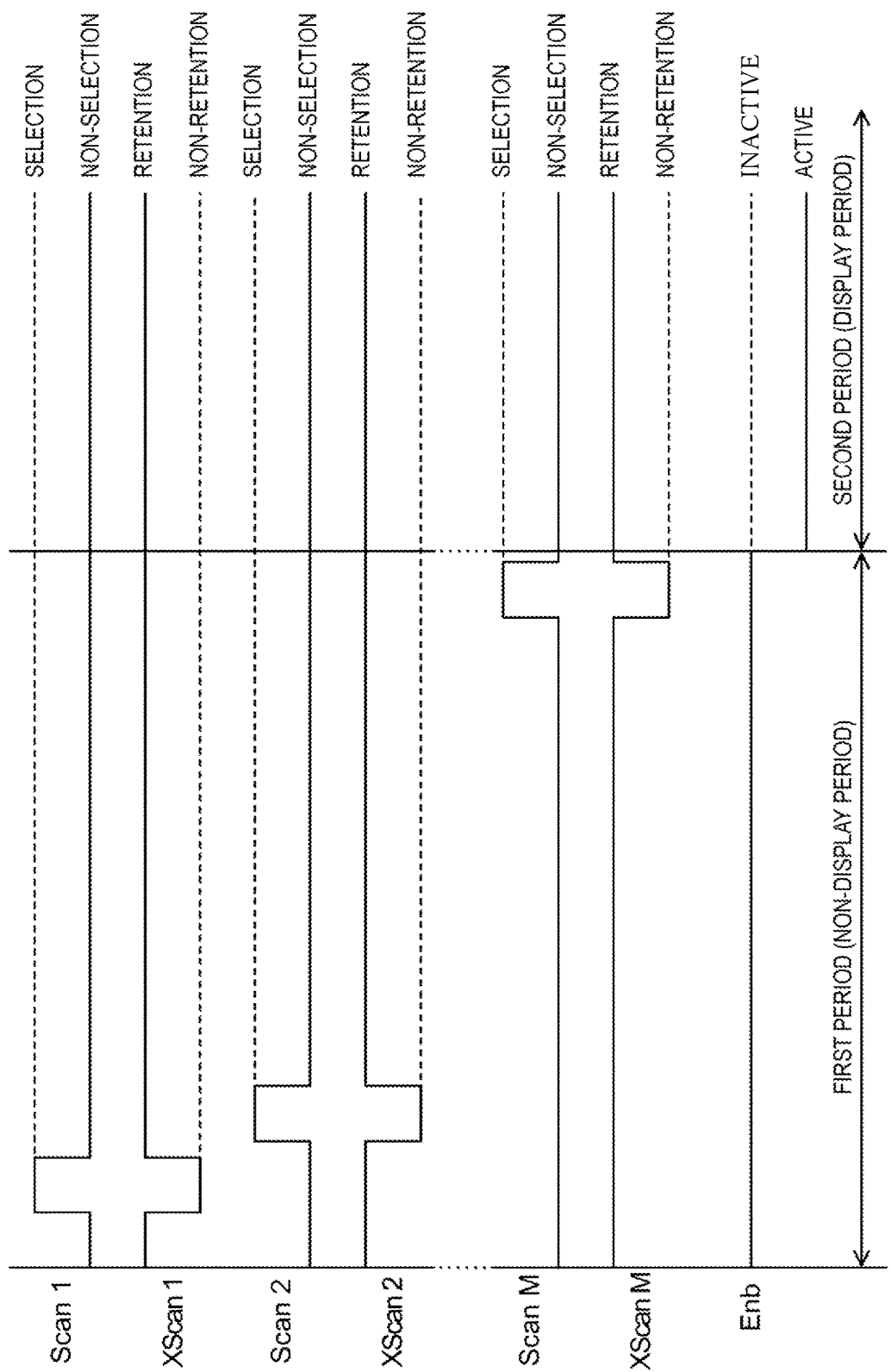
FIG. 11 is a diagram illustrating still another example of the method for driving the pixel circuit according to the present exemplary embodiment.

Note that, the method for driving the pixel circuit according to the present exemplary embodiment is not limited to the driving method illustrated in FIG. 9. FIGS. 10 and 11 are diagrams illustrating other examples of the method for driving the pixel circuit according to the present exemplary embodiment. For example, as illustrated in FIG. 10, the pulse width of the selection signal (High) and the pulse width of the non-retention signal (Low) may differ from each other, and, when the second transistor 32 switches from the ON-state to the OFF-state, the third transistor 33 may switch from the OFF-state to the ON-state.

As illustrated in FIG. 11, the pulse width of the selection signal (High) and the pulse width of the non-retention signal (Low) may be identical to each other, and, when the second transistor 32 switches from the OFF-state to the ON-state, the third transistor 33 may switch from the ON-state to the OFF-state, whereas, when the second transistor 32 switches from the ON-state to the OFF-state, the third transistor 33 may switch from the OFF-state to the ON-state.

Further, the pulse width of the non-retention signal (Low) may be longer than the pulse width of the selection signal (High), and, within and around a period when the second transistor 32 is placed in the ON-state, the third transistor 33 may be in the OFF-state. In this case, a period, after the second transistor 32 switches from the ON-state to the OFF-state, when the third transistor 33 is in the OFF-state is set to such a short period that an image signal retained based on the logic of the input terminal 25 of the first inverter 61 does not invert.

Here, as described above, in the present exemplary embodiment including Example 1, when an image signal is written onto the input terminal 25 of the first inverter 61, the third transistor 33 is in the OFF-state. Therefore, no current route is provided, since the data lines 43 and the power supply (VSS and VDD1) do not conduct with each other, and an image signal can be written or rewritten by charging the transistor capacities of the fifth transistor 35 and the seventh transistor 37 connected to the input terminal 25 of the first inverter 61. As a result, an image signal can be promptly written onto the input terminal 25 of the first inverter 61 within a short period of time. Next, this point will be described below.

A transistor capacity $C_P$ of the P-type fifth transistor 35 is $C_P=6.47\times10^{-16}$ farads (F) and a transistor capacity $C_N$ of the N-type seventh transistor 37 is $C_N=4.31\times10^{-16}$ farads. A total transistor capacity $C_{Tr}$ of the input terminal 25 of the first inverter 61 is CTr=$1.079\times10^{-15}$ farads. In the present exemplary embodiment, the selection signal has a high potential of V4=V3=7.0 V. The ON-resistance of the second transistor 32 being in the ON-state is thus extremely low. An on-current $I_{ds2}$ passing through the second transistor 32 is $I_{ds2}$=$4.13\times10^{-4}$ amperes (A). Therefore, a time τ1 required to write an image signal, via the second transistor 32, onto the input terminal 25 of the first inverter 61 can be obtained by Expression 8 below, and is τ1=$C_{Tr}\times V/I_{ds2}$=$3.92\times10^{-12}$ seconds:

[Expression 8]

$$\tau_1 = \frac{C_{Tr}V}{I_{ds}} \quad (8)$$

In Expression 8, V is a logically-inverted voltage of the first inverter 61, and is (V1+V2)/2=1.5 V. As described above, in the present exemplary embodiment, when an image signal is written or rewritten, the third transistor 33 switches to the OFF-state. The selection signal has a high potential of V4=V3=7.0 V, allowing the image signal to be written or rewritten within an extremely short period of time of approximately 4 picoseconds.

On the other hand, when a rewriting time for the input terminal 28 of the second inverter 62 is calculated in a similar manner, an on-current of the fifth transistor 35 is slightly lower than an on-current of the seventh transistor 37, extending a time of rewriting via the fifth transistor 35. That is, rewriting from Low to High at the input terminal 28 of the second inverter 62 requires more time than a time for rewriting from High to Low at the input terminal 28 of the second inverter 62. In this case, as the on-current $I_{ds5}$ of the fifth transistor 35 is approximately $I_{ds5}$=$1.54\times10^{-6}$ amperes, a time τ2 required to write an image signal onto the input terminal 28 of the second inverter 62 is τ2=CTr×V/$I_{ds5}$=$1.05\times10^{-11}$ seconds.

As a result, a period, after the third transistor 33 is brought into the OFF-state, when the second transistor 32 is in the ON-state, i.e., a period when the first scan line 42 accepts the selection signal and the second scan line 45 accepts the non-retention signal, is set to twice of τ1 by taking into account a margin, i.e., approximately 8 picoseconds, achieving an enough period. Further, a time from when the scanning signal (Scan) attains High to when the second scanning signal (X Scan) attains High is 4 (picoseconds)× 2+10.5 (picoseconds)×2=29 (picoseconds). An enough time is approximately 30 (picoseconds). In the present exemplary embodiment, the scanning signal (Scan) and the second scanning signal (X Scan) are complementary, and a period for the selection signal is set to 5.0 nanoseconds. In this case, a vertical period (non-display period P1) during which all of the first scan lines 42 are selected is 5.0 (nanoseconds)× 720×3=10.8 microseconds.

As described above, the configuration of the pixel circuit 41 according to the present exemplary embodiment can achieve the electro-optical device 10 capable of displaying a high-resolution, high-quality image at low power consumption and of promptly and securely writing or rewriting an image signal onto the memory circuit 60.

Modification Example 1

Next, a configuration of a pixel circuit according to Modification Example 1 representing a modification example relative to Example 1 and a method for driving the pixel circuit will be described herein.

Configuration of Pixel Circuit

Figure 12:
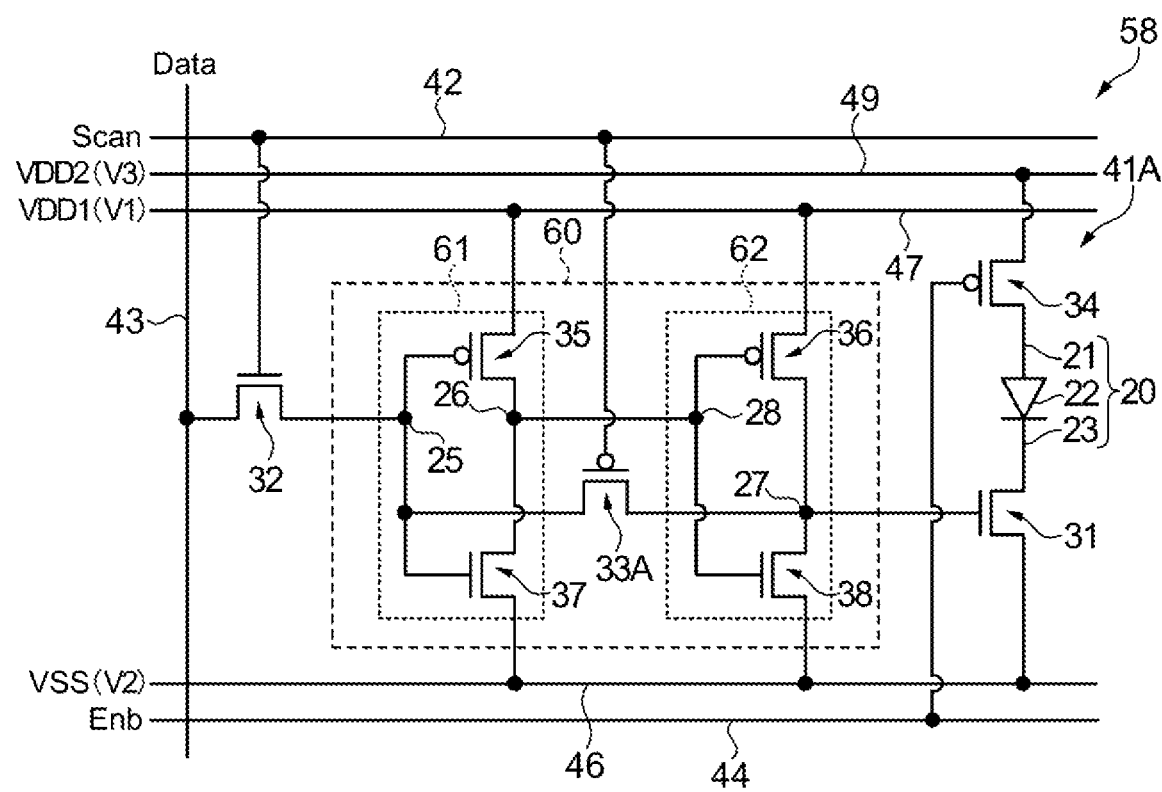
FIG. 12 is a diagram illustrating a configuration of a pixel circuit according to Modification Example 1.

FIG. 12 is a diagram illustrating a configuration of the pixel circuit according to Modification Example 1. Note that, in the following description of Modification Example 1, the differences from Example 1 will be described. The same components as those of Example 1 are designated by the same numerals in the drawings and their description will be omitted.

As illustrated in FIG. 12, a pixel circuit 41A according to Modification Example 1 differs from the pixel circuit 41 according to Example 1 in that the second scan line 45 is not provided and a gate of a P-type third transistor 33A included in the memory circuit 60 is electrically connected to the first scan line 42, with the other construction being the same.

The pixel circuit 41A according to Modification Example 1 includes the light emitting element 20, the P-type fourth transistor 34, the N-type first transistor 31, the memory circuit 60, and the N-type second transistor 32. The P-type third transistor 33A is disposed between the output terminal 27 of the second inverter 62 and the input terminal 25 of the first inverter 61 in the memory circuit 60.

In the pixel circuit 41A according to Modification Example 1, the conductive type of the second transistor 32 is the first conductive type, i.e., the N-type, whereas the conductive type of the third transistor 33A is the second conductive type, i.e., the P-type, different from the conductive type of the second transistor 32. The gate of the second transistor 32 and the gate of the third transistor 33A are electrically connected to the first scan line 42. Therefore, the second transistor 32 and the third transistor 33A operate to complement each other in response to the scanning signal supplied to the first scan line 42. That is, when the second transistor 32 is in the ON-state, the third transistor 33A is in the OFF-state, whereas, when the second transistor 32 is in the OFF-state, the third transistor 33A is in the ON-state.

Method for Driving Pixel Circuit

Figure 13:
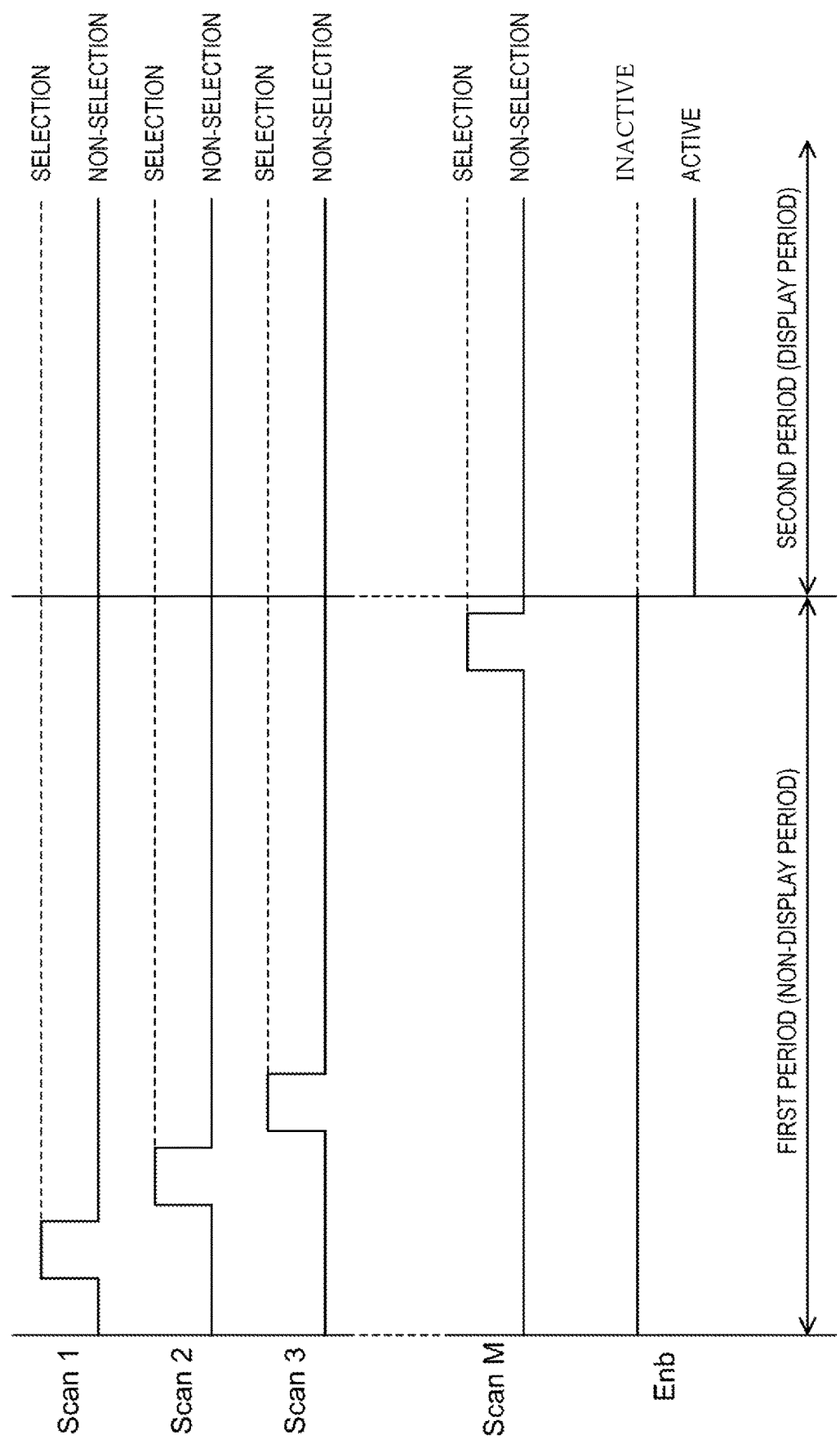
FIG. 13 is a diagram illustrating a method for driving the pixel circuit according to Modification Example 1.

FIG. 13 is a diagram illustrating the method for driving the pixel circuit according to Modification Example 1. As illustrated in FIG. 13, when the selection signal (High) is supplied as the scanning signal to any of the first scan lines 42 in the subfields (SFs) during the first period, the second transistor 32 (see FIG. 12) switches from the OFF-state to the ON-state and the third transistor 33A (see FIG. 12) switches from the ON-state to the OFF-state in the selected pixel circuit 41A. In this way, an image signal is written from the data line 43 (see FIG. 12) onto the memory circuit 60 in the selected pixel circuit 41.

Therefore, even in Modification Example 1, when the second transistor 32 switches to the ON-state and an image signal is written onto the memory circuit 60, the third transistor 33A disposed between the output terminal 27 of the second inverter 62 and the input terminal 25 of the first inverter 61 switches to the OFF-state, allowing the image signal to be written or rewritten promptly and securely onto the memory circuit 60.

After the image signal is written onto the memory circuit 60, when the non-selection signal (Low) is supplied to the first scan line 42, the second transistor 32 switches from the ON-state to the OFF-state and the third transistor 33A switches from the OFF-state to the ON-state in the pixel circuit 41A switched from selection to non-selection. In this way, even in Modification Example 1, the written image signal can be stably retained in the memory circuit 60.

Hereinafter, other examples and modification examples to the configuration of the pixel circuit according to the present exemplary embodiment will be described. In the following description of the examples and the modification examples, the differences from the examples or the modification examples described above will be described. The same components as those of the examples or the modification examples described above are designated by the same numerals in the drawings and their description will be omitted.

Example 2

Figure 14:
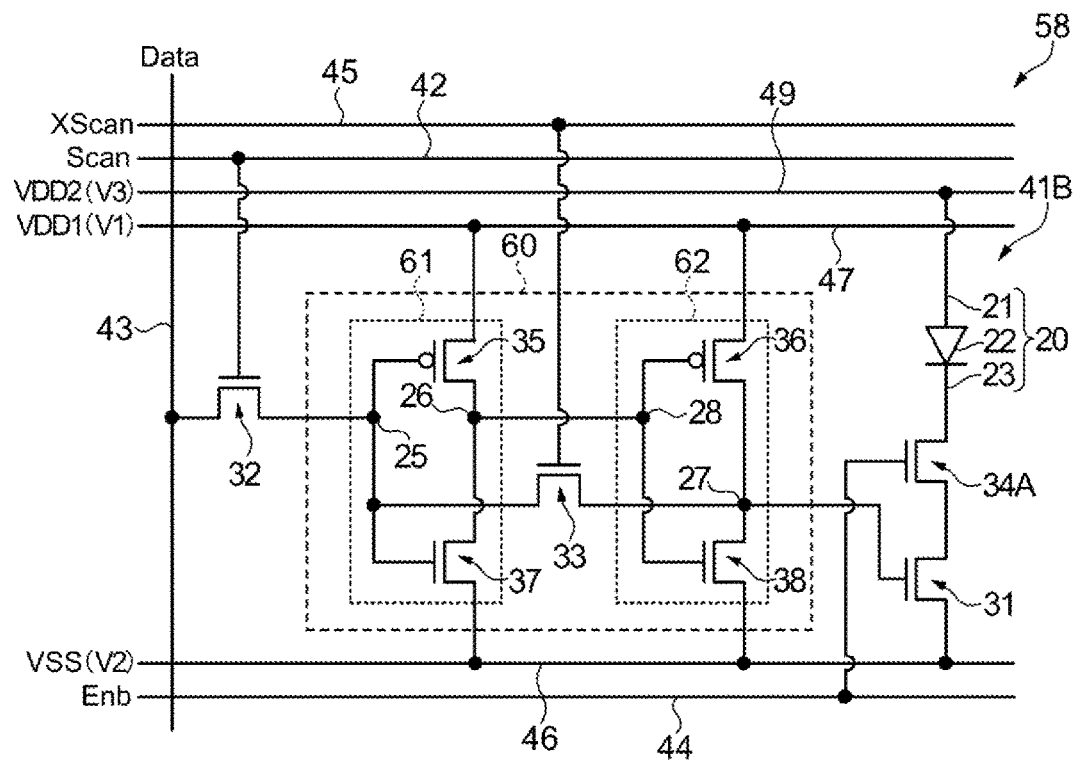
FIG. 14 is a diagram illustrating a configuration of a pixel circuit according to Example 2.

A configuration of a pixel circuit according to Example 2 will be described with reference to FIG. 14. FIG. 14 is a diagram illustrating the configuration of the pixel circuit according to Example 2. As illustrated in FIG. 14, a pixel circuit 41B according to Example 2 differs from the pixel circuit 41 according to Example 1 in that the control transistor is an N-type fourth transistor 34A, with the other construction being the same.

The pixel circuit 41B according to Example 2 includes the light emitting element 20, the N-type fourth transistor 34A, the N-type first transistor 31, the memory circuit 60, and the N-type second transistor 32. The N-type third transistor 33 is disposed between the output terminal 27 of the second inverter 62 and the input terminal 25 of the first inverter 61 in the memory circuit 60.

The fourth transistor 34A is disposed between the light emitting element 20 and the first transistor 31. That is, the anode 21 of the light emitting element 20 is electrically connected to the third potential line (high potential line 49) and the cathode 23 of the light emitting element 20 is electrically connected to a drain of the fourth transistor 34A. A source of the fourth transistor 34A is electrically connected to the drain of the first transistor 31.

In Example 2, the fourth transistor 34A is the N-type. The active signal representing the control signal being in the active state is High, i.e., high potential, and the inactive signal representing the control signal being in the inactive state is Low, i.e., low potential. The active signal is set to the third potential (V3) or higher, and may preferably be set to the third potential (V3). The inactive signal is set to the second potential (V2) or lower, and may preferably be set to the second potential (V2).

Modification Example 2

Figure 15:
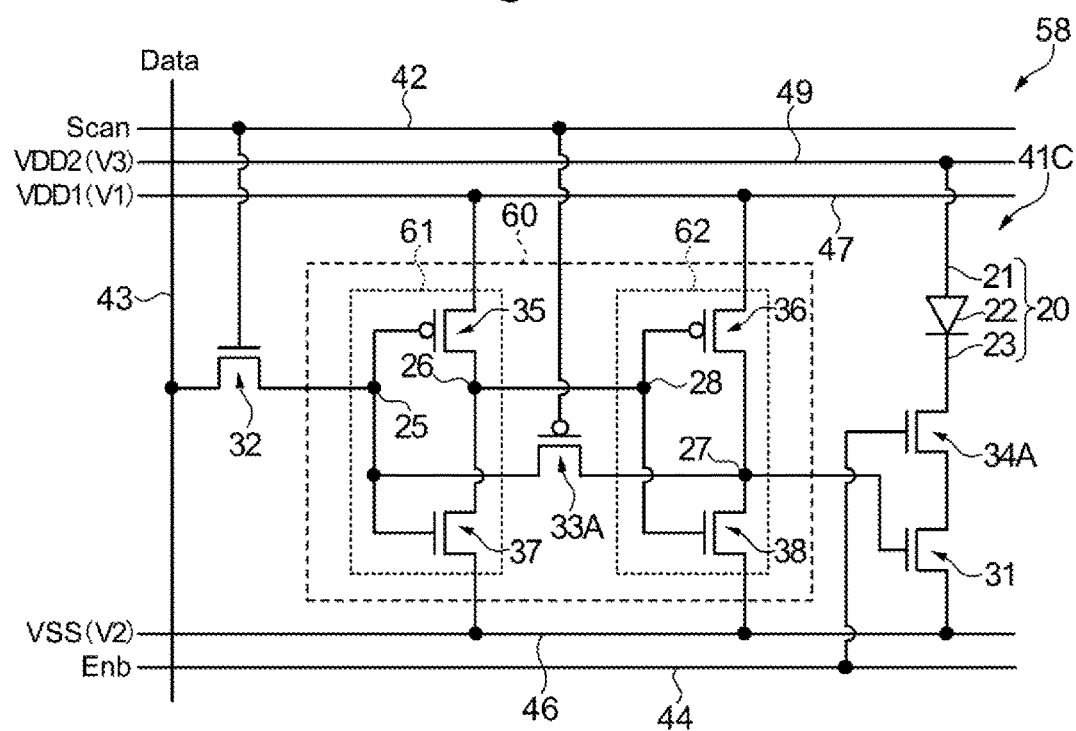
FIG. 15 is a diagram illustrating a configuration of a pixel circuit according to Modification Example 2.

A configuration of a pixel circuit according to Modification Example 2 representing a modification example to Example 2 will be described with reference to FIG. 15. FIG. 15 is a diagram illustrating the configuration of the pixel circuit according to Modification Example 2. As illustrated in FIG. 15, a pixel circuit 41C according to Modification Example 2 differs from the pixel circuit 41B according to Example 2 in that, similar to the pixel circuit 41A according to Modification Example 1, the second scan line 45 is not provided and the gate of the P-type third transistor 33A included in the memory circuit 60 is electrically connected to the first scan line 42, with the other construction being the same.

Example 3

Figure 16:
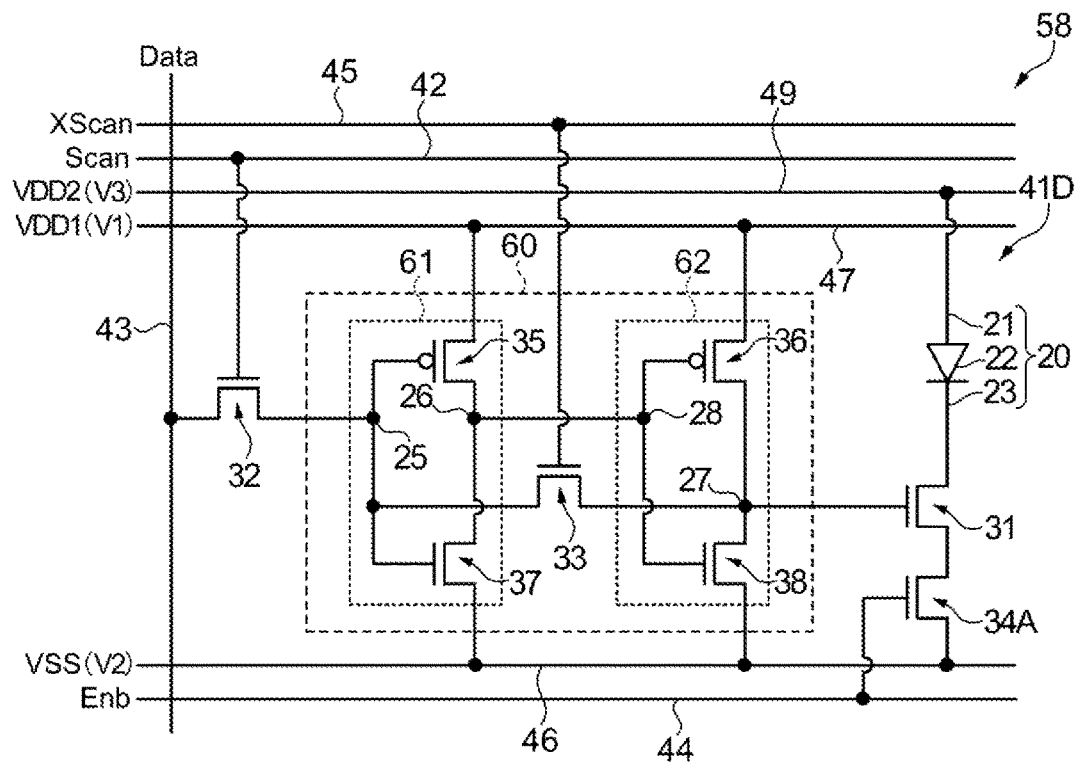
FIG. 16 is a diagram illustrating a configuration of a pixel circuit according to Example 3.

A configuration of a pixel circuit according to Example 3 will be described with reference to FIG. 16. FIG. 16 is a diagram illustrating the configuration of the pixel circuit according to Example 3. As illustrated in FIG. 16, a pixel circuit 41D according to Example 3 differs from the pixel circuit 41B according to Example 2 in that the first transistor 31 is disposed between the light emitting element 20 and the fourth transistor 34A, with the other construction being the same.

The pixel circuit 41D according to Example 3 includes the light emitting element 20, the N-type first transistor 31, the N-type fourth transistor 34A, the memory circuit 60, and the N-type second transistor 32. The N-type third transistor 33 is disposed between the output terminal 27 of the second inverter 62 and the input terminal 25 of the first inverter 61 in the memory circuit 60.

The anode 21 of the light emitting element 20 is electrically connected to the third potential line (high potential line 49) and the cathode 23 of the light emitting element 20 is electrically connected to the drain of the first transistor 31. The source of the first transistor 31 is electrically connected to the drain of the fourth transistor 34A. The source of the fourth transistor 34A is electrically connected to the second potential line (low potential line 46).

Modification Example 3

Figure 17:
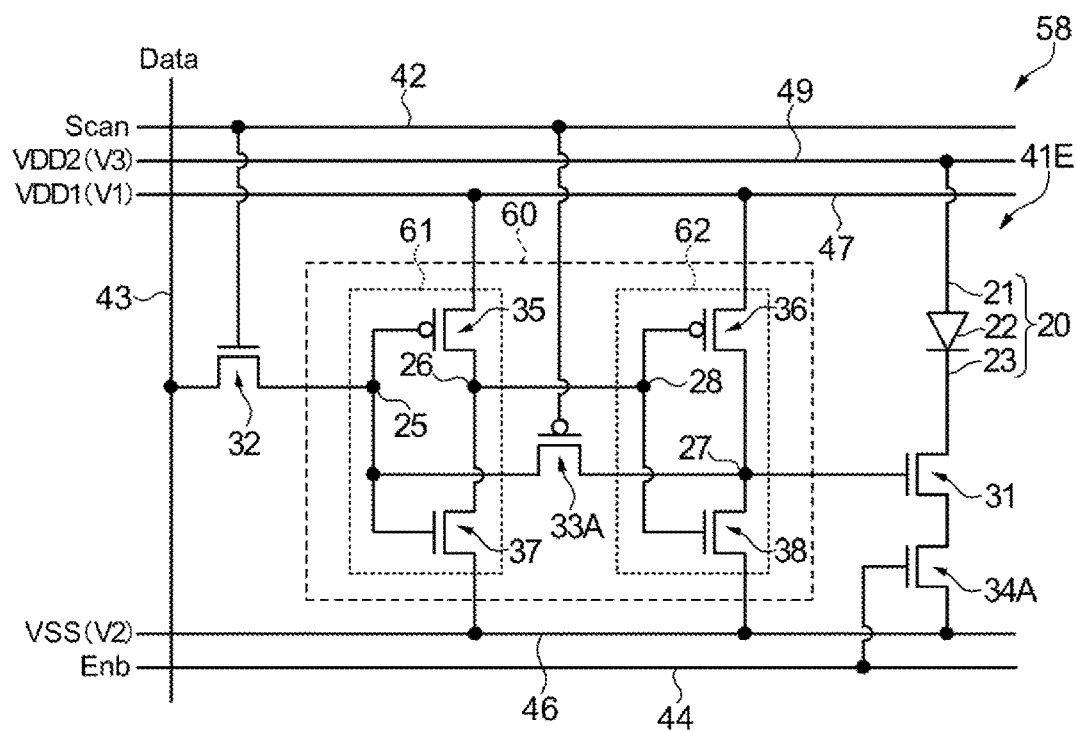
FIG. 17 is a diagram illustrating a configuration of a pixel circuit according to Modification Example 3.

A configuration of a pixel circuit according to Modification Example 3 representing a modification example relative to Example 3 will be described with reference to FIG. 17. FIG. 17 is a diagram illustrating the configuration of the pixel circuit according to Modification Example 3. As illustrated in FIG. 17, a pixel circuit 41E according to Modification Example 3 differs from the pixel circuit 41D according to Example 3 in that, similar to the modification examples described above, the second scan line 45 is not provided and the gate of the P-type third transistor 33A included in the memory circuit 60 is electrically connected to the first scan line 42, with the other construction being the same.

Example 4

Figure 18:
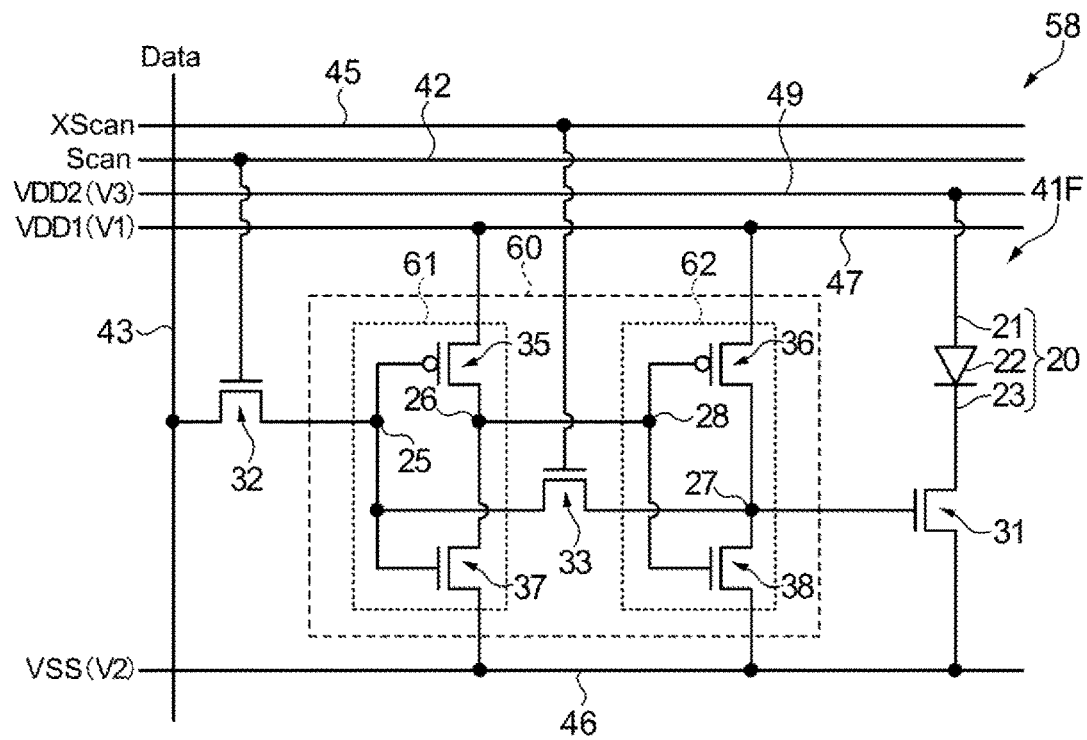
FIG. 18 is a diagram illustrating a configuration of a pixel circuit according to Example 4.

A configuration of a pixel circuit according to Example 4 will be described with reference to FIG. 18. FIG. 18 is a diagram illustrating the configuration of the pixel circuit according to Example 4. As illustrated in FIG. 18, a pixel circuit 41F according to Example 4 differs from the Examples described above in that the enable line 44 and the fourth transistor 34 or 34A are not included, with the other construction being the same.

The pixel circuit 41F according to Example 4 includes the light emitting element 20, the N-type first transistor 31, the memory circuit 60, and the N-type second transistor 32. The N-type third transistor 33 is disposed between the output terminal 27 of the second inverter 62 and the input terminal 25 of the first inverter 61 in the memory circuit 60. The anode 21 of the light emitting element 20 is electrically connected to the third potential line (high potential line 49) and the cathode 23 of the light emitting element 20 is electrically connected to the drain of the first transistor 31. The source of the first transistor 31 is electrically connected to the second potential line (low potential line 46).

In the pixel circuit 41F according to Example 4, the fourth transistor 34 or 34A is not included and the light emitting element 20 and the first transistor 31 are disposed in series between the third potential line (high potential line 49) and the second potential line (low potential line 46). Therefore, when the first transistor 31 is brought into the ON-state, the light emitting element 20 emits light.

Modification Example 4

Figure 19:
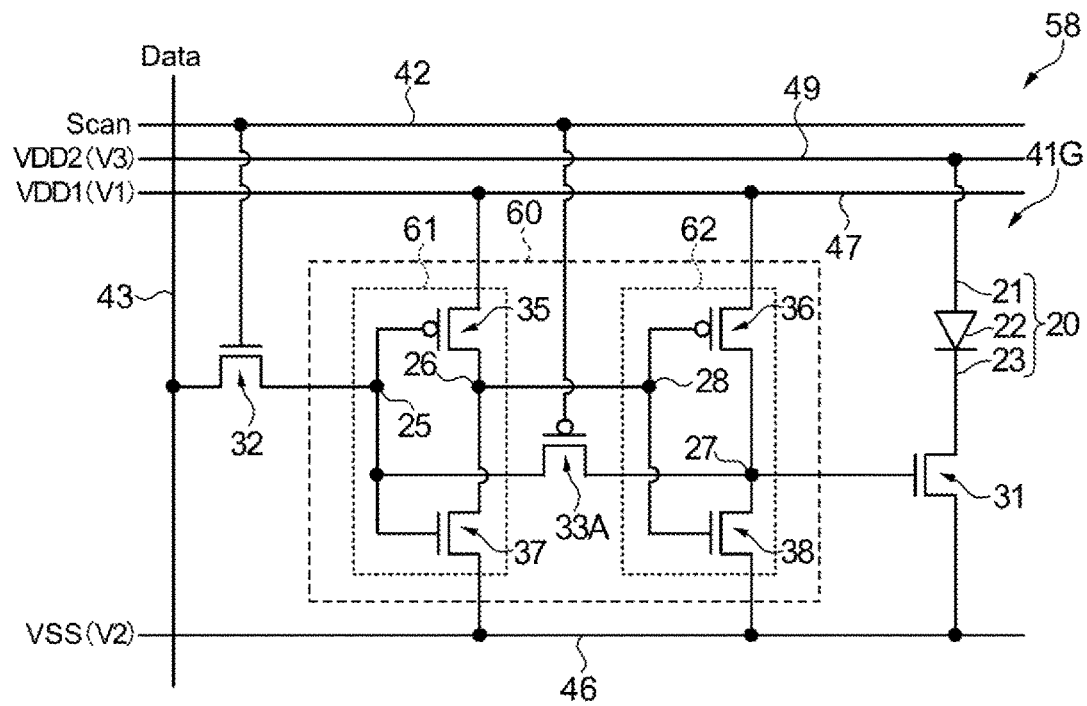
FIG. 19 is a diagram illustrating a configuration of a pixel circuit according to Modification Example 4.

A configuration of a pixel circuit according to Modification Example 4 representing a modification example relative to Example 4 will be described with reference to FIG. 19. FIG. 19 is a diagram illustrating the configuration of the pixel circuit according to Modification Example 4. As illustrated in FIG. 19, a pixel circuit 41G according to Modification Example 4 differs from the pixel circuit 41F according to Example 4 in that, similar to the modification examples described above, the second scan line 45 is not provided and the gate of the P-type third transistor 33A included in the memory circuit 60 is electrically connected to the first scan line 42, with the other construction being the same.

Example 5

Figure 20:
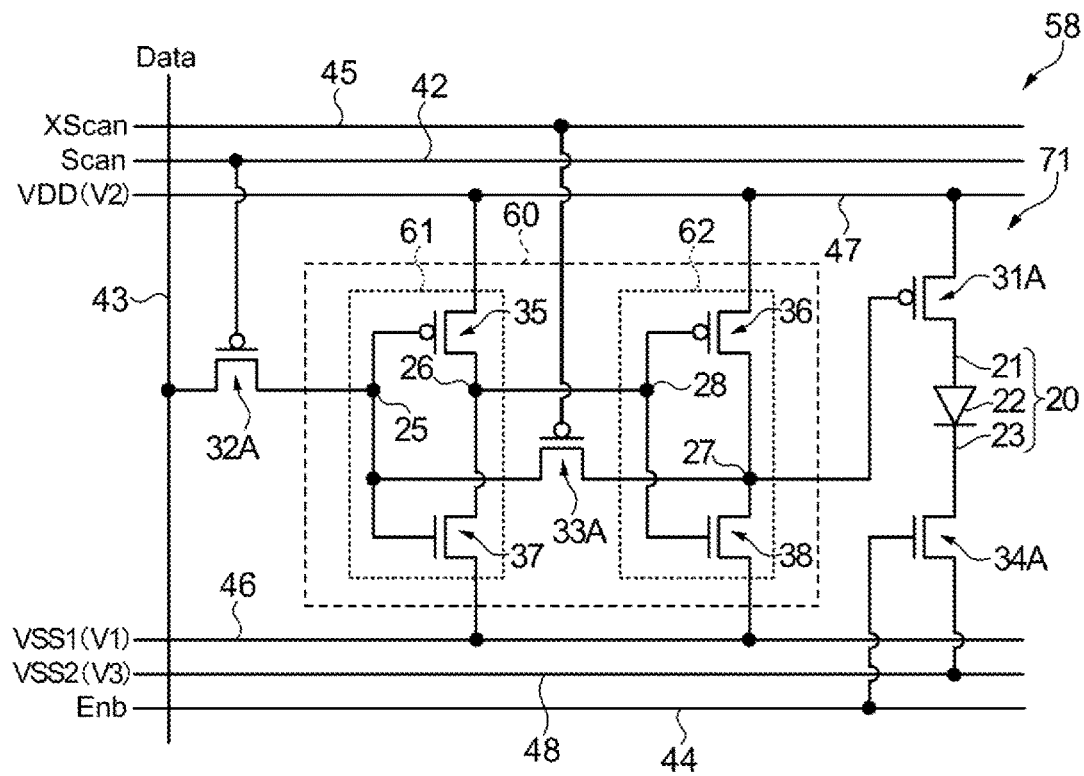
FIG. 20 is a diagram illustrating a configuration of a pixel circuit according to Example 5.

A configuration of a pixel circuit according to Example 5 will be described with reference to FIG. 20. FIG. 20 is a diagram illustrating the configuration of the pixel circuit according to Example 5. As illustrated in FIG. 20, a pixel circuit 71 according to Example 5 differs from the pixel circuit 41 according to Example 1 in that the first transistor 31A, the second transistor 32A, and the third transistor 33A are the P-type and the fourth transistor 34A is the N-type.

Note that, in Example 5, different from the examples described above, the high potential and the low potential are reversed from each other. Specifically, the first potential (V1) is a first low potential VSS1 (for example, V1=VSS1=4.0 V), the second potential (V2) is a high potential VDD (for example, V2=VDD=7.0 V), and the third potential (V3) is a second low potential VSS2 (for example, V3=VSS2=0 V). Therefore, the first potential is lower than the second potential, whereas the third potential is lower than the first potential.

In Example 5, the first potential (first low potential VSS1) and the second potential (high potential VDD) constitute the low-voltage power-supply, whereas the third potential (second low potential VSS2) and the second potential (high potential VDD) constitute the high-voltage power-supply. The second potential serves as a reference potential in the low-voltage power-supply and the high-voltage power-supply. To each of the pixel circuits 71, the first potential (V1=VSS1) is supplied from the low potential line 46 serving as the first potential line, the second potential (V2=VDD) is supplied from the high potential line 47 serving as the second potential line, and the third potential (V3=VSS2) is supplied from the low potential line 48 serving as the third potential line.

The pixel circuit 71 according to Example 5 includes the P-type first transistor 31A, the light emitting element 20, the N-type fourth transistor 34A, the memory circuit 60, and the P-type second transistor 32A. The P-type third transistor 33A is disposed between the output terminal 27 of the second inverter 62 and the input terminal 25 of the first inverter 61 in the memory circuit 60.

The first transistor 31A, the light emitting element 20, and the fourth transistor 34A are disposed in series between the second potential line (high potential line 47) and the third potential line (low potential line 48). The source of the first transistor 31A is electrically connected to the second potential line (high potential line 47) and the drain of the first transistor 31A is electrically connected to the anode 21 of the light emitting element 20. The source of the fourth transistor 34A is electrically connected to the third potential line (low potential line 48) and the drain of the fourth transistor 34A is electrically connected to the cathode 23 of the light emitting element 20.

In the pixel circuit 71 according to Example 5, the two inverters 61 and 62 constituting the memory circuit 60 are disposed between the first potential line (low potential line 46) and the second potential line (high potential line 47), and the first potential (V1) and the second potential (V2) are supplied to the two inverters 61 and 62. Therefore, Low corresponds to the first potential (V1), whereas High corresponds to the second potential (V2).

The first transistor 31A serving as a driving transistor is the P-type. The threshold voltage ($V_{th1}$) of the first transistor 31A is thus negative ($V_{th1}<0$). When an image signal stored in the memory circuit 60 corresponds to non-emission, the potential of the output terminal 27 in the memory circuit 60 is High (second potential). When the gate potential of the first transistor 31A reaches the second potential (V2), the gate-source voltage $V_{gs1}$ of the first transistor 31A becomes 0 V, since the source of the first transistor 31A is connected to the second potential line (high potential line 47) and the source potential is the second potential (V2).

Therefore, when the gate-source voltage $V_{gs1}$ is 0 V with respect to the threshold voltage $V_{th1}$ (as one example, $V_{th1}=-0.36$ V) of the first transistor 31A, the gate-source voltage $V_{gs1}$ becomes greater than the threshold voltage $V_{th1}$ and the first transistor 31A switches to the OFF-state. In this way, the first transistor 31A can be reliably placed in the OFF-state when the image signal represents non-emission.

When an image signal stored in the memory circuit 60 corresponds to emission, the potential of the output terminal 27 of the memory circuit 60 is Low, i.e., the first potential. When the gate potential of the first transistor 31A reaches the first potential (V1), the gate-source voltage $V_{gs1}$ of the first transistor 31A becomes equal to the potential difference between the first potential (V1) and the second potential (V2) ($V_{gs1}=V1-V2=4.0$ V$-7.0$ V$=-3.0$ V), since the source potential of the first transistor 31A is the second potential. Therefore, the gate-source voltage $V_{gs1}$ of the first transistor 31A becomes smaller than the threshold voltage $V_{th1}$ and the first transistor 31A switches to the ON-state. In this way, the first transistor 31A can be reliably placed into the ON-state when the image signal represents emission.

The fourth transistor 34A serving as a control transistor is the N-type. The active signal representing the control signal being in the active state has a high potential and the inactive signal representing the control signal being in the inactive state has a low potential. Specifically, the inactive signal is set to a low potential equal to or below the third potential (V3), and may preferably be set to the third potential (V3). The active signal is set to a high potential equal to or above V3+(V2−V1), and may preferably be set to the second potential (V2).

The second transistor 32A is the P-type. The non-selection signal is set to a high potential equal to or above the second potential (V2), and may preferably be set to the second potential (V2). The selection signal is set to a low potential equal to or below the first potential (V1), and may preferably be set to the third potential (V3). Similarly, the third transistor 33A is the P-type. The non-retention signal is set to a high potential equal to or above the second potential (V2), and may preferably be set to the second potential (V2). The retention signal is set to a low potential equal to or below the first potential (V1), and may preferably be set to the third potential (V3).

Modification Example 5

Figure 21:
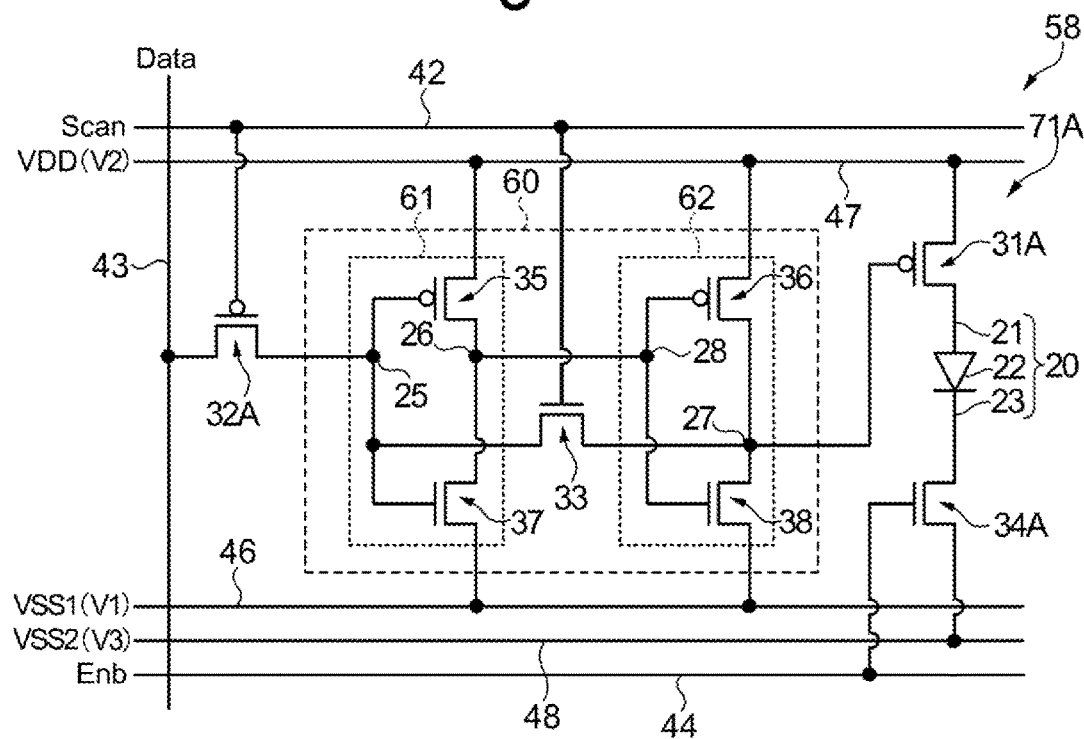
FIG. 21 is a diagram illustrating a configuration of a pixel circuit according to Modification Example 5.

A configuration of a pixel circuit according to Modification Example 5 representing a modification example relative to Example 5 will be described with reference to FIG. 21. FIG. 21 is a diagram illustrating the configuration of the pixel circuit according to Modification Example 5. As illustrated in FIG. 21, a pixel circuit 71A according to Modification Example 5 differs from the pixel circuit 71 according to Example 5 in that the second scan line 45 is not provided and the gate of the N-type third transistor 33 included in the memory circuit 60 is electrically connected to the first scan line 42, with the other construction being the same.

In the pixel circuit 71A according to Modification Example 5, the second transistor 32A is the first conductive type, i.e., the P-type, and the third transistor 33 is the second conductive type, i.e., the N-type. Therefore, the second transistor 32A and the third transistor 33 operate to complement each other in response to the scanning signal supplied to the first scan line 42. Note that, in Modification Example 5, the P-type is designated as the first conductive type and the N-type is designated as the second conductive type.

Example 6

Figure 22:
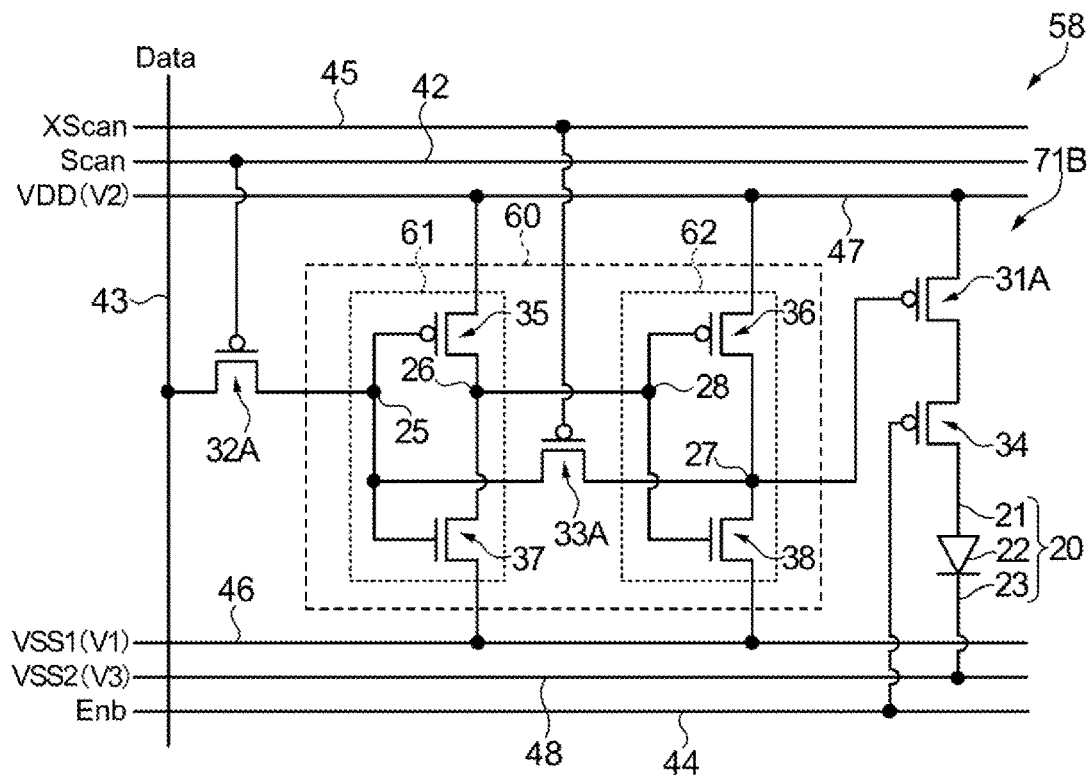
FIG. 22 is a diagram illustrating a configuration of a pixel circuit according to Example 6.

A configuration of a pixel circuit according to Example 6 will be described with reference to FIG. 22. FIG. 22 is a diagram illustrating the configuration of the pixel circuit according to Example 6. As illustrated in FIG. 22, the pixel circuit 71B according to Example 6 differs from the pixel circuit 71 according to Example 5 in that the control transistor is the P-type fourth transistor 34, with the other construction being the same.

The pixel circuit 71B according to Example 6 includes the P-type first transistor 31A, the P-type fourth transistor 34, the light emitting element 20, the memory circuit 60, and the P-type second transistor 32A. The P-type third transistor 33A is disposed between the output terminal 27 of the second inverter 62 and the input terminal 25 of the first inverter 61 in the memory circuit 60.

The fourth transistor 34 is disposed between the first transistor 31A and the light emitting element 20. That is, the source of the first transistor 31A is electrically connected to the second potential line (high potential line 47) and the drain of the first transistor 31A is electrically connected to the source of the fourth transistor 34. The drain of the fourth transistor 34 is electrically connected to the anode 21 of the light emitting element 20, and the cathode 23 of the light emitting element 20 is electrically connected to the third potential line (low potential line 48).

Modification Example 6

Figure 23:
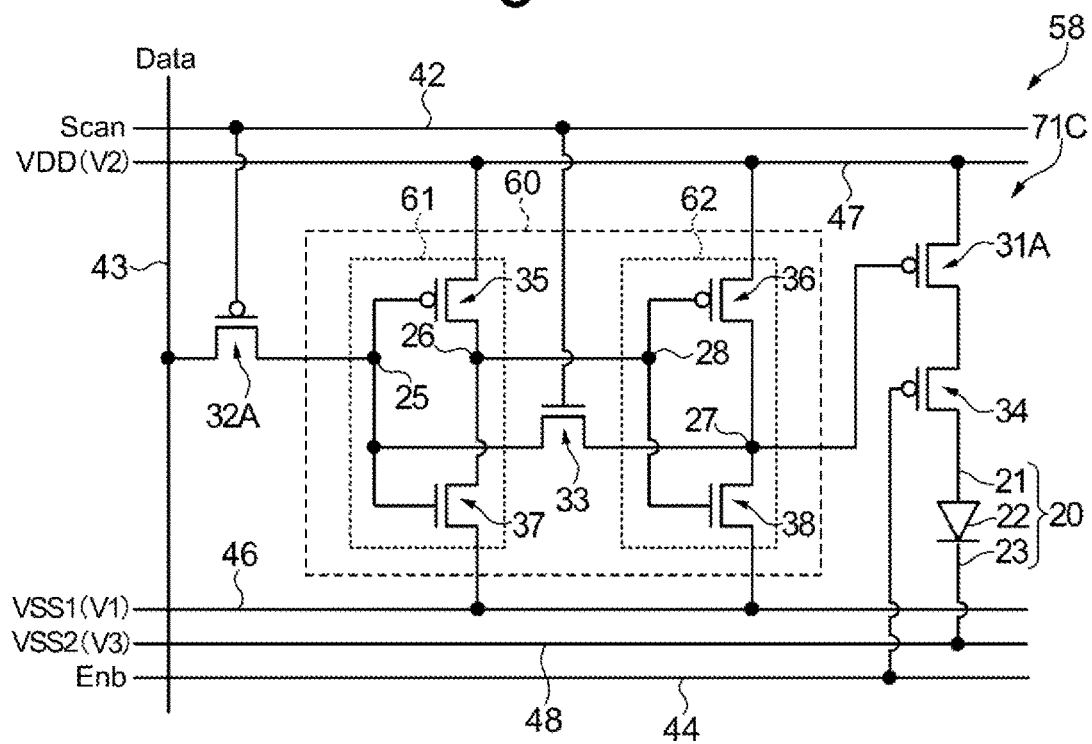
FIG. 23 is a diagram illustrating a configuration of a pixel circuit according to Modification Example 6.

A configuration of a pixel circuit according to Modification Example 6 representing a modification example relative to Example 6 will be described with reference to FIG. 23. FIG. 23 is a diagram illustrating the configuration of the pixel circuit according to Modification Example 6. As illustrated in FIG. 23, a pixel circuit 71C according to Modification Example 6 differs from the pixel circuit 71B according to Example 6 in that, similar to the pixel circuit 71A according to Modification Example 5, the second scan line 45 is not provided and the gate of the N-type third transistor 33 included in the memory circuit 60 is electrically connected to the first scan line 42, with the other construction being the same.

Example 7

Figure 24:
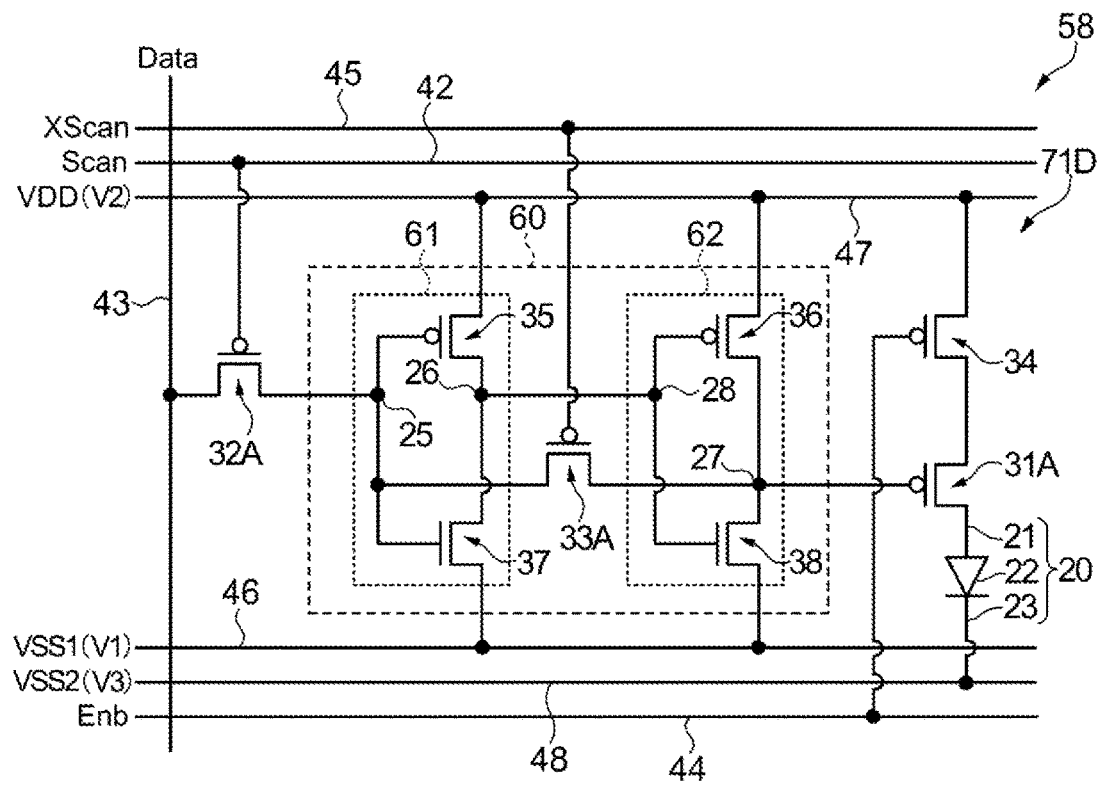
FIG. 24 is a diagram illustrating a configuration of a pixel circuit according to Example 7.

A configuration of a pixel circuit according to Example 7 will be described with reference to FIG. 24. FIG. 24 is a diagram illustrating the configuration of the pixel circuit according to Example 7. As illustrated in FIG. 24, a pixel circuit 71D according to Example 7 differs from the pixel circuit 71B according to Example 6 in that the first transistor 31A is disposed between the fourth transistor 34 and the light emitting element 20, with the other construction being the same.

The pixel circuit 71D according to Example 7 includes the P-type fourth transistor 34, the P-type first transistor 31A, the light emitting element 20, the memory circuit 60, and the P-type second transistor 32A. The P-type third transistor 33A is disposed between the output terminal 27 of the second inverter 62 and the input terminal 25 of the first inverter 61 in the memory circuit 60.

The source of the fourth transistor 34 is electrically connected to the second potential line (high potential line 47) and the drain of the fourth transistor 34 is electrically connected to the source of the first transistor 31A. The drain of the first transistor 31A is electrically connected to the anode 21 of the light emitting element 20 and the cathode 23 of the light emitting element 20 is electrically connected to the third potential line (low potential line 48).

Modification Example 7

Figure 25:
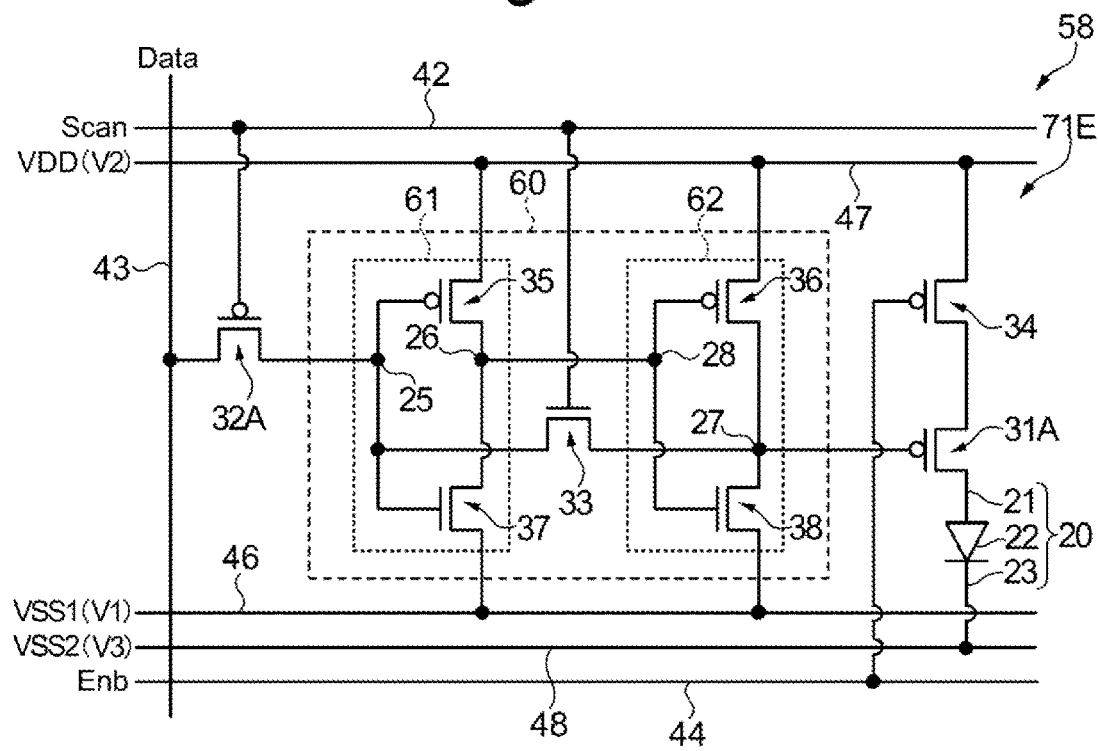
FIG. 25 is a diagram illustrating a configuration of a pixel circuit according to Modification Example 7.

A configuration of a pixel circuit according to Modification Example 7 representing a modification example relative to Example 7 will be described with reference to FIG. 25. FIG. 25 is a diagram illustrating the configuration of the pixel circuit according to Modification Example 7. As illustrated in FIG. 25, a pixel circuit 71E according to Modification Example 7 differs from the pixel circuit 71D according to Example 7 in that, similar to the modification examples described above, the second scan line 45 is not provided and the gate of the N-type third transistor 33 included in the memory circuit 60 is electrically connected to the first scan line 42, with the other construction being the same.

Example 8

Figure 26:
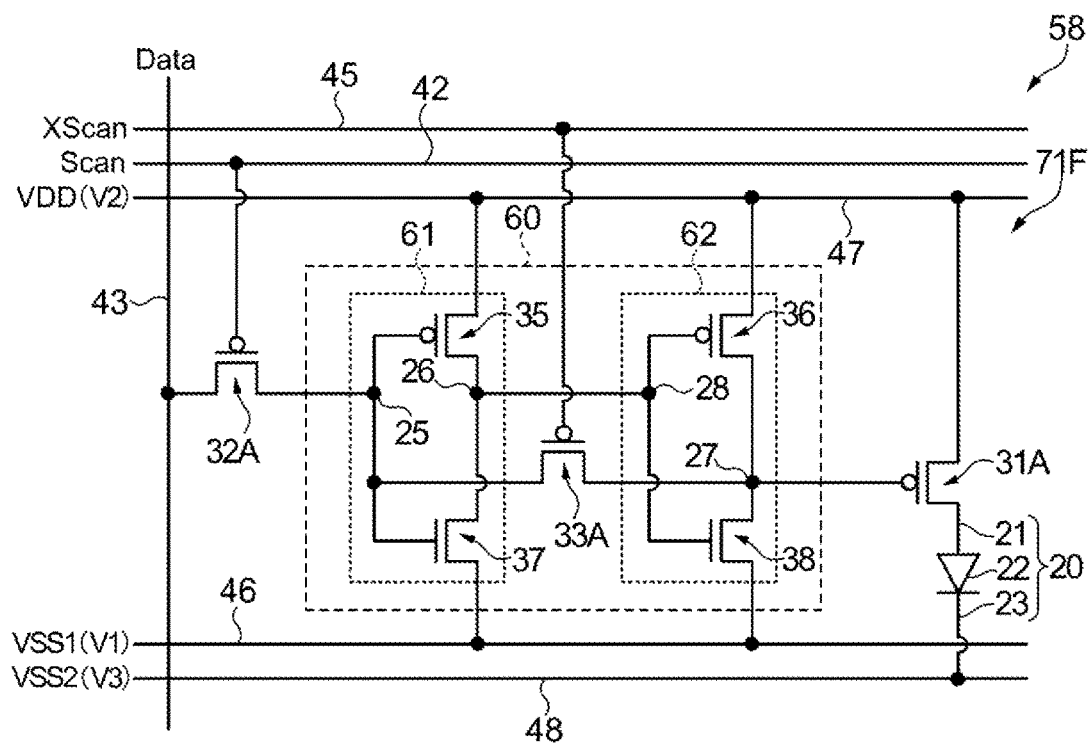
FIG. 26 is a diagram illustrating a configuration of a pixel circuit according to Example 8.

A configuration of a pixel circuit according to Example 8 will be described with reference to FIG. 26. FIG. 26 is a diagram illustrating the configuration of the pixel circuit according to Example 8. As illustrated in FIG. 26, a pixel circuit 71F according to Example 8 differs from the examples described above in that the enable line 44 and the fourth transistor 34 or 34A are not included, with the other construction being the same.

The pixel circuit 71F according to Example 8 includes the P-type first transistor 31A, the light emitting element 20, the memory circuit 60, and the P-type second transistor 32A. The P-type third transistor 33A is disposed between the output terminal 27 of the second inverter 62 and the input terminal 25 of the first inverter 61 in the memory circuit 60. The source of the first transistor 31A is electrically connected to the second potential line (high potential line 47) and the drain of the first transistor 31A is electrically connected to the anode 21 of the light emitting element 20. The cathode 23 of the light emitting element 20 is electrically connected to the third potential line (low potential line 48).

In the pixel circuit 71F according to Example 8, the fourth transistor 34 or 34A is not included and the first transistor 31A and the light emitting element 20 are disposed in series between the second potential line (high potential line 47) and the third potential line (low potential line 48). Therefore, when the first transistor 31A is brought into the ON-state, the light emitting element 20 emits light.

Modification Example 8

Figure 27:
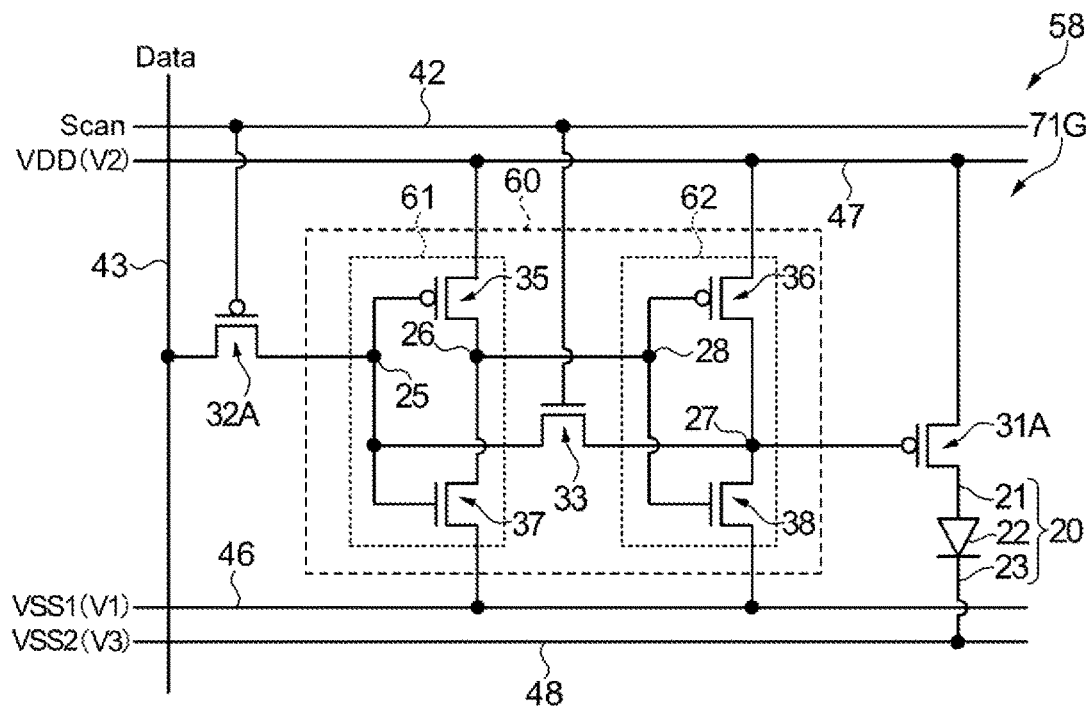
FIG. 27 is a diagram illustrating a configuration of a pixel circuit according to Modification Example 8.

A configuration of a pixel circuit according to Modification Example 8 representing a modification example relative to Example 8 will be described with reference to FIG. 27. FIG. 27 is a diagram illustrating the configuration of the pixel circuit according to Modification Example 8. As illustrated in FIG. 27, a pixel circuit 71G according to Modification Example 8 differs from the pixel circuit 71F according to Example 8 in that, similar to the modification examples described above, the second scan line 45 is not provided and the gate of the N-type third transistor 33 included in the memory circuit 60 is electrically connected to the first scan line 42, with the other construction being the same.

The above-described exemplary embodiments (Examples and Modification Examples) merely illustrate one aspect of the present invention, and any variation and application may be possible within the scope of the invention. For example, the followings are modified examples other than those described above.

Modification Example 9

While the gate of the first transistor 31 is electrically connected to the output terminal 27 of the second inverter 62 in each of the pixel circuits according to the exemplary embodiments (Examples and Modification Examples) described above, the present invention is not limited to such construction. The gate of the first transistor 31 may be electrically connected to the input terminal 28 of the second inverter 62, i.e., the output terminal 26 of the first inverter 61 and the input terminal 28 of the second inverter 62.

Modification Example 10

While the memory circuit 60 includes the two inverters 61 and 62 in the pixel circuits of the above-described exemplary embodiments (Examples and Modification Examples), the present invention is not limited to such construction. The memory circuit 60 may include an even number of two or more inverters.

Modification Example 11

While the electro-optical device has been described by taking, as an example, the organic EL device in which the light emitting elements 20 formed of organic EL elements are aligned in 720 rows×3840 (1280×3) columns on the element substrate 11 formed of a single crystal semiconductor substrate (single-crystal silicon wafer) in the above-described exemplary embodiments (Examples and Modification Examples), the electro-optical device in the present invention is not limited to such construction. For example, the electro-optical device may include a thin film transistor (TFT) as each transistor formed on the element substrate 11 formed of a glass substrate, or the electro-optical device may include a TFT on a flexible substrate formed of polyimide and the like. Further, the electro-optical device may be a micro LED display in which fine LED elements are aligned as light emitting elements in high density or a quantum dots display in which a nanosized semiconductor crystal material is used for the light emitting element. Furthermore, a quantum dot that converts incident light into light having a different wavelength may be used as a color filter.

Modification Example 12

While the electronic apparatus has been described in the above-described exemplary embodiments by taking, as an example, the see-through head-mounted display 100 incorporating the electro-optical device 10, the electro-optical device 10 of the present invention is also applicable to other electronic apparatuses including a closed-type head-mounted display. Other types of electronic apparatus include, for example, projectors, rear-projection televisions, direct-viewing televisions, cell phones, portable audio devices, personal computers, video camera monitors, automotive navigation devices, head-up displays, pagers, electronic organizers, calculators, wearable devices such as wristwatches, handheld displays, word processors, workstations, video phones, POS terminals, digital still cameras, signage displays, and the like.

The entire disclosure of Japanese Patent Application No. 2017-248841, filed Dec. 26, 2017 is expressly incorporated by reference herein.

What is claimed is:
1. An electro-optical device comprising:
    a first scan line;
    a data line;
    a pixel circuit located at a position corresponding to an intersection of the first scan line and the data line, wherein
    the pixel circuit includes
        a light emitting element,
        a first transistor,
        a second transistor,
        a memory circuit that includes a first inverter, a second inverter and a third transistor,
    the first transistor is electrically connected in series to the light emitting element, and a gate of the first transistor is electrically connected to the memory circuit,
    the second transistor is disposed between the data line and an input of the first inverter;
    an output of the first inverter and an input of the second inverter are electrically connected;

the third transistor is disposed between an output of the second inverter and the input of the first inverter, and when the second transistor turns from an OFF-state to an ON-state, the third transistor is in an OFF-state or turns from an ON-state to the OFF-state.

2. The electro-optical device according to claim 1, wherein a gate width of the third transistor is shorter than a gate width of the first transistor.

3. The electro-optical device according to claim 1, wherein a gate length of the third transistor is shorter than a gate length of the first transistor.

4. The electro-optical device according to claim 1, further comprising a first potential line, a second potential line and a third potential line, wherein the memory circuit is electrically connected to the first potential line and the second potential line, the light emitting element is electrically connected to the second potential line.

5. The electro-optical device according to claim 4, wherein the first potential line supply a first potential, the second potential line supply a second potential, the third potential line supply a third potential, a gate of the second transistor is electrically connected to the first scan line, and a potential to be supplied to the first scan line is the second potential or the third potential.

6. The electro-optical device according to claim 5, further comprising a second scan line, wherein a gate of the second transistor is electrically connected to the first scan line, a gate of the third transistor is electrically connected to the second scan line, and a potential to be supplied to the second scan line is the second potential or the third potential.

7. The electro-optical device according to claim 1, wherein the second transistor and the third transistor operate to complement each other.

8. The electro-optical device according to claim 1, wherein the second transistor is a first conductive type, the third transistor is a second conductive type different from the first conductive type, and a gate of the second transistor and a gate of the third transistor are electrically connected to the first scan line.

9. The electro-optical device according to claim 1, further comprising a second scan line, wherein a gate of the second transistor is electrically connected to the first scan line, and a gate of the third transistor is electrically connected to the second scan line.

10. The electro-optical device according to claim 1, wherein the gate of the first transistor is electrically connected to the input of the second inverter or the output of the second inverter.

11. An electronic apparatus comprising the electro-optical device according to claim 1.

* * * * *